(12) United States Patent
Luch

(10) Patent No.: US 7,868,249 B2
(45) Date of Patent: *Jan. 11, 2011

(54) SUBSTRATE AND COLLECTOR GRID STRUCTURES FOR INTEGRATED SERIES CONNECTED PHOTOVOLTAIC ARRAYS AND PROCESS OF MANUFACTURE OF SUCH ARRAYS

(76) Inventor: Daniel Luch, 17161 Cooper Hill Dr., Morgan Hill, CA (US) 95037

( * ) Notice: Subject to any disclaimer, the term of this patent is extended or adjusted under 35 U.S.C. 154(b) by 0 days.

This patent is subject to a terminal disclaimer.

(21) Appl. No.: 12/322,664

(22) Filed: Feb. 4, 2009

(65) Prior Publication Data

US 2009/0145551 A1    Jun. 11, 2009

Related U.S. Application Data

(63) Continuation of application No. 10/682,093, filed on Oct. 8, 2003, now Pat. No. 7,507,903, which is a continuation-in-part of application No. 10/186,546, filed on Jul. 1, 2002, now abandoned, which is a continuation-in-part of application No. 09/528,086, filed on Mar. 17, 2000, now Pat. No. 6,414,235, which is a continuation-in-part of application No. 09/281,656, filed on Mar. 30, 1999, now Pat. No. 6,239,352.

(51) Int. Cl.
*H01L 31/00* (2006.01)

(52) U.S. Cl. .................. 136/256; 136/251; 136/259

(58) Field of Classification Search .......... 136/243–251
See application file for complete search history.

(56) References Cited

U.S. PATENT DOCUMENTS

| | | | |
|---|---|---|---|
| 3,369,939 A | 2/1968 | Meyer | |
| 3,376,163 A | 4/1968 | Abrahamsohn | |
| 3,442,007 A | 5/1969 | Griffin et al. | |
| 3,480,473 A | 11/1969 | Tanos | |
| 3,483,038 A | 12/1969 | Hui et al. | |
| 3,523,875 A | 8/1970 | Minklei | |
| 3,553,030 A | 1/1971 | Lebrun | |
| 3,619,382 A | 11/1971 | Lupinski | |
| 3,682,786 A | 8/1972 | Brown et al. | |
| 3,764,280 A | 10/1973 | Lupinski | |
| 3,865,699 A | 2/1975 | Luch | |
| 3,888,697 A | 6/1975 | Bogus et al. | |
| 3,903,427 A | 9/1975 | Pack | |

(Continued)

FOREIGN PATENT DOCUMENTS

WO    WO98/20518    * 5/1998

*Primary Examiner*—Jeffrey T Barton

(57) ABSTRACT

This invention comprises deposition of thin film photovoltaic junctions on metal substrates which can be heat treated following deposition in a continuous fashion without deterioration of the metal support structure. In a separate operation an interconnection substrate structure is produced in a continuous roll-to-roll fashion. In this way the interconnection substrate structure can be uniquely formulated from polymer-based materials since it does not have to endure high temperature exposure. Cells comprising the metal foil supported photovoltaic junctions are then laminated to the interconnection substrate structure. Conductive interconnections are deposited to complete the array. The conductive interconnections can be accomplished with a separately prepared interconnection component. The interconnected array is produced using continuous roll-to-roll processing which avoids the need to use the expensive and intricate material removal operations currently taught in the art to achieve electrical interconnections among arrays of photovoltaic cells.

24 Claims, 48 Drawing Sheets

U.S. PATENT DOCUMENTS

| | | |
|---|---|---|
| 3,903,428 A | 9/1975 | DeJong |
| 3,978,333 A | 8/1976 | Crisman et al. |
| 3,982,964 A | 9/1976 | Lindmayer et al. |
| 3,996,067 A | 12/1976 | Broder |
| 4,009,093 A | 2/1977 | Luch |
| 4,017,332 A | 4/1977 | James |
| 4,027,652 A | 6/1977 | Collura |
| 4,038,042 A | 7/1977 | Adelman |
| 4,087,960 A | 5/1978 | Koichi |
| 4,101,385 A | 7/1978 | Luch |
| 4,127,424 A | 11/1978 | Ullery |
| 4,158,612 A | 6/1979 | Luch et al. |
| 4,175,249 A | 11/1979 | Gruber |
| 4,191,617 A | 3/1980 | Hurley et al. |
| 4,195,117 A | 3/1980 | Luch |
| 4,227,942 A | 10/1980 | Hall |
| 4,231,808 A | 11/1980 | Tabei et al. |
| 4,243,432 A | 1/1981 | Jordan et al. |
| 4,260,429 A | 4/1981 | Moyer |
| 4,278,473 A | 7/1981 | Borden |
| 4,278,510 A | 7/1981 | Chien et al. |
| 4,283,590 A * | 8/1981 | Bilger et al. ............ 136/251 |
| 4,283,591 A | 8/1981 | Boer |
| 4,291,191 A | 9/1981 | Dahlberg |
| 4,315,096 A | 2/1982 | Tyan et al. |
| 4,320,154 A | 3/1982 | Biter |
| 4,348,546 A | 9/1982 | Little |
| 4,361,717 A | 11/1982 | Gilmore et al. |
| 4,366,335 A | 12/1982 | Feng et al. |
| 4,380,112 A | 4/1983 | Little |
| 4,395,362 A | 7/1983 | Satoh et al. |
| 4,425,262 A | 1/1984 | Kawai et al. |
| 4,428,110 A | 1/1984 | Kim |
| 4,429,020 A | 1/1984 | Luch |
| 4,443,651 A | 4/1984 | Swartz |
| 4,457,578 A | 7/1984 | Taylor |
| 4,499,658 A | 2/1985 | Lewis |
| 4,507,181 A | 3/1985 | Nath et al. |
| 4,510,079 A | 4/1985 | Kawai et al. |
| 4,514,579 A | 4/1985 | Hanak |
| 4,514,580 A | 4/1985 | Bartlett |
| 4,517,403 A | 5/1985 | Morel et al. |
| 4,542,255 A | 9/1985 | Tanner et al. |
| 4,584,427 A | 4/1986 | Mackamul et al. |
| 4,585,490 A | 4/1986 | Raffel et al. |
| 4,586,988 A | 5/1986 | Nath et al. |
| 4,598,306 A | 7/1986 | Nath et al. |
| 4,603,092 A | 7/1986 | Luch |
| 4,603,470 A | 8/1986 | Yamazaki |
| 4,617,421 A | 10/1986 | Nath et al. |
| 4,624,045 A | 11/1986 | Ishihara et al. |
| 4,640,002 A | 2/1987 | Phillips et al. |
| 4,652,693 A | 3/1987 | Bar-On |
| 4,675,468 A | 6/1987 | Basol et al. |
| 4,695,674 A | 9/1987 | Bar-on |
| 4,697,041 A | 9/1987 | Okaniwa et al. |
| 4,704,369 A | 11/1987 | Nath et al. |
| 4,724,011 A | 2/1988 | Turner et al. |
| 4,745,078 A | 5/1988 | Stetter et al. |
| 4,746,618 A | 5/1988 | Nath et al. |
| 4,758,526 A | 7/1988 | Thalheimer |
| 4,765,845 A | 8/1988 | Takada et al. |
| 4,769,086 A | 9/1988 | Tanner et al. |
| 4,773,944 A * | 9/1988 | Nath et al. ............ 136/249 |
| 4,830,038 A | 5/1989 | Anderson et al. |
| 4,860,509 A | 8/1989 | Laaly et al. |
| 4,965,655 A | 10/1990 | Grimmer et al. |
| 5,084,107 A | 1/1992 | Deguchi et al. |
| 5,158,618 A | 10/1992 | Rubin et al. |
| 5,181,968 A | 1/1993 | Nath et al. |
| 5,185,042 A | 2/1993 | Ferguson |
| 5,223,044 A | 6/1993 | Asai |
| 5,232,518 A | 8/1993 | Nath et al. |
| 5,238,519 A | 8/1993 | Nath et al. |
| 5,254,179 A | 10/1993 | Ricaud et al. |
| 5,270,229 A | 12/1993 | Ishihara |
| 5,273,608 A | 12/1993 | Nath |
| 5,330,583 A | 7/1994 | Asai et al. |
| 5,380,371 A | 1/1995 | Murakami |
| 5,385,848 A | 1/1995 | Grimmer |
| 5,391,235 A | 2/1995 | Inoue |
| 5,391,236 A | 2/1995 | Krut et al. |
| 5,419,781 A | 5/1995 | Hamakawa et al. |
| 5,421,908 A | 6/1995 | Yoshida et al. |
| 5,428,249 A | 6/1995 | Sawayama et al. |
| 5,457,057 A | 10/1995 | Nath et al. |
| 5,466,302 A | 11/1995 | Carey et al. |
| 5,468,652 A | 11/1995 | Gee |
| 5,474,620 A | 12/1995 | Nath et al. |
| 5,474,621 A | 12/1995 | Barnard |
| 5,530,519 A | 6/1996 | Miyawaki et al. |
| 5,547,516 A | 8/1996 | Luch |
| 5,554,229 A | 9/1996 | Vogeli |
| 5,567,296 A | 10/1996 | Luch |
| 5,575,861 A | 11/1996 | Younan et al. |
| 5,593,901 A | 1/1997 | Oswald et al. |
| 5,620,528 A | 4/1997 | Schade et al. |
| 5,626,686 A | 5/1997 | Yoshida |
| 5,626,688 A | 5/1997 | Probst et al. |
| 5,637,537 A | 6/1997 | Nath et al. |
| 5,667,596 A | 9/1997 | Tsuzuki et al. |
| 5,674,325 A | 10/1997 | Albright et al. |
| 5,679,176 A | 10/1997 | Tsuzuki et al. |
| 5,681,402 A | 10/1997 | Ichinose et al. |
| 5,733,381 A | 3/1998 | Ota et al. |
| 5,735,966 A | 4/1998 | Luch |
| 5,759,291 A | 6/1998 | Ichinose et al. |
| 5,814,195 A | 9/1998 | Lehan et al. |
| 5,865,904 A | 2/1999 | Tanda |
| 5,868,869 A | 2/1999 | Albright et al. |
| 5,897,715 A | 4/1999 | Ward et al. |
| 5,928,439 A | 7/1999 | Ota et al. |
| 5,942,048 A | 8/1999 | Fujisaki et al. |
| 5,951,786 A | 9/1999 | Gee et al. |
| 6,008,451 A | 12/1999 | Ichinose et al. |
| 6,034,322 A | 3/2000 | Pollard |
| 6,093,581 A | 7/2000 | Takabayashi |
| 6,093,884 A | 7/2000 | Toyomura et al. |
| 6,111,189 A | 8/2000 | Garvison et al. |
| 6,121,542 A | 9/2000 | Shiotsuka et al. |
| 6,184,458 B1 | 2/2001 | Murakami et al. |
| 6,231,732 B1 | 5/2001 | Hollars et al. |
| 6,232,544 B1 | 5/2001 | Takabayashi |
| 6,239,352 B1 | 5/2001 | Luch |
| 6,265,812 B1 * | 7/2001 | Watanabe et al. .... 313/103 CM |
| 6,268,014 B1 | 7/2001 | Eberspacher et al. |
| 6,313,395 B1 | 11/2001 | Crane et al. |
| 6,335,479 B1 | 1/2002 | Yamada et al. |
| 6,340,403 B1 | 1/2002 | Carey et al. |
| 6,350,944 B1 | 2/2002 | Sherif et al. |
| 6,359,209 B1 | 3/2002 | Glenn et al. |
| 6,365,010 B1 | 4/2002 | Hollars |
| 6,372,538 B1 | 4/2002 | Wendt et al. |
| 6,384,313 B2 | 5/2002 | Nakagawa et al. |
| 6,414,235 B1 | 7/2002 | Luch |
| 6,422,793 B1 | 7/2002 | Todisco et al. |
| 6,459,032 B1 | 10/2002 | Luch |
| 6,468,828 B1 | 10/2002 | Glatfelter et al. |
| 6,479,744 B1 | 11/2002 | Tsuzuki et al. |
| 6,488,824 B1 | 12/2002 | Hollars |
| 6,511,861 B2 | 1/2003 | Takeyama et al. |
| 6,548,912 B1 | 4/2003 | Graff et al. |
| 6,553,729 B1 | 4/2003 | Nath et al. |
| 6,573,445 B1 | 6/2003 | Burgers |

| | | |
|---|---|---|
| 6,582,887 B2 | 6/2003 | Luch |
| 6,586,270 B2 | 7/2003 | Tsuzuki et al. |
| 6,697,248 B1 | 2/2004 | Luch |
| 6,729,081 B2 | 5/2004 | Nath et al. |
| 6,743,524 B2 | 6/2004 | Schaepkens |
| 6,750,662 B1 | 6/2004 | Van Der Heide |
| 6,784,358 B2 | 8/2004 | Kukulka et al. |
| 6,787,405 B2 | 9/2004 | Chen |
| 6,803,513 B2 | 10/2004 | Beernink et al. |
| 6,974,976 B2 | 12/2005 | Hollars |
| 7,022,910 B2 | 4/2006 | Gaudiana et al. |
| 7,120,005 B1 | 10/2006 | Luch |
| 7,144,751 B2 | 12/2006 | Gee et al. |
| 7,170,001 B2 | 1/2007 | Tee et al. |
| 7,276,724 B2 | 10/2007 | Sheats et al. |
| 7,394,425 B2 | 7/2008 | Luch |
| 7,507,903 B2 | 3/2009 | Luch |
| 7,635,810 B2 | 12/2009 | Luch |
| 2002/0014262 A1 | 2/2002 | Matsushitat et al. |
| 2004/0063320 A1 | 4/2004 | Hollars |
| 2004/0144043 A1 | 7/2004 | Stevenson et al. |
| 2005/0072461 A1 | 4/2005 | Kuchinski et al. |
| 2005/0074915 A1 | 4/2005 | Tuttle et al. |
| 2005/0109392 A1 | 5/2005 | Hollars |
| 2005/0241692 A1 | 11/2005 | Rubin et al. |
| 2005/0263178 A1 | 12/2005 | Montello et al. |
| 2005/0263179 A1 | 12/2005 | Gaudiana et al. |
| 2005/0263180 A1 | 12/2005 | Montello et al. |
| 2005/0274408 A1 | 12/2005 | Li et al. |
| 2006/0030141 A1 | 2/2006 | Weng et al. |
| 2006/0032752 A1 | 2/2006 | Luch |
| 2006/0121701 A1 | 6/2006 | Basol |
| 2006/0174931 A1 | 8/2006 | Mapes et al. |
| 2007/0283996 A1 | 12/2007 | Hachtmann et al. |
| 2007/0283997 A1 | 12/2007 | Hachtmann et al. |
| 2007/0295385 A1 | 12/2007 | Sheats |
| 2007/0295390 A1 | 12/2007 | Sheats et al. |
| 2008/0000518 A1 | 1/2008 | Basol |
| 2008/0011350 A1 | 1/2008 | Luch |
| 2008/0053512 A1 | 3/2008 | Kawashima |
| 2008/0053519 A1 | 3/2008 | Pearce et al. |
| 2008/0142071 A1 | 6/2008 | Dorn et al. |
| 2008/0227236 A1 | 9/2008 | Luch |
| 2008/0314432 A1 | 12/2008 | Paulson et al. |
| 2008/0314433 A1 | 12/2008 | Luch |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0107538 A1 | 4/2009 | Luch |
| 2009/0111206 A1 | 4/2009 | Luch |
| 2009/0114261 A1 | 5/2009 | Stancel |
| 2009/0145551 A1 | 6/2009 | Luch |
| 2009/0159119 A1 | 6/2009 | Basol |
| 2009/0169722 A1 | 7/2009 | Luch |
| 2009/0173374 A1 | 7/2009 | Luch |
| 2009/0199894 A1 | 8/2009 | Hollars et al. |
| 2009/0223552 A1 | 9/2009 | Luch |
| 2009/0293941 A1 | 12/2009 | Luch |
| 2010/0071757 A1 | 3/2010 | Krajewski et al. |

\* cited by examiner

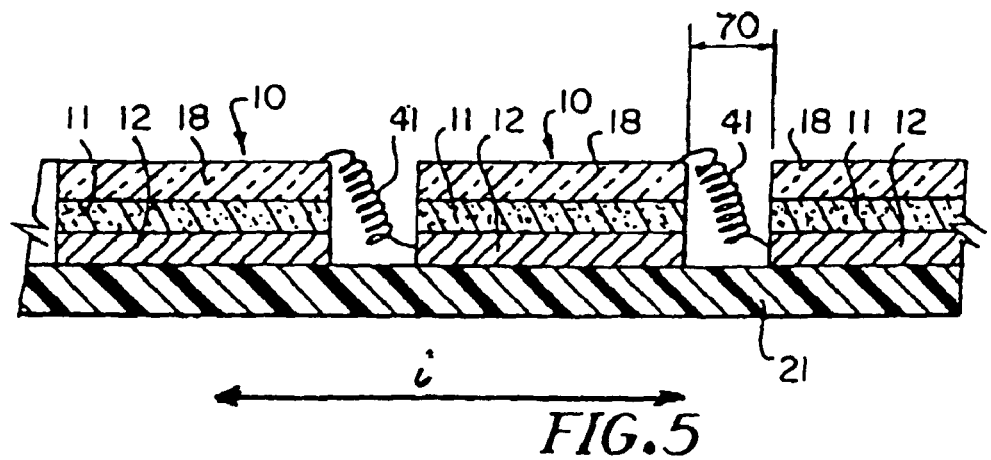
FIG. 5
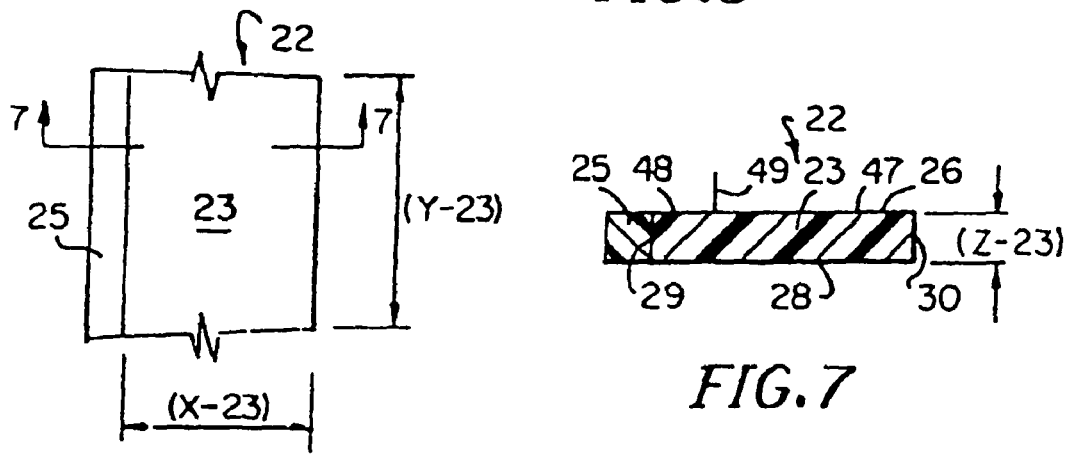
FIG. 6
FIG. 7
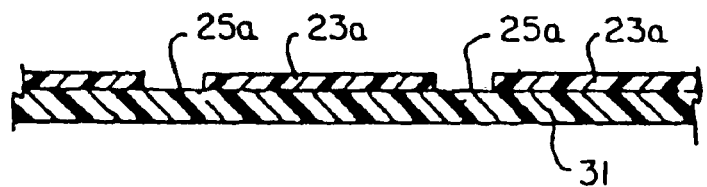
FIG. 8
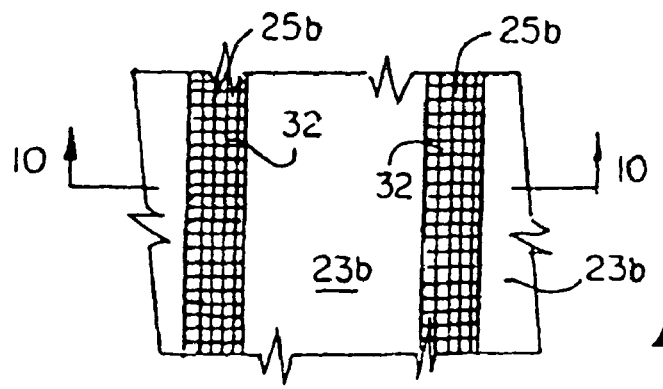
FIG. 9

SUBSTRATE AND COLLECTOR GRID STRUCTURES FOR INTEGRATED SERIES CONNECTED PHOTOVOLTAIC ARRAYS AND PROCESS OF MANUFACTURE OF SUCH ARRAYS

CROSS-REFERENCE TO RELATED APPLICATIONS

This application is a Continuation of U.S. patent application Ser. No. 10/682,093 filed Oct. 8, 2003 now U.S. Pat. No. 7,507,903, entitled Substrate and Collector Grid Structures for Integrated Series Connected Photovoltaic Arrays and Process of Manufacture of Such Arrays which is a Continuation-in-Part of U.S. patent application Ser. No. 10/186,546 filed Jul. 1, 2002, entitled Substrate and Collector Grid Structures for Integrated Series Connected Photovoltaic Arrays and Process of Manufacture of Such Arrays, now abandoned, which is a Continuation-in-Part of U.S. patent application Ser. No. 09/528,086, filed Mar. 17, 2000, entitled Substrate and Collector Grid Structures for Integrated Series Connected Photovoltaic Arrays and Process of Manufacture of Such Arrays, and now U.S. Pat. No. 6,414,235, which is a Continuation-in-Part of U.S. patent application Ser. No. 09/281,656, filed Mar. 30, 1999, entitled Substrate and Collector Grid Structures for Electrically Interconnecting Photovoltaic Arrays and Process of Manufacture of Such Arrays, and now U.S. Pat. No. 6,239,352. The entire contents of the above identified applications are incorporated herein by this reference.

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the exceptionally high cost of single crystal silicon material and interconnection processing.

A second approach to produce photovoltaic cells is by depositing thin photovoltaic semiconductor films on a supporting substrate. Material requirements are minimized and technologies can be proposed for mass production. The thin film structures can be designed according to doped homojunction technology such as that involving silicon films, or can employ heterojunction approaches such as those using CdTe or chalcopyrite materials. Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically individual cell voltage is less than one volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. Pat. Nos. 4,443,651, 4,724,011, and 4,769,086 to Swartz, Turner et al. and Tanner et al. respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. For example, U.S. Pat. No. 4,965,655 to Grimmer et. al. and U.S. Pat. No. 4,697,041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers significantly limits the active area of the individual interconnected cells.

It has become well known in the art that the efficiencies of certain promising thin film photovoltaic junctions can be substantially increased by high temperature treatments. These treatments involve temperatures at which even the most heat resistant plastics suffer rapid deterioration, thereby requiring either ceramic, glass, or metal substrates to support the thin film junctions. Use of a glass or ceramic substrates generally restricts one to batch processing and handling difficulty. Use of a metal foil as a substrate allows continuous roll-to-roll processing. However, despite the fact that use of a metal foil allows high temperature processing in roll-to-roll fashion, the subsequent interconnection of individual cells effectively in an interconnected array has proven difficult, in part because the metal foil substrate is electrically conducting.

U.S. Pat. No. 4,746,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for an inexpensive manufacturing process which allows high heat treatment for thin film photovoltaic junctions while also offering unique means to achieve effective integrated series connections.

A further unsolved problem which has thwarted production of expansive surface photovoltaic modules is that of collecting the photogenerated current from the top, light incident surface. Transparent conductive oxide (TCO) layers have been employed as a top surface electrode. However, these TCO layers are relatively resistive compared to pure metals. This fact forces individual cell widths to be reduced in order to prevent unacceptable resistive power losses. As cell widths decrease, the width of the area between individual cells (interconnect area) should also decrease so that the relative portion of inactive surface of the interconnect area does not become excessive. Typical cell widths of one centimeter are often taught in the art. These small cell widths demand very fine interconnect area widths, which dictate delicate and sensitive techniques to be used to electrically connect the top TCO surface of one cell to the bottom electrode of an adjacent series connected cell. Furthermore, achieving good stable ohmic contact to the TCO cell surface has proven difficult, especially when one employs those sensitive techniques available when using the TCO only as the top collector electrode. The problem of collecting photovoltaic generated current from the top light impinging surface of a photovoltaic cell has been addressed in a number of ways, none entirely successful.

In a somewhat removed segment of technology, a number of electrically conductive fillers have been used to produce electrically conductive polymeric materials. This technology generally involves mixing of the conductive filler into the polymer resin prior to fabrication of the material into its final shape. Conductive fillers typically consist of high aspect ratio particles such as metal fibers, metal flakes, or highly structured carbon blacks, with the choice based on a number of cost/performance considerations. Electrically conductive resins have been used as bulk thermoplastic compositions, or formulated into paints. Their development has been spurred in large part by electromagnetic radiation shielding and static discharge requirements for plastic components used in the electronics industry. Other known applications include resistive heating fibers and battery components.

In yet another separate technological segment, electroplating on plastic substrates has been employed to achieve decorative effects on items such as knobs, cosmetic closures, faucets, and automotive trim. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction (typically referred to as "electroless plating"). This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully molded parts and designs. In addition, the many steps employing harsh chemicals make the process intrinsically costly and environmentally difficult. Finally, the sensitivity of ABS plastic to liquid hydrocarbons has prevented certain applications. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated. None of these attempts at simplification have achieved any recognizable commercial application.

A number of proposals have been made to make the plastic itself conductive enough to allow it to be electroplated directly thereby avoiding the "electroless plating" process. Efforts to advance systems contemplating metal electrodeposition directly onto the surface of an electrically conductive polymer have encountered a number of obstacles. The first is the combination of fabrication difficulty and material property deterioration brought about by the heavy filler loadings often required. A second is the high cost of many conductive fillers employed such as silver flake.

Another major obstacle involved in the electroplating of electrically conductive polymers is a consideration of adhesion between the electrodeposited metal and polymeric substrate (metal/polymer adhesion). In some cases such as electroforming, where the electrodeposited metal is eventually removed from the substrate, metal/polymer adhesion may actually be detrimental. However, in most cases sufficient adhesion is required to prevent metal/polymer separation during extended environmental and use cycles.

A number of methods to enhance adhesion have been employed. For example, etching of the surface prior to plating can be considered. Etching can be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids.

In the case of conductive polymers containing finely divided metal, one can propose achieving direct metal-to-metal adhesion between electrodeposit and filler. However, here the metal particles are generally encapsulated by the resin binder, often resulting in a resin rich "skin". To overcome this effect, one could propose methods to remove the "skin", exposing active metal filler to bond to subsequently electrodeposited metal.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

An additional major obstacle confronting development of electrically conductive polymeric resin compositions capable of being directly electroplated is the initial "bridge" of electrodeposit on the surface of the electrically conductive resin. In electrodeposition, the substrate to be plated is normally made cathodic through a pressure contact to a metal rack tip, itself under cathodic potential. However, if the contact resistance is excessive or the substrate is insufficiently conductive, the electrodeposit current favors the rack tip to the point where the electrodeposit will not bridge to the substrate.

Moreover, a further problem is encountered even if specialized racking successfully achieves electrodeposit bridging to the substrate. Many of the electrically conductive polymeric resins have resistivities far higher than those of typical metal substrates. The polymeric substrate can be relatively limited in the amount of electrodeposition current which it alone can convey. Thus, the conductive polymeric substrate does not cover almost instantly with electrodeposit as is typical with metallic substrates. Except for the most heavily loaded and highly conductive polymer substrates, a large portion of the electrodeposition current must pass back through the previously electrodeposited metal growing laterally over the surface of the conductive plastic substrate. In a fashion similar to the bridging problem discussed above, the electrodeposition current favors the electrodeposited metal and the lateral growth can be extremely slow and erratic. This restricts the size and "growth length" of the substrate conductive pattern, increases plating costs, and can also result in large non-uniformities in electrodeposit integrity and thickness over the pattern.

This lateral growth is dependent on the ability of the substrate to convey current. Thus, the thickness and resistivity of the conductive polymeric substrate can be defining factors in the ability to achieve satisfactory electrodeposit coverage rates. When dealing with selectively electroplated patterns long thin metal traces are often desired, deposited on a relatively thin electrically conductive polymer substrate. These factors of course work against achieving the desired result.

This coverage rate problem likely can be characterized by a continuum, being dependent on many factors such as the nature of the initially electrodeposited metal, electroplating bath chemistry, the nature of the polymeric binder and the resistivity of the electrically conductive polymeric substrate. As a "rule of thumb", the instant inventor estimates that coverage rate problems would demand attention if the resistivity of the conductive polymeric substrate rose above about 0.001 ohm-cm.

Beset with the problems of achieving adhesion and satisfactory electrodeposit coverage rates, investigators have attempted to produce directly electroplateable polymers by heavily loading polymers with relatively small metal containing fillers. Such heavy loadings are sufficient to reduce both microscopic and macroscopic resistivity to a level where the coverage rate phenomenon may be manageable. However, attempts to make an acceptable directly electroplateable resin using the relatively small metal containing fillers alone encounter a number of barriers. First, the fine metal containing fillers are relatively expensive. The loadings required to achieve the particle-to-particle proximity to achieve acceptable conductivity increases the cost of the polymer/filler blend dramatically. The metal containing fillers are accompanied by further problems. They tend to cause deterioration of the mechanical properties and processing characteristics of many resins. This significantly limits options in resin selection. All polymer processing is best achieved by formulating resins with processing characteristics specifically tailored to the specific process (injection molding, extrusion, blow molding etc.). A required heavy loading of metal filler severely restricts ability to manipulate processing properties in this way. A further problem is that metal fillers can be abrasive to processing machinery and may require specialized screws, barrels, and the like. Finally, despite being electrically conductive, a simple metal-filled polymer still offers no mechanism to produce adhesion of an electrodeposit since the metal particles are generally encapsulated by the resin binder, often resulting in a non-conductive resin-rich "skin". For the above reasons, fine metal particle containing plastics have not been widely used as substrates for directly electroplateable articles. Rather, they have found applications in production of conductive adhesives, pastes, and paints.

The least expensive (and least conductive) of the readily available conductive fillers for plastics are carbon blacks. Attempts have been made to produce electrically conductive polymers based on carbon black loading intended to be subsequently electroplated. Examples of this approach are the teachings of U.S. Pat. Nos. 4,038,042, 3,865,699, and 4,278,510 to Adelman, Luch, and Chien et al. respectively.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. A fundamental problem remaining unresolved by the Adelman teaching is the relatively high resistivity of carbon loaded polymers. The lowest "microscopic resistivity" generally achievable with carbon black loaded polymers is about 1 ohm-cm. This is about five to six orders of magnitude higher than typical electrodeposited metals such as copper or nickel. Thus, the electrodeposit bridging and coverage rate problems described above remained unresolved by the Adelman teachings.

Luch in U.S. Pat. No. 3,865,699 and Chien et al. in U.S. Pat. No. 4,278,510 also chose carbon black as an electrically conductive filler for polymeric compounds to be electroplated. However, these inventors further taught incorporation of an electrodeposit coverage or deposition rate accelerator to overcome the galvanic bridging and lateral electrodeposit growth rate problems described above. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome those problems associated with electrically conductive polymeric substrates having relatively high resistivity. In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These resins can be generally described as electrically conductive polymers with the inclusion of a growth rate accelerator.

Specifically for the present invention, specification, and claims, directly electroplateable resins, (DER), are characterized by the following features.

(a) having a polymer or resin matrix or binder;

(b) presence of conductive fillers in the polymer matrix in amounts sufficient to provide an electrical volume resistivity of the polymer/conductive filler mix, which is sufficiently low to allow direct electrodeposition. Typically, a resistivity less than 1000 ohm-cm., e.g., 100 ohm-cm., 10 ohm-cm., 1 ohm-cm. 0.1 ohm-cm., 0.01 ohm-cm., 0.001 ohm-cm., suffices;

(c) presence of an electrodeposit coverage rate accelerator;

(d) presence of the polymer, conductive filler and electrodeposit coverage rate accelerator in the directly electroplateable composition in cooperative amounts required to achieve direct coverage of the composition with an electrodeposited metal or metal-based alloy. It has been found that Group VIII metals or Group VIII metal-based alloys are particularly suitable as the initial electrodeposit on the DER surface.

It is understood the electrical conductivity required to allow for direct electrodeposition can also be achieved thru the use of an inherently conductive polymer. In this instance it may not be necessary to add electrical fillers to the polymer.

In his patents, Luch specifically identified unsaturated elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

When used alone, the minimum workable level of carbon black required to achieve "microscopic" electrical resistivities of less than 1000 ohm-cm. for a polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities. Other well known, finely divided highly conductive fillers (such as metal flake) can be considered in DER applications requiring lower "microscopic" resistivity. In these cases the more highly conductive fillers can be used to augment or even replace the conductive carbon black.

The "bulk, macroscopic" resistivity of conductive carbon black filled polymers can be further reduced by augmenting the carbon black filler with additional highly conductive, high aspect ratio fillers such as metal containing fibers. This can be an important consideration in the success of certain applications. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer "matrix" encapsulating the non-conductive filler particles.

It is important to recognize a number of important characteristics of directly electroplateable resins (DERs) which facilitate the current invention. First, regarding electrodeposit coverage rate accelerators, both Luch and Chien et al. in the above discussed U.S. patents demonstrated that sulfur and other sulfur bearing materials such as sulfur donors and accelerators served this purpose when using an initial Group VIII "strike" layer. One might expect that other elements of Group 6A nonmetals, such as oxygen, selenium and tellurium, could function in a way similar to sulfur. In addition, other combinations of electrodeposited metals and nonmetal coverage rate accelerators may be identified. It is important to recognize that such an electrodeposit coverage accelerator is extremely important in order to achieve direct electrodeposition in a practical way onto polymeric substrates having relatively high resistivity compared to metals (i.e. 0.001 ohm-cm. or above) or very thin electrically conductive polymeric substrates having restricted current carrying ability.

A second important characteristic of directly electroplateable resins is that electrodeposit coverage speed depends not only on the presence of an electrodeposit coverage rate accelerator but also on the "microscopic resistivity" and less so on the "macroscopic resistivity" of the DER formulation. Thus, large additional loadings of functional non-conductive fillers can be tolerated in DER formulations without undue sacrifice in electrodeposit coverage or adhesion. These additional non-conductive loadings do not greatly affect the "microscopic resistivity" associated with the polymer/conductive filler/electrodeposit coverage accelerator "matrix" since the non-conductive filler is essentially encapsulated by "matrix" material. Conventional "electroless" plating technology does not permit this compositional flexibility.

A third important characteristic of DER technology is its ability to employ polymer resins generally chosen in recognition of the fabrication process envisioned and the intended end use requirements. For example, should an extrusion blow molding fabrication be desired, resins having the required high melt strength can be employed. Should the part be injection molded and have thin wall cross-sections, a typical situation encountered in selective design of conductive trace patterns, a high flow resin can be chosen. Should a coating, ink, paint, or paste be envisioned, a soluble resin such as an elastomer can be considered. All polymer fabrication processes require specific resin processing characteristics for success. The ability to "custom formulate" DER's to comply with these changing processing and end use requirements while still allowing facile, quality electroplating is a significant factor in the electroplating teachings of the current invention. Conventional "electroless" plating technology does not permit great flexibility to "custom formulate".

Due to multiple performance problems associated with their intended end use, none of the attempts identified above to directly electroplate electrically conductive polymers or plastics has ever achieved any recognizable commercial success. Nevertheless, the current inventor has persisted in personal efforts to overcome certain performance deficiencies associated with the initial DER technology. Along with these efforts has come a recognition of unique and eminently suitable applications employing the DER technology. Some examples of these unique applications for electroplated articles include solar cell electrical current collection grids, electrical circuits, electrical traces, circuit boards, antennas, capacitors, induction heaters, connectors, switches, resistors, inductors, batteries, fuel cells, coils, signal lines, power lines, radiation reflectors, coolers, diodes, transistors, piezoelectric elements, photovoltaic cells, emi shields, biosensors and sensors. One readily recognizes that the demand for such functional applications for electroplated articles is relatively recent and has been particularly explosive during the past decade.

While not precisely definable, electrically insulating materials may generally be characterized as having electrical resistivities greater than 10,000 ohm-cm. Also, electrically conductive materials may generally be characterized as having electrical resistivities less than 0.001 ohm-cm. Also electrically resistive or semi-conductive materials may generally be characterized as having electrical resistivities in the range of 0.001 ohm-cm to 10,000 ohm-cm. The characterization "electrically conductive polymer" covers a very wide range of intrinsic resistivities depending on the filler, the filler loading and the methods of manufacture of the filler/polymer blend. Resistivities for electrically conductive polymers may be as low as 0.00001 ohm-cm. for very heavily filled silver inks, yet may be as high as 10,000 ohm-cm or even more for lightly filled carbon black materials or other "anti-static" materials. "Electrically conductive polymer" has become a broad industry term to characterize all such materials. Thus, the term "electrically conductive polymer" as used in the art and in this specification and claims extends to materials of a very wide range of resistivities from about 0.00001 ohm-cm. to about 10,000 ohm-cm and higher.

In order to eliminate ambiguity in terminology, for the present invention the following definitions are supplied:

"Metal-based" refers to a material or structure having at least one metallic property and comprising one or more components at least one of which is a metal or metal-containing alloy.

"Alloy" refers to a substance composed of two or more intimately mixed materials.

"Group VIII metal-based" refers to a substance containing by weight 50% to 100% metal from Group VIII of the Periodic Table of Elements.

OBJECTS OF THE INVENTION

An object of the invention is to eliminate the deficiencies in the prior art methods of producing expansive area, series interconnected photovoltaic arrays. A further object of the present invention is to provide improved substrates to achieve series interconnections among expansive thin film cells.

A further object of the invention is to permit inexpensive production of high efficiency, heat treated thin film photovoltaic cells while simultaneously permitting the use of polymer based substrate materials and associated processing to effectively interconnect those cells.

A further object of the present invention is to provide improved processes whereby expansive area, series interconnected photovoltaic arrays can be economically mass produced.

A further object of the present invention is to provide improved processes and structures for supplying current collector grids.

Other objects and advantages will become apparent in light of the following description taken in conjunction with the drawings and embodiments.

SUMMARY OF THE INVENTION

The current invention provides a solution to the stated need by producing the active photovoltaic film and interconnecting substrate separately and subsequently combining them to produce the desired expansive series interconnected array. The invention contemplates deposition of thin film photovoltaic junctions on metal foil substrates which can be heat treated following deposition in a continuous fashion without deterioration of the metal support structure. In a separate operation, an interconnection substrate structure is produced in a continuous roll-to-roll fashion.

The metal foil supported photovoltaic junction is then laminated to the interconnecting substrate structure and conductive connections are deposited to complete the array. In this way the interconnection substrate structure can be uniquely formulated from polymer-based materials since it does not have to endure high temperature exposure. Furthermore, the photovoltaic junction and its metal foil support can be produced in bulk without the need to use the expensive and intricate material removal operations currently taught in the art to achieve series interconnections.

BRIEF DESCRIPTION OF THE DRAWINGS

The various factors and details of the structures and manufacturing methods of the present invention are hereinafter more fully set forth with reference to the accompanying drawings wherein:

FIG. 5 is a sectional view illustrating the problems associated with making series connections among thin film photovoltaic cells shown in FIGS. 1-3.

FIG. 6 is a top plan view of a substrate structure for achieving series interconnections of thin film photovoltaic cells.

FIG. 7 is a sectional view taken substantially along the line 7-7 of FIG. 6.

FIG. 8 is a sectional view similar to FIG. 7 showing an alternate embodiment of a substrate structure for achieving series interconnections of thin film photovoltaic cells.

FIG. 9 is a top plan view of an alternate embodiment of a substrate structure for achieving series interconnections of thin film photovoltaic cells.

FIG. 13A is a side view of the process. FIG. 13B is a sectional view taken substantially along line 13B-13B of FIG. 13A.

DESCRIPTION OF PREFERRED EMBODIMENTS

Figure 1:
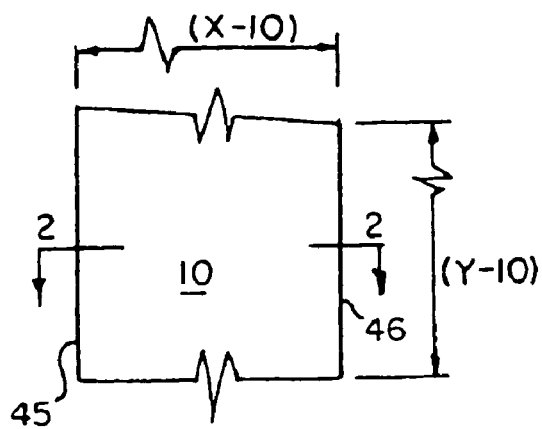
FIG. 1 is a top plan view of a thin film photovoltaic cell including its support foil.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
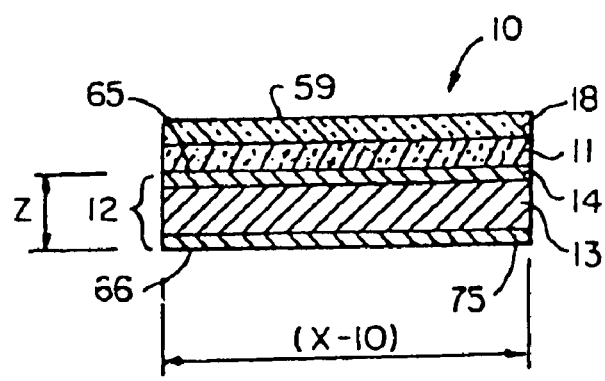
FIG. 2 is a sectional view taken substantially along the line 2-2 of FIG. 1.

Referring to FIGS. 1 and 2, a thin film photovoltaic cell is generally indicated by numeral 10. Cell 10 has a light-incident top surface 59 and a bottom surface 66. Structure 10 has a width X-10 and length Y-10. Width X-10 defines a first photovoltaic cell terminal edge 45 and second photovoltaic cell terminal edge 46. It is contemplated that length Y-10 is considerably greater than width X-10 and length Y-10 can generally be described as "continuous" or being able to be processed in a roll-to-roll fashion. FIG. 2 shows that cell 10 comprises a thin film semiconductor structure 11 supported by metal-based foil 12. Foil 12 has first surface 65, second surface 66, and thickness "Z". Metal-based foil 12 may be of uniform composition or may comprise a laminate of two or more metal-based layers. For example, foil 12 may comprise a base layer of inexpensive and processable metal 13 with an additional metal-based layer 14 disposed between base layer 13 and semiconductor structure 11. The additional metal-based layer may be chosen to ensure good ohmic contact between the top surface 65 of support 12 and photovoltaic semiconductor structure 11. Bottom surface 66 of foil support 12 may comprise a material 75 chosen to achieve good electrical and mechanical joining characteristics to the substrate as will be shown. The thickness Z of support layer 12 is generally contemplated to be between 0.001 cm. and 0.025 cm. This thickness would provide adequate handling strength while still allowing flexibility for roll-to-roll processing.

Figure 3:
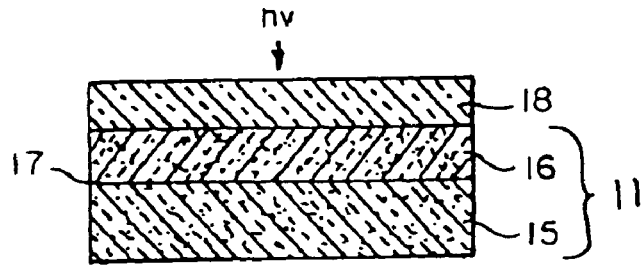
FIG. 3 is an expanded sectional view showing a form of the structure of layer 11 of FIG. 2.

Semiconductor structure 11 can be any of the thin film structures known in the art. In its simplest form, a photovoltaic cell combines an n-type semiconductor with a p-type semiconductor to from an n-p junction. Most often an optically transparent window electrode such as a thin film of zinc or tin oxide is employed to minimize resistive losses involved in current collection. FIG. 3 illustrates an example of a typical photovoltaic cell structure in section. In FIGS. 2 and 3 and other figures, an arrow labeled "hv" is used to indicate the light incident side of the structure. In FIG. 3, 15 represents a thin film of a p-type semiconductor, 16 a thin film of n-type semiconductor and 17 the resulting photovoltaic junction. Window electrode 18 completes the typical photovoltaic structure. The exact nature of the photovoltaic semiconductor structure 11 does not form the subject matter of the present invention.

Figure 4:
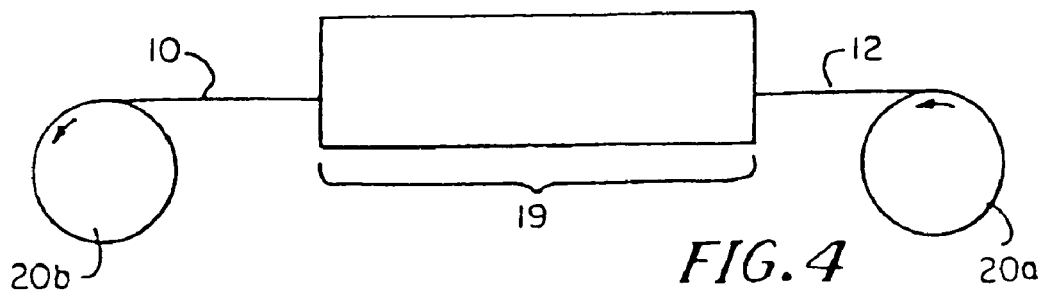
FIG. 4 illustrates a process for producing the structure shown in FIGS. 1-3.

FIG. 4 refers to the method of manufacture of the foil supported photovoltaic structures generally illustrated in FIGS. 1 through 3. The metal-based support foil 12 is moved in the direction of its length Y through a deposition process, generally indicated as 19. Process 19 accomplishes deposition of the active photovoltaic structure onto support foil 12. Support foil 12 is unwound from supply roll 20a, passed through deposition process 19 and rewound onto takeup roll 20b. Process 19 can comprise any of the processes well-known in the art for depositing thin film photovoltaic structures. These processes include electroplating, vacuum sputtering, and chemical deposition. Process 19 may also include treatments, such as heat treatments, intended to enhance photovoltaic cell performance.

Referring now to FIG. 5, there are illustrated cells 10 as shown in FIG. 2. The cells have been positioned to achieve spacial positioning on the support substrate 21. Support structure 21 is by necessity non-conductive at least in that distance indicated by numeral 70 separating the adjacent cells 10. This insulating space prevents short circuiting from metal foil electrode 12 of one cell to foil electrode 12 of an adjacent cell. In order to achieve series connection, electrical communication must be made from the top surface of window electrode 18 to the foil electrode 12 of an adjacent cell. This communication is shown in the FIG. 5 as a metal wire 41. Metal wire 41 is clearly impractical for inexpensive continuous production and is shown for illustration purposes only. The direction of the net current flow for the arrangement shown in FIG. 5 is indicated by the double pointed arrow "I".

It should be noted that foil electrode 12 is relatively thin, on the order of 0.001 cm to 0.025 cm. Therefore connecting to its edge as indicated in FIG. 5 would be impractical. Referring now to FIGS. 6 and 7, one embodiment of the interconnection substrate structures of the current invention is generally indicated by 22. Unit of substrate 22 comprises electrically conductive sheet region 23 and electrically insulating joining portion region 25. Electrically conductive sheet region 23 has a top surface 26, bottom surface 28, width X-23, length Y-23 and thickness Z-23. Width X-23 defines a first terminal edge 29 and a second terminal edge 30 of conductive sheet 23. Top surface 26 of conductive sheet 23 can be thought of as having top collector surface 47 and top contact surface 48 separated by imaginary insulating boundary 49. The purpose for these definitions will become clear in the following.

Electrically conductive sheet 23 includes an electrically conductive polymer. Typically, electrically conductive polymers exhibit bulk resistivity values of less than 1000 ohm-cm. Resistivities less than 1000 ohm-cm can be readily achieved by compounding well-known conductive fillers into a polymer matrix binder.

The substrate unit 22 may be fabricated in a number of different ways. Electrically conductive sheet 23 can comprise an extruded film of electrically conductive polymer joined to a strip of compatible insulating polymer 25 at or near terminal edge 29 as illustrated in FIG. 7. Alternatively, the conductive sheet may comprise a strip of electrically conductive polymer 23a laminated to an insulating support structure 31 as illustrated in section in FIG. 8. In FIG. 8, electrically insulating joining portions 25a are simply those portions of insulating support structure 31 not overlaid by sheets 23a.

It is contemplated that electrically conductive sheets 23 may comprise materials in addition to the electrically conductive polymer. For example, a metal may be electrodeposited to the electrically conductive polymer for increased conductivity. In this regard, the use of a directly electroplateable resin (DER) may be particularly advantageous.

Figure 10:
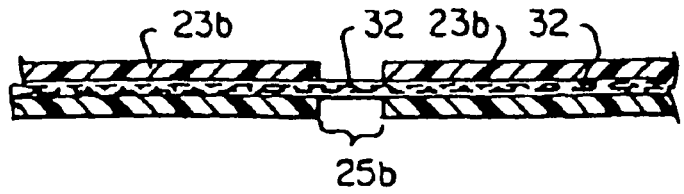
FIG. 10 is a sectional view similar to FIGS. 7 and 8 taken substantially along line 10-10 of FIG. 9.

A further embodiment of fabrication of interconnection substrate unit 22 is illustrated in FIGS. 9 and 10. In FIG. 9, electrically conductive sheet 23b comprises electrically conductive polymer impregnated into a fabric or web 32. A number of known techniques can be used to achieve such impregnation. Insulating joining portion 25b in FIG. 9 is simply an un-impregnated extension of the web 32. Fabric or web 32 can be selected from a number of woven or non-woven fabrics, including non-polymeric materials such as fiberglass.

Figure 11:
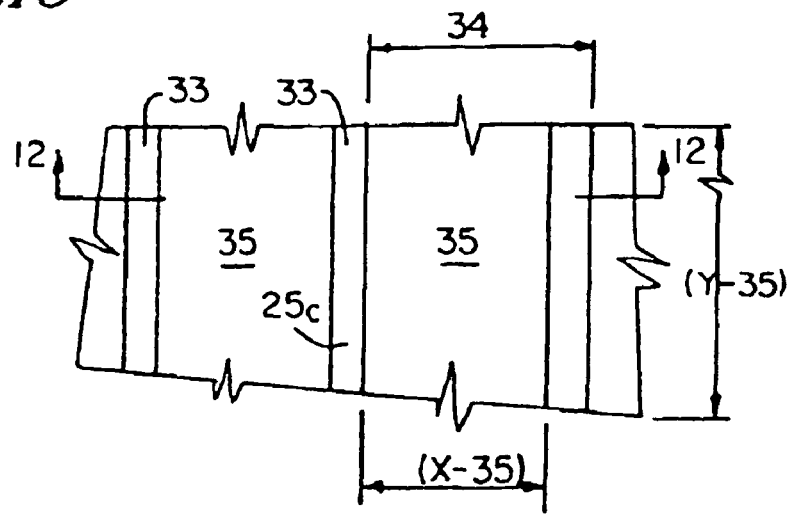
FIG. 11 is a top plan view of another embodiment of a substrate structure for achieving series interconnections of thin film photovoltaic cells.

Referring now to FIG. 11, an alternate embodiment for the substrate structures of the present invention is illustrated. In the FIG. 11, a support web or film 33 extends among and supports multiple individual cell units, generally designated by repeat dimension 34. Electrically conductive sheets 35 are analogous to sheet 23 of FIGS. 6 through 10. At the stage of overall manufacture illustrated in FIG. 11, electrically conductive sheets 35 need not comprise an electrically conductive polymer as do sheets 23 of FIGS. 6 through 10. However, as will be shown, electrically conducting means, typically in the form of an electrically conductive polymer containing adhesive, must eventually be utilized to join photovoltaic laminate 10 to the top surface 50 of electrically conductive sheets 35. In addition, the electrically conducting sheets 35 must be attached to the support carrier 33 with integrity required to maintain positioning and dimensional control. This is normally accomplished with an adhesive, indicated by layer 36 of FIG. 12.

Figure 12:
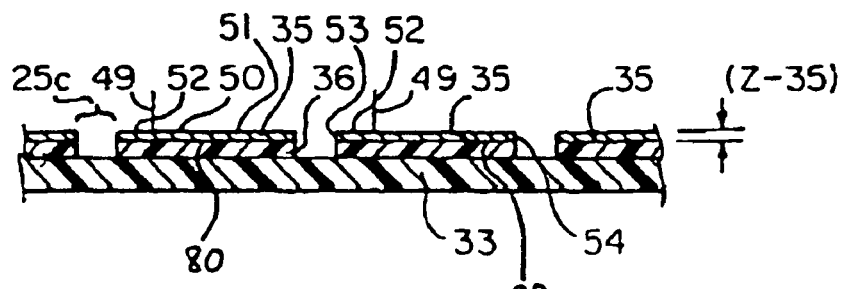
FIG. 12 is a sectional view taken substantially along the line 12-12 of FIG. 11.

Conductive sheets 35 are shown in FIGS. 11 and 12 as having length Y-35, width X-35 and thickness Z-35. It is contemplated that length Y-35 is considerably greater than width X-35 and length Y-35 can generally be described as "continuous" or being able to be processed in roll-to-roll fashion. Width X-35 defines a first terminal edge 53 and second terminal edge 54 of sheet 35.

It is important to note that the thickness of the conductive sheets 35, Z-35 must be sufficient to allow for continuous lamination to the support web 33. Typically when using metal based foils for sheets 35, thickness between 0.001 cm and 0.025 cm would be chosen.

As with the substrate structures of FIGS. 6 through 10, it is helpful to characterize top surface 50 of conductive sheets 35 as having a top collector surface 51 and a top contact surface 52 separated by an imaginary barrier 49. Conductive sheet 35 also is characterized as having a bottom surface 80.

Figure 13A:
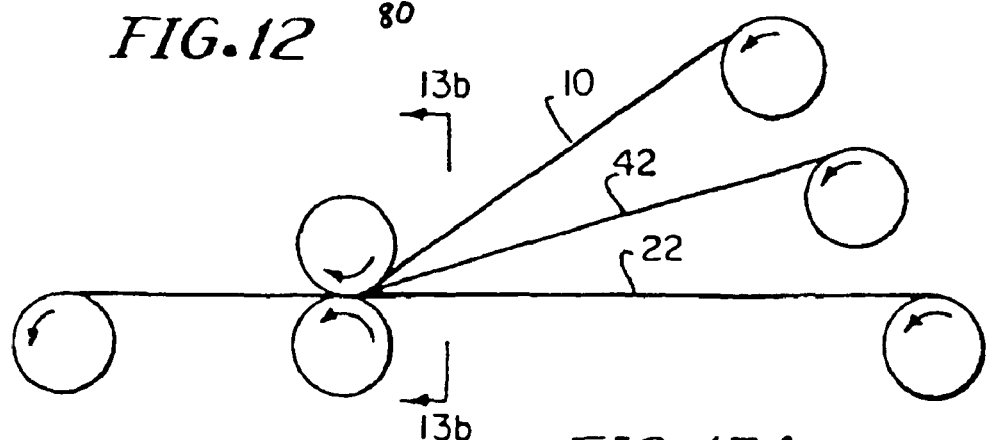
FIGS. 13A and 13B schematically depict a process for laminating the foil supported thin film photovoltaic structure of FIGS. 1 through 3 to an interconnecting substrate structure.
Figure 13B:
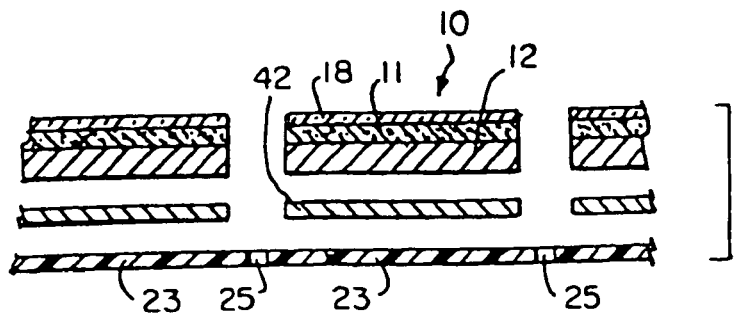

Referring now to FIGS. 13A and 13B, a process is shown for laminating the metal-based foil supported thin film photovoltaic structure of FIGS. 1 through 3 to the substrate structures taught in FIGS. 6 through 12. In FIGS. 13A and 13B, photovoltaic cell structures as illustrated in FIGS. 1 through 3 are indicated by numeral 10. Substrate structures as taught in the FIGS. 6 through 12 are indicated by the numeral 22. Numeral 42 indicates a film of electrically conductive adhesive intended to join electrically conductive metal-based foil 12 of FIGS. 1 through 3 to electrically conductive sheet 23 of FIGS. 6 through 10 or electrically conductive sheets 35 of FIGS. 11 and 12. It will be appreciated by those skilled in the art that the adhesive strip 42 shown in FIGS. 13A and 13B is one of but a number of appropriate metal joining techniques which would maintain required ohmic communication. For example, it is contemplated that methods such as doctor blading a conductive resin prior to lamination, spot welding, soldering, joining with low melt temperature metals or alloys, or crimped mechanical contacts would serve as equivalent methods to accomplish the ohmic joining illustrated as achieved in FIGS. 13a and 13b with a strip of conductive adhesive. These equivalent methods can be generically referred to as conductive joining means. In FIG. 13B, the process of FIG. 13A is illustrated using the substrate structure of FIGS. 6 and 7.

Figure 14A:
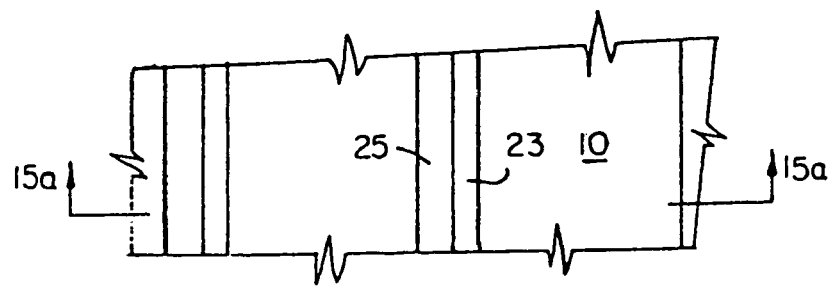
FIGS. 14A, 14B, and 14C are views of the structures resulting from the laminating process of FIG. 13 and using the substrate structure of FIGS. 7, 8, and 10 respectively.
Figure 14B:
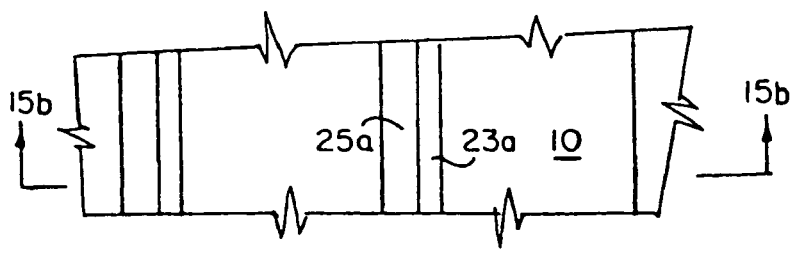
Figure 14C:
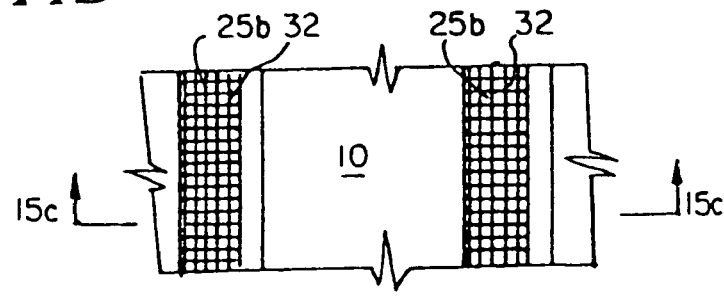
Figure 15A:
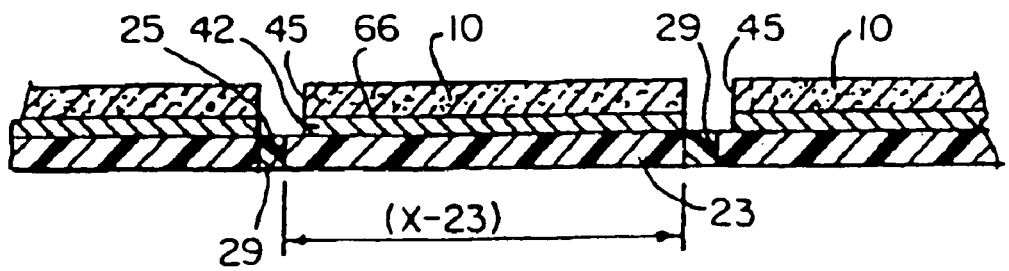
FIGS. 15A, 15B, and 15C are sectional views taken substantially along the lines 15a-15a, 15b-15b, and 15c-15c of FIGS. 14A, 14B, and 14C respectively.
Figure 15B:
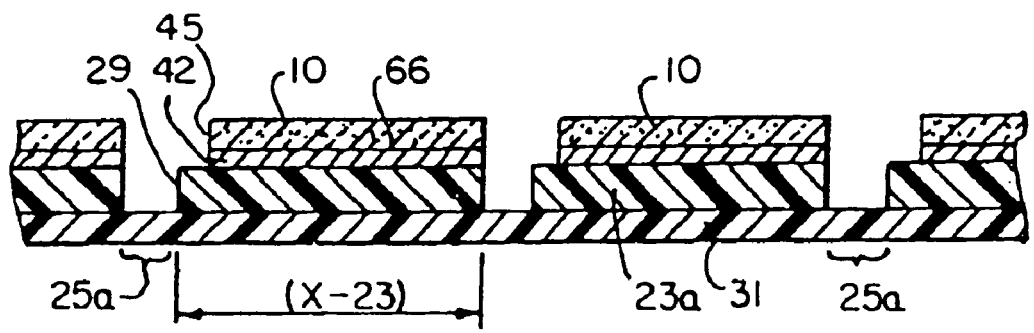
Figure 15C:
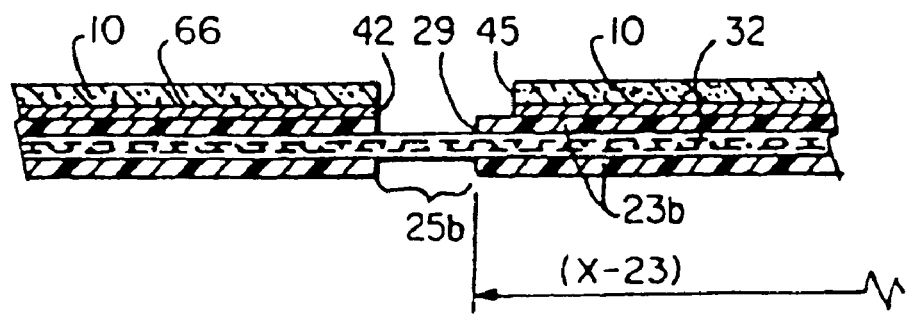

Referring now to FIGS. 14 and 15, there is shown the result of the lamination process of FIG. 13 using the substrate structure of FIGS. 6 through 10. In these and most subsequent figures, cells 10 are shown as a single layer for simplicity, but it is understood that in these figures cells 10 would have a structure similar to that shown in detail in FIG. 2. FIGS. 14A and 15A correspond to the substrate structures of FIGS. 6 and 7. FIGS. 14B and 15B correspond to the substrate structure of FIG. 8. FIGS. 14C and 15C correspond to the substrate structures of FIGS. 9 and 10.

Figure 22:
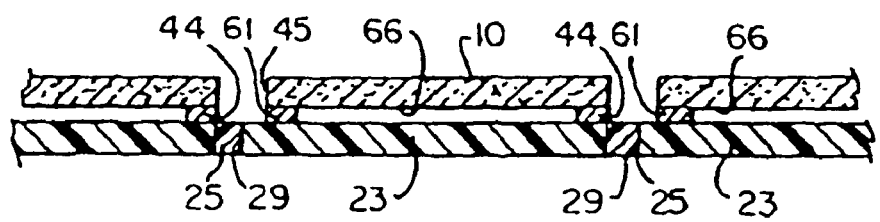
FIG. 22 is a sectional view similar to FIG. 15A but showing an alternate method of accomplishing the mechanical and electrical joining of the lamination process of FIG. 13.

In the FIGS. 15A, 15B and 15C, electrically conductive adhesive layer 42 is shown as extending completely and contacting the entirety of the second surface 66 of metal-based foil supported photovoltaic cells 10. This complete surface coverage is not a requirement however, in that foil 12 is highly conductive and able to distribute current over the expansive width X-10 with minimal resistance losses. For example, the structure of FIG. 22 shows an embodiment wherein electrical communication is achieved between conductive sheet 23 of FIGS. 6 and 7 and second surface 66 of foil 12 through a narrow bead of conductive joining means 61. An additional bead of adhesive shown in FIG. 22 by 44, may be used to ensure, spacial positioning and dimensional support for this form of structure. Adhesive 44 need not be electrically conductive.

Figure 23:
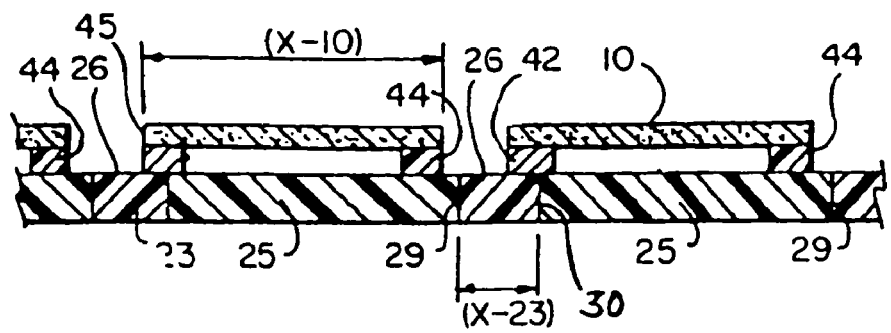
FIG. 23 is a sectional view similar to FIG. 15A but showing an alternate embodiment of the laminated structure.

In the FIGS. 15A, 15B and 15C, the conductive sheets 23, 23a and 23b are shown to be slightly greater in width X-23 than the width of foil X-10. As is shown in FIG. 23, this is not a requirement for satisfactory completion of the series connected arrays. FIG. 23 is a sectional view of a form of the substrate structures of FIGS. 6 and 7 laminated by the process of FIG. 13 to the photovoltaic structures of FIGS. 1-3. In FIG. 23, width X-10 is greater than width X-23. Electrical communication is achieved through conductive joining means 42 and additional joining means 44 to achieve dimensional stability may be employed. The only requirement of the current invention is that first conductive sheet terminal edge 29 be offset from first photovoltaic cell terminal edge 45 to expose a portion of top surface 26 of conductive sheet 23.

Figure 26:
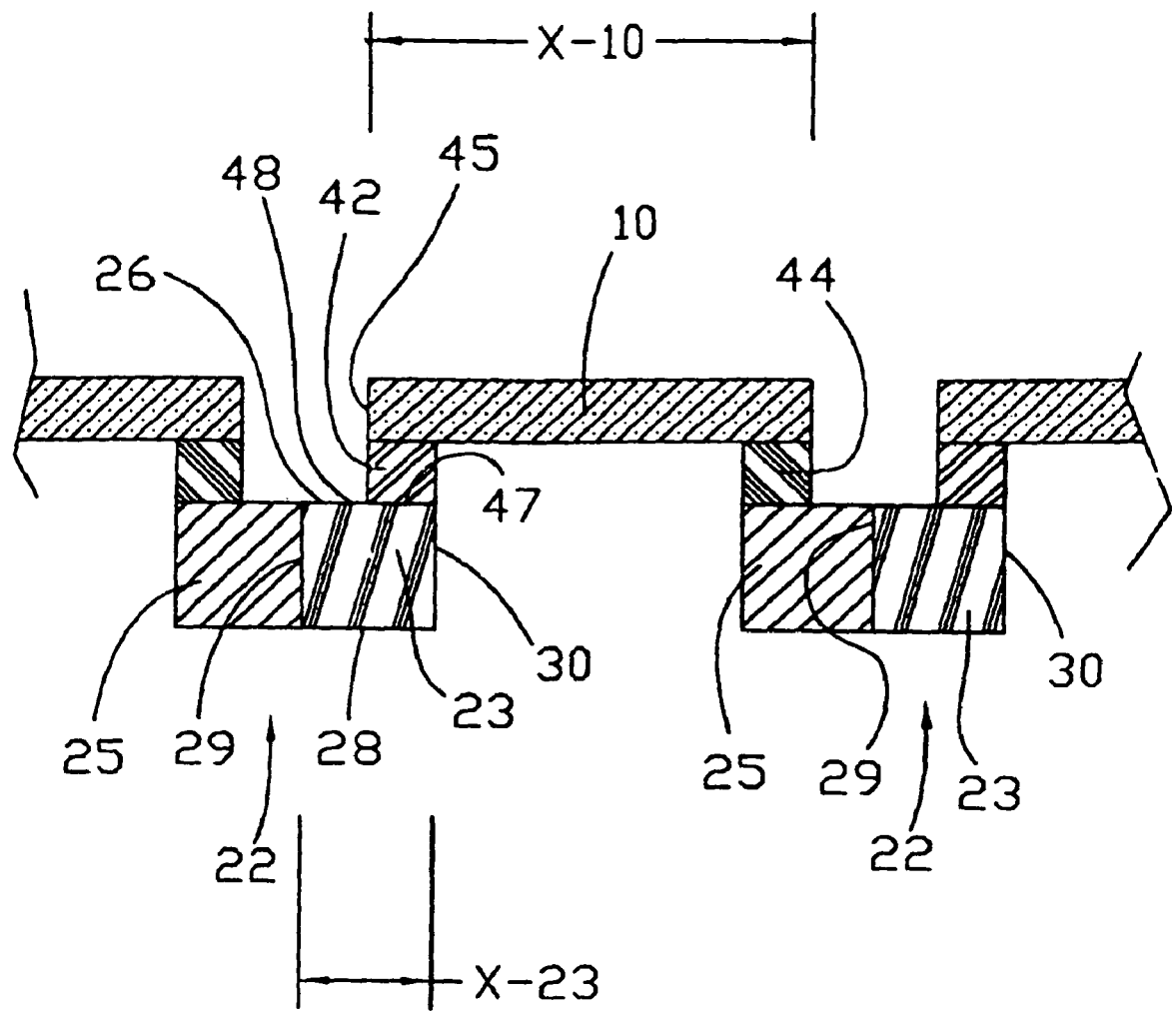
FIG. 26 is a sectional view of another embodiment of a laminated intermediate article in the manufacture of series interconnected arrays.

In FIG. 23, insulating joining portion 25 is shown as extending continuously from second terminal edge 30 of one conductive sheet 23 to the first terminal edge 29 of an adjacent conductive sheet. As shown in FIG. 26, this is not necessary. In FIG. 26, metal foil supported photovoltaic cell 10 is attached to a first conductive sheet 23 through electrically conductive joining means 42 and also to insulating joining portion 25 of an adjacent substrate structure through adhesive 44. Thus, the substrate structure 22 can be discrete. In the embodiment of FIG. 26, the foil based photovoltaic structure 10 is of sufficient strength to maintain proper spacial relationships and positioning among cells.

Figure 16:
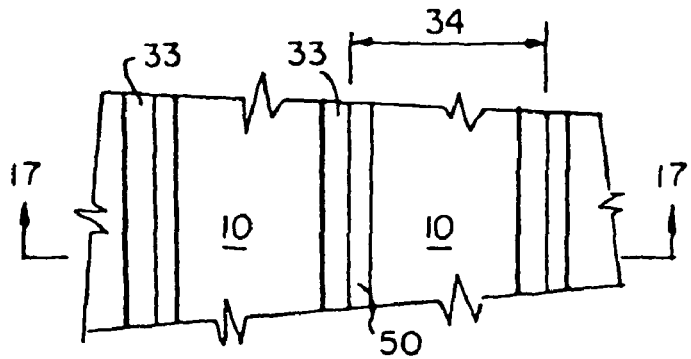
FIG. 16 is a top plan view of the structure resulting from the laminating process of FIG. 13 and using the substrate structure of FIGS. 11 and 12.
Figure 17:
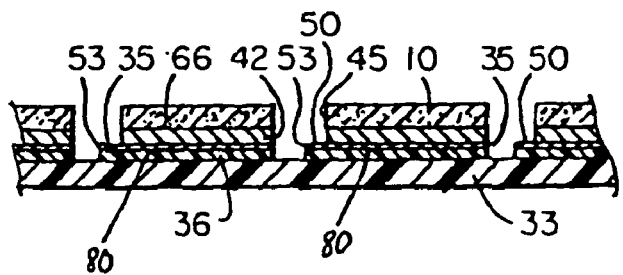
FIG. 17 is a sectional view taken substantially along the line 17-17 of FIG. 16.

Referring now to FIGS. 16 and 17, there is shown an alternate structure resulting from the laminating process of FIG. 13 as applied to the photovoltaic cells of FIGS. 1-3 and the substrate structure of FIGS. 11 and 12. In a fashion similar to that of FIGS. 15, 22, and 23, the first terminal edge 53 of conductive sheets 35 supported by insulating substrate 33 are slightly offset from the first terminal edge 45 of photovoltaic cells 10. This offset exposes a portion of top surface 50 of conductive sheet 35. Electrical and mechanical joining of sheets 35 with second surface 66 of metal-based foil 12 is shown in FIG. 17 as being achieved with conductive adhesive 42 as in previous embodiments. However, it is contemplated as in previous embodiments that this electrical and mechanical joining can be accomplished by alternate means such as soldering, joining with compatible low melting point alloys, spot welding, or mechanical crimping.

In FIG. 17, support web or film 33 is shown as extending continuously among many cells. However, it should be clear that support film 33 can be discontinuous. Support film 33 need only be attached to a portion of a first sheet 35 and a portion of a second sheet 35 of an adjacent cell. This arrangement would suffice to achieve the desired spacial positioning among cells and leave exposed a portion of back surface 80 of electrically conductive sheet 35.

Comparing the sectional views of FIGS. 15, 22, 23 and 17, one observes many similarities. The most important common structural similarity is that the first terminal edges 29 of conductive sheets 23 be offset slightly from first terminal edge 45 of photovoltaic cells 10 (FIGS. 15, 22, 23). Similarly, first terminal edges 53 of conductive sheets 35 are slightly offset from first terminal edges 45 of photovoltaic cells 10 (FIG. 17). As will be shown, the resulting exposed top surface portions are used as contact surfaces for the final interconnected array.

Figure 24:
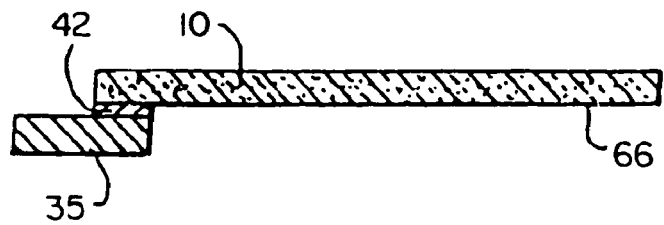
FIG. 24 is a sectional view of an alternate embodiment.
Figure 25:
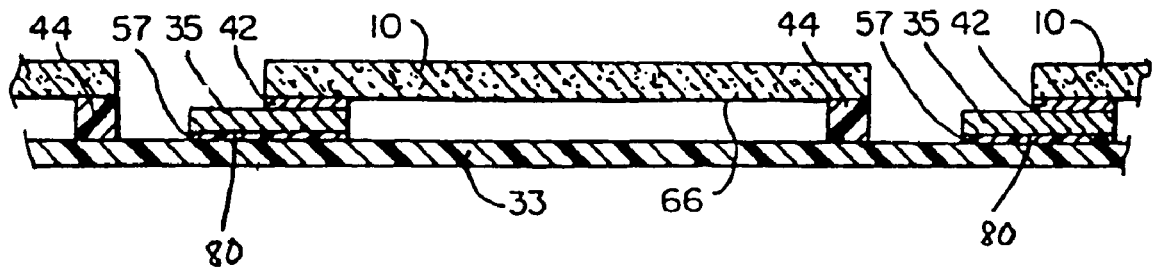
FIG. 25 is a sectional view of the embodiment of FIG. 24 after a further processing step.

It should also be observed that the structures equivalent to those shown in FIGS. 16 and 17 can also be achieved by first joining photovoltaic cells 10 and conductive sheets 35 with suitable electrically conductive joining means 42 to give the structure shown in FIG. 24 and laminating these strips to an insulating support web 33. An example of such an equivalent structure is shown in FIG. 25, wherein the laminates of FIG. 24 have been adhered to insulating web 33 in defined repeat positions with adhesive means 57 and 44. As mentioned above and as shown in FIGS. 24 and 25, conductive sheets 35 do not have to contact the whole of the bottom surface 66 of photovoltaic cell 10. In addition, support web 33 need not be continuous among all the cells. The support web 33 need only extend from the adhesive means 57 of one cell to the adhesive attachment 44 of an adjacent cell. This arrangement would leave a portion of the bottom surface 66 of foil 12, and perhaps a portion of the bottom surface 80 of conductive sheet 35 exposed.

Figure 18:
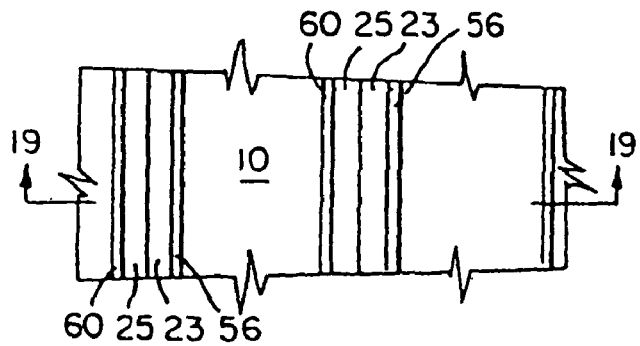
FIG. 18 is a top plan view of the structures of FIGS. 14A and 15A but following an additional step in manufacture of the interconnected cells.
Figure 19:
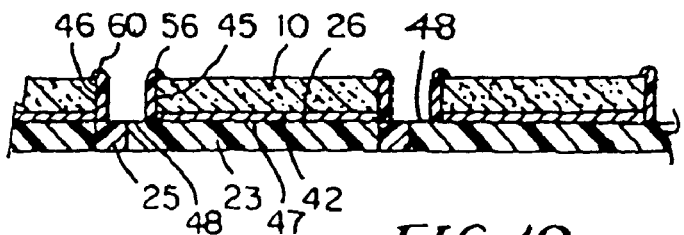
FIG. 19 is a sectional view taken substantially along the line 19-19 of FIG. 18.

Referring now to FIGS. 18 and 19, insulating beads 56 and 60 of insulating material having been applied to the first and second terminal edges 45 and 46 respectively of photovoltaic cells 10. While these beads 56 and 60 are shown as applied to the structure of FIG. 15a, it is understood that appropriate beads of insulating material are also envisioned as a subsequent manufacturing step for the structures of FIGS. 15b, 15c, 17, 22, 23, 25, and 26. The purpose of the insulating beads is to protect the edge of the photovoltaic cells from environmental and electrical deterioration. In addition, as will be shown the insulating bead allows for electrical interconnections to be made among adjacent cells without electrical shorting.

It is noted that the application of insulating material 56 to first terminal edge 45 of photovoltaic cells 10 effectively divides the top surfaces 26 and 50 of conductive sheets 23 and 35 respectively into two regions. The first region (region 48 of surface 26 or region 52 of surface 50) can be considered as a contact region for series interconnects among adjacent cells. The second region (region 47 of surface 26 or region 51 of surface 50) can be considered as the contact region for interconnecting the substrate to the second surface 66 of photovoltaic cells 10.

Figure 20:
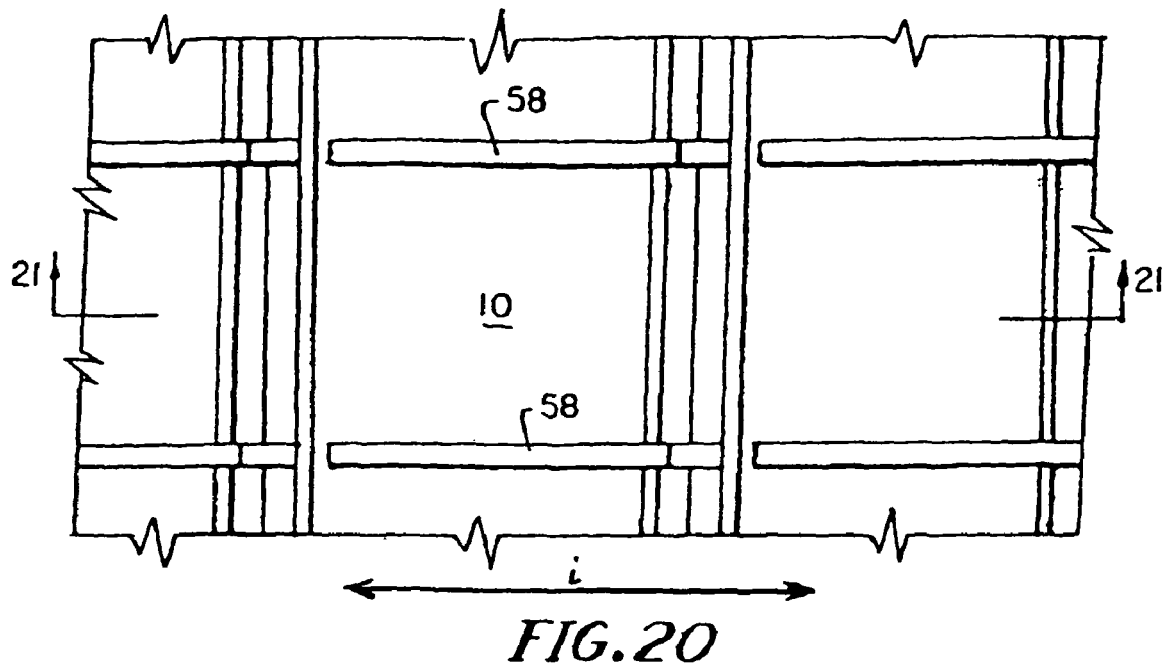
FIG. 20 is a top plan view of a completed interconnected array.
Figure 21:
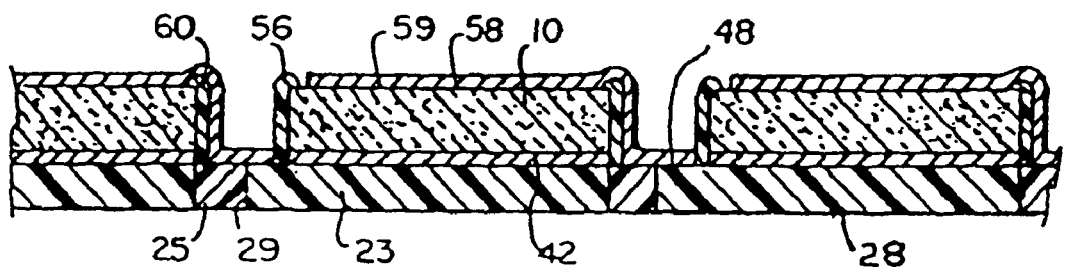
FIG. 21 is a sectional view taken substantially along line 21-21 of FIG. 20.

Referring now to FIGS. 20 and 21, there is shown the method of forming the final interconnected array. Grid fingers 58 of a highly electrically conductive material are deposited to achieve electrical communication between the top surface 59 of the photovoltaic cell 10 and the remaining exposed contact regions 48 or 52 of an adjacent cell. It is contemplated that these fingers can be deposited by any of a number of processes to deposit metal containing or metal-based foils or films, including masked vacuum deposition, printing of conductive inks, electrodeposition or combinations thereof. In the embodiments of FIGS. 20 and 21, the net current flow among cells will be understood by those skilled in the art to be in the direction of the double pointed arrow labeled "I" in the figures.

Figure 27:
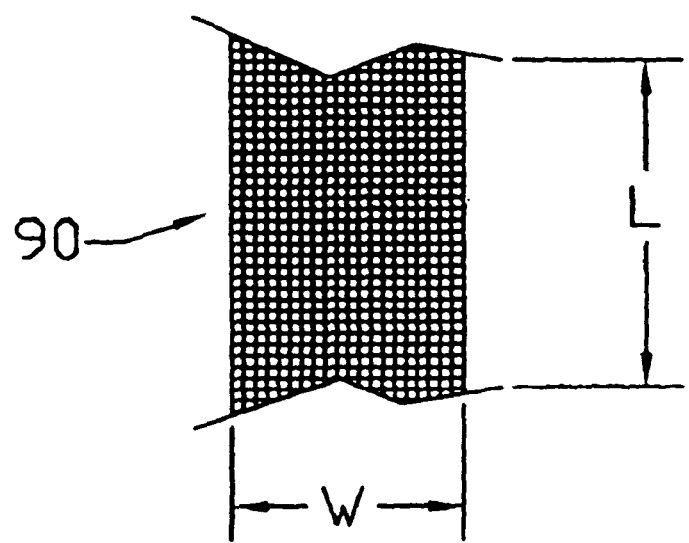
FIG. 27 is a top plan view of a starting material for another embodiment of substrate structure.
Figure 28:
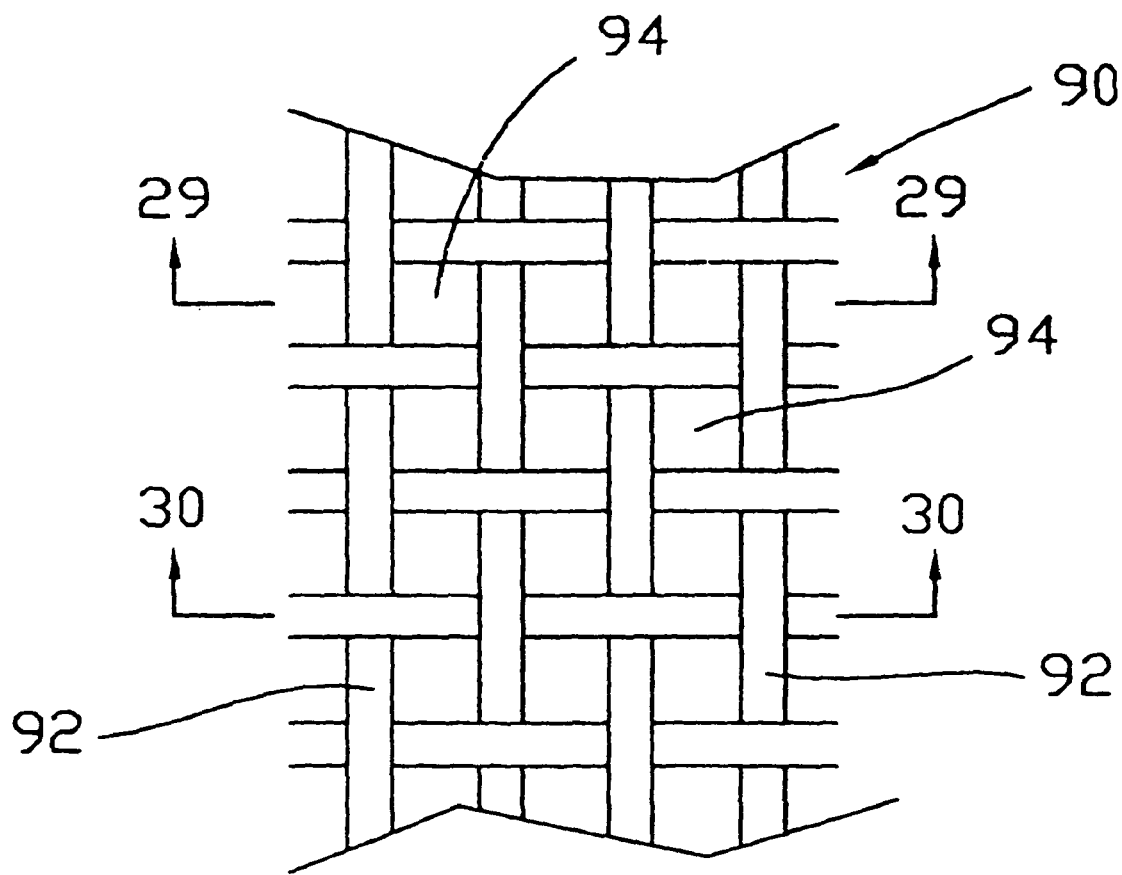
FIG. 28 is a greatly magnified plan view of the material of FIG. 27.

Referring now to FIG. 27, the starting material for yet another embodiment is illustrated in plan view. Web, mesh or fabric strip 90 is characterized by having a width "W" and a length "L". It is contemplated that length "L" is considerably greater than width "W" and length "L" can generally be described as "continuous" or being able to be processed in a roll-to-roll fashion. FIG. 28, a greatly magnified plan view of a portion of the structure of FIG. 27, shows the fabric 90 comprising fibrils 92 interwoven to form a sturdy structure. Holes 94 are present among the interwoven fibrils. It is understood that the fibrils need not be actually interwoven as shown. Equivalent structures comprising fibrils and holes, such as polymeric non-woven fabric or adhesively bonded fibril mats, can be employed.

Figure 29:
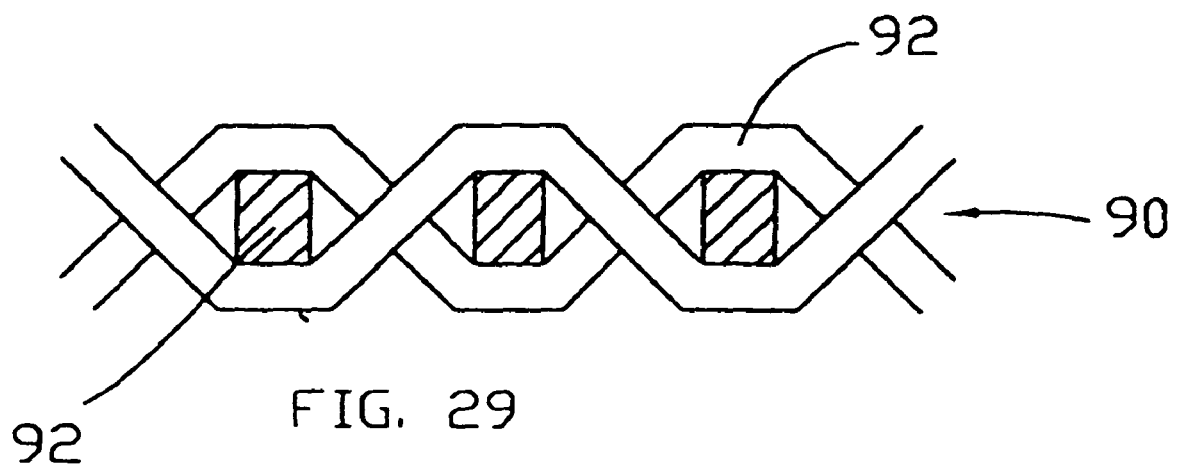
FIG. 29 is a sectional view taken substantially along line 29-29 of FIG. 28.
Figure 30:
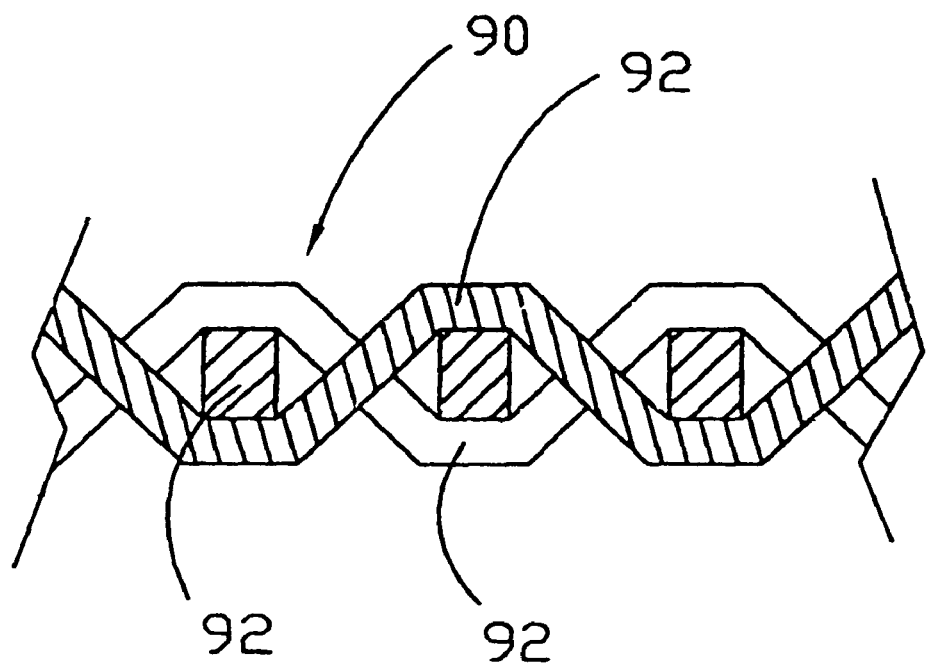
FIG. 30 is a sectional view taken substantially along line 30-30 of FIG. 28.

FIGS. 29 and 30 are sectional views of the embodiment of FIG. 28 taken substantially along line 29-29 and line 30-30 of FIG. 28 respectively.

Figure 31:
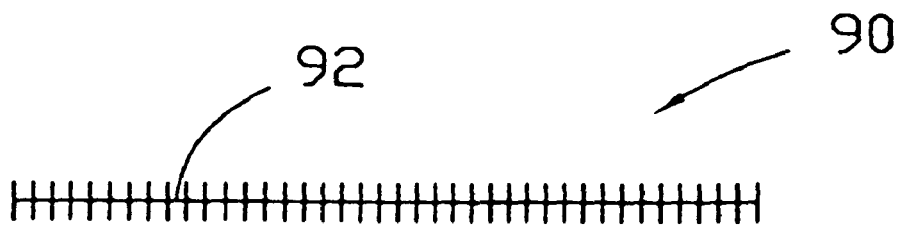
FIG. 31 is a simplified sectional view representing the structure depicted in FIGS. 29 and 30.

FIG. 31 is a greatly simplified sectional representation of the structure depicted in FIGS. 29 and 30. This simplified representation of FIG. 31 is useful in the illustration of subsequent embodiments.

Figure 32:
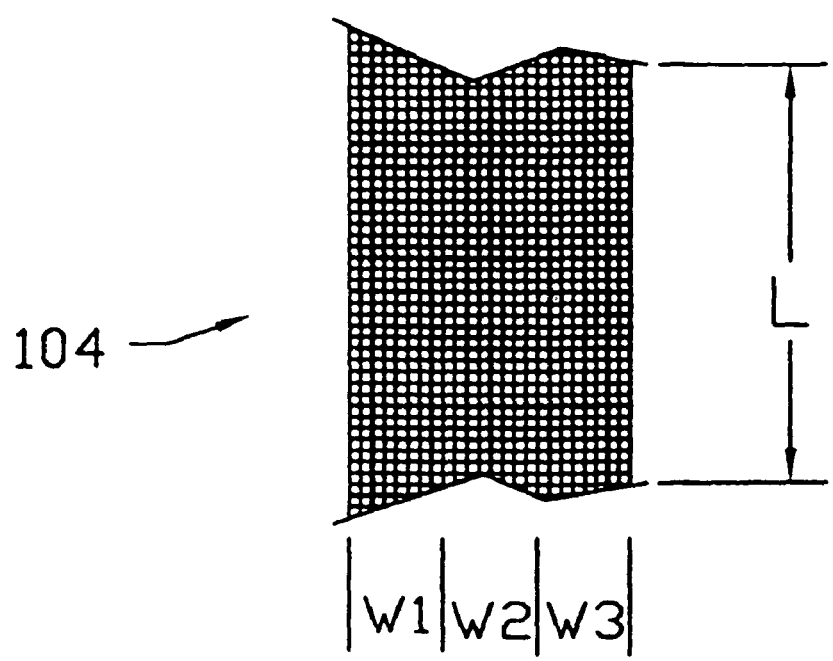
FIG. 32 is a view similar to FIG. 27 but defining three distinct area portions of the structure produced by a process step.

Referring now to FIG. 32, there is shown the material shown in FIG. 27 following an additional processing step. The material of width "W" is now generally designated as 104 to indicate this additional process step. Width "W" has been further defined as comprising three minor widths "W1", "W2", and "W3". Each of these widths "W1", "W2", and "W3" is understood to extend along length "L" as indicated.

Figure 33:
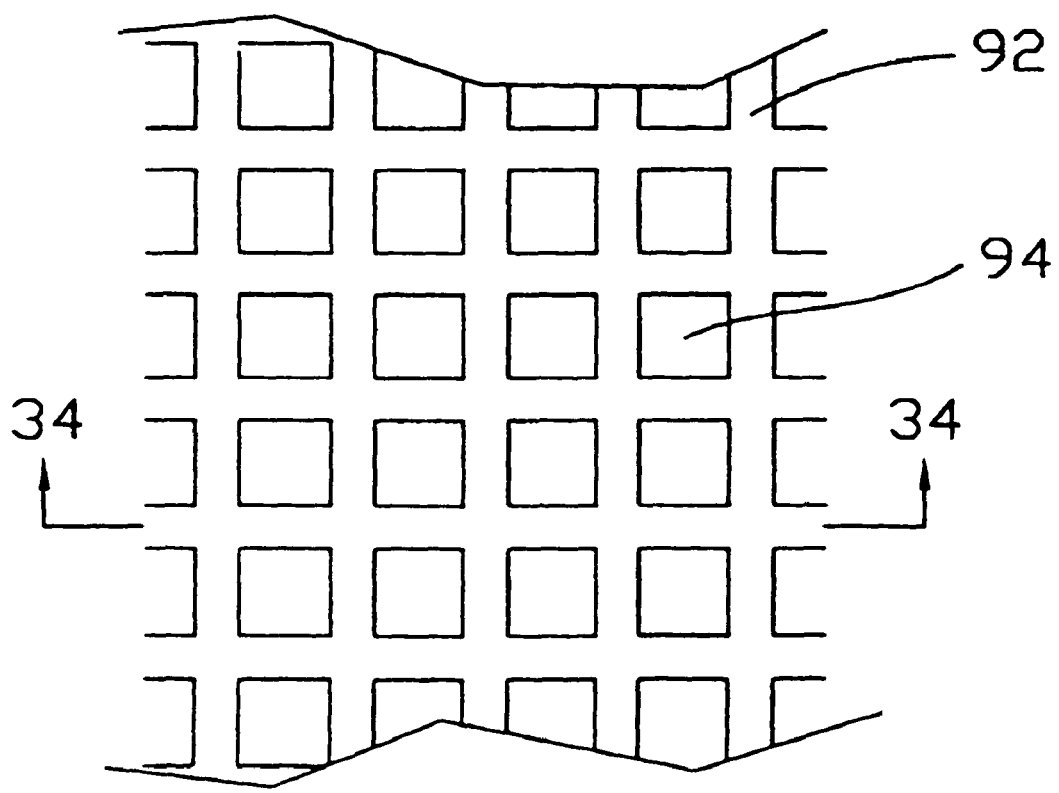
FIG. 33 is a greatly magnified plan view of that portion of FIG. 32 defined by "W2".
Figure 34:
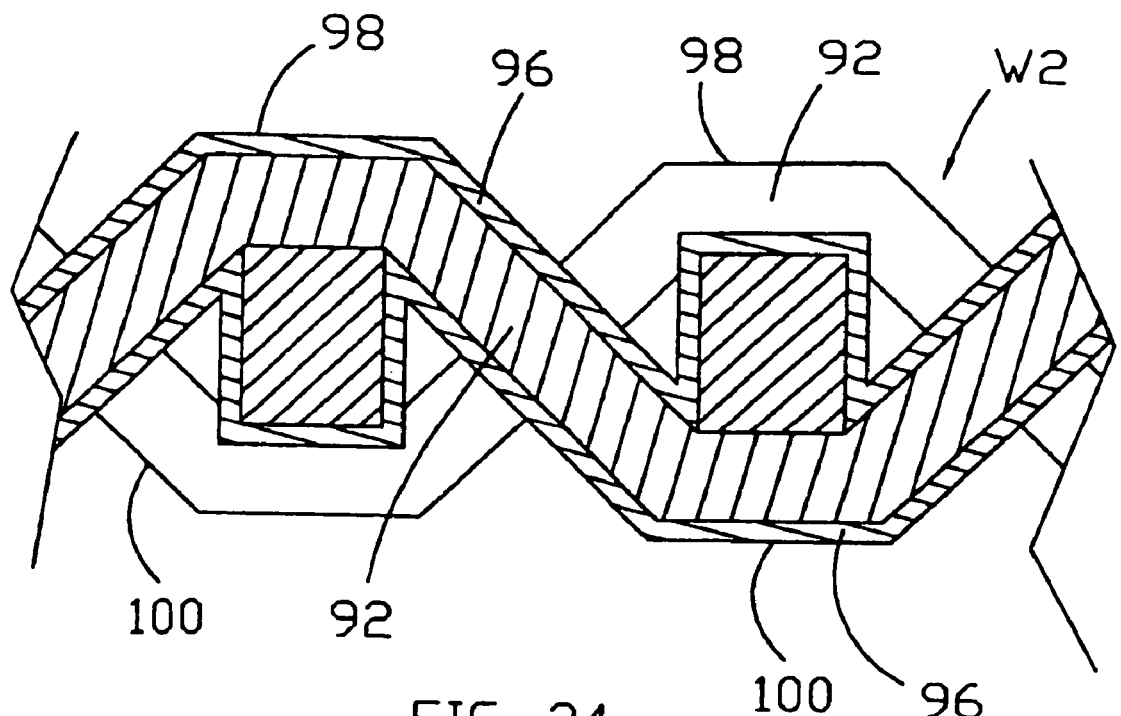
FIG. 34 is a greatly magnified sectional view of a portion of the structure of FIG. 33 taken substantially from the perspective of line 34-34 of FIG. 33.

FIG. 33 is a greatly magnified plan view of the portion of FIG. 32 structure identified as minor width "W2". In contrast to the plan view shown in FIG. 28, the structure of FIG. 33 appears continuous in the two-dimensional plan view. This continuity results from coating the fibrils with an electrically conductive coating. The structure of the coated fibrils is best shown in the sectional view of FIG. 34, which is a view taken substantially along line 34-34 of FIG. 33. In FIG. 34, fibrils 92 in the region "W2" have been coated with electrically conductive coating 96. It is anticipated that coating 96 and the deposition process for applying coating 96 can be chosen from any number of suitable techniques. Included in such techniques are painting, dipping, or printing of conductive inks, laminating, and masked chemical or vapor deposition of metals or other conductive materials. In the case of a temperature resistant fabric such as fiberglass, deposition of a low melting point metal such as solder could be employed. A particularly advantageous coating 96 to prepare the structure of FIG. 34 is directly electroplateable resin (DER) applied as a ink, paint solution or paste. The DER is inexpensive, and readily formulated and applied from solution form.

A method to form an equivalent structure to that shown in FIG. 34 would be to manufacture portion "W2" from a woven or non-woven web of solid DER fibrils.

The important feature of the structure of FIG. 34 is that through-hole electrical communication extends from the top surface 98 to the bottom surface 100 in the region defined by "W2" of FIG. 34. This situation is readily achieved by using the coated fabric or solid DER web approaches of the present embodiments.

Figure 35:
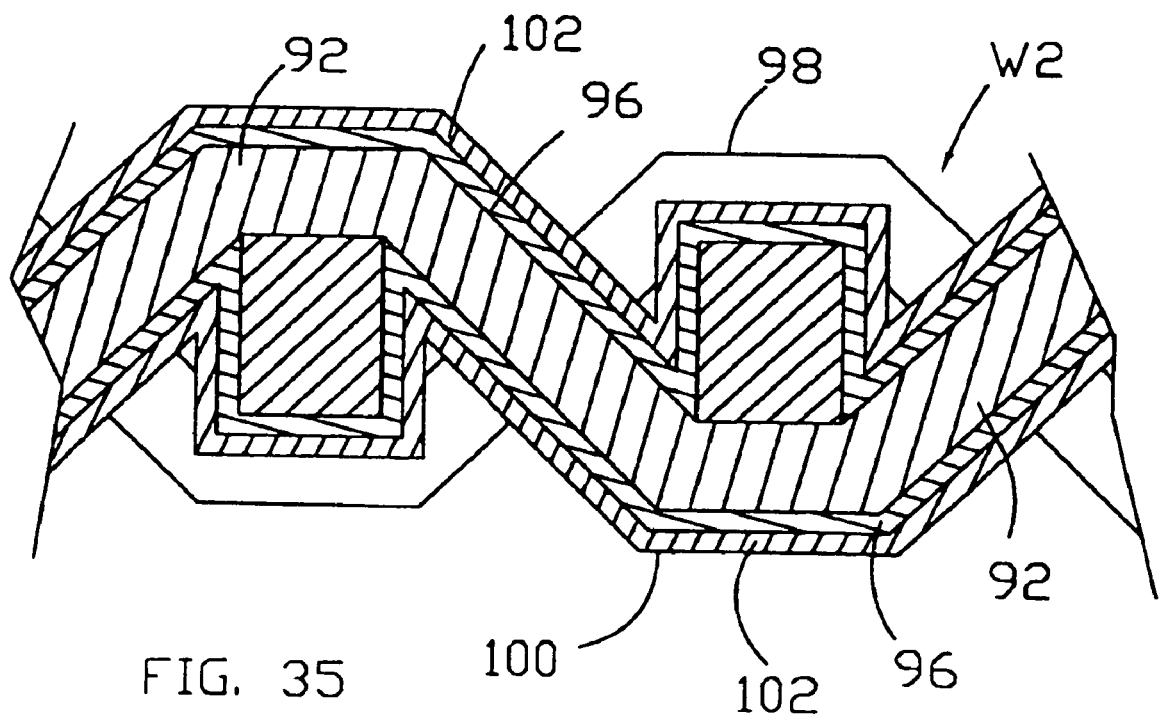
FIG. 35 is a sectional view similar to FIG. 34 showing the structure following an optional additional process step.

FIG. 35 is a sectional view similar to FIG. 34 following an additional optional process step. In FIG. 35, the electrical conductivity and mechanical and environmental integrity of the structure is further enhanced by applying an additional highly conductive coating 102 overlaying coating 96. This subsequent coating 102 can be conveniently applied by metal electrodeposition. The structure of FIG. 35 gives highly conductive communication, equivalent to a metal screen, from top surface 98 to bottom surface 100 in region "W2" by virtue of the through-hole electrodeposition.

Figure 36:
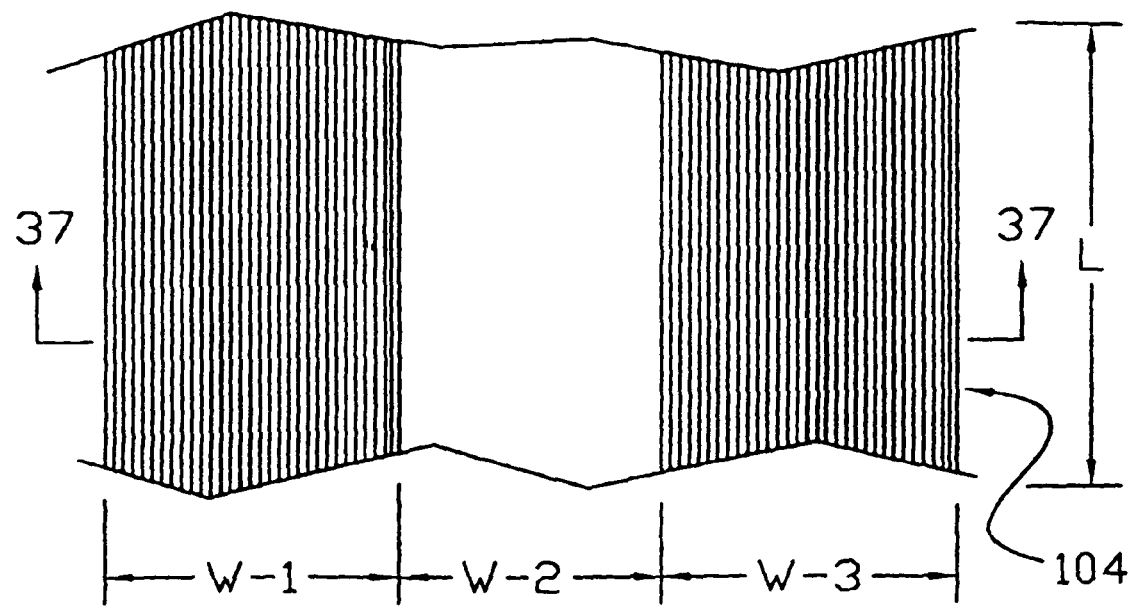
FIG. 36 is a simplified plan view of the structure of FIG. 32 useful in illustrating the process and structure of the embodiment.

Referring now to FIG. 36, there is shown a simplified plan view of the 104 structure intended to facilitate teaching of the processing steps envisioned to accomplish manufacture of the series connected photovoltaic arrays using the substrate structure 104. In FIG. 36, the regions "W1" and "W3" have structure shown in detail in FIGS. 28-30. In FIG. 36, region "W2" has structure shown in detail in FIGS. 33 and 34 and optionally FIG. 35.

Figure 37A:
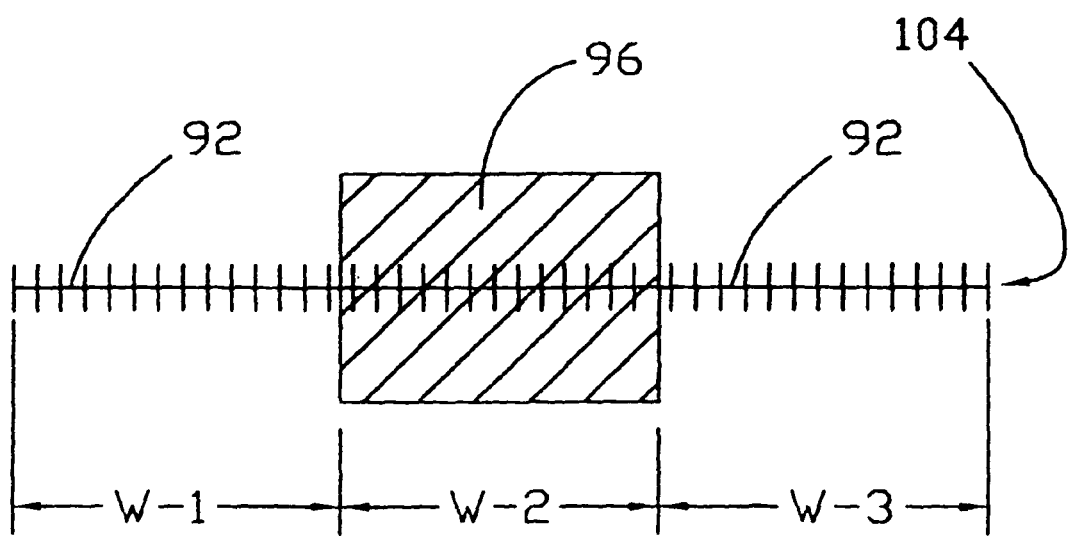
FIG. 37A is a simplified sectional view taken substantially along line 37-37 of FIG. 36, useful in illustrating the process and structure of the embodiment.
Figure 37B:
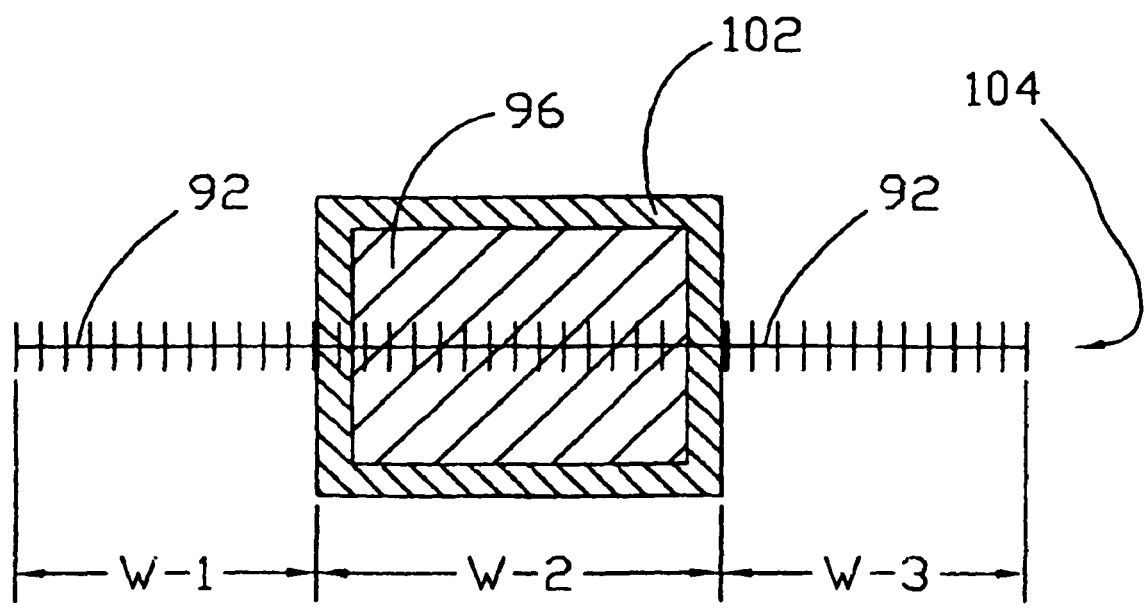
FIG. 37B is a simplified sectional view similar to FIG. 37A incorporating an optional additional process step.

Referring now to FIG. 37a, there is shown a simplified sectional view of the 104 structure employing the "W2" structure depicted in FIG. 34. FIG. 37b shows a similar view of the 104 structure employing the "W2" structure depicted in FIG. 35. These simplifications will help illustration of the processing steps and the structures resulting from these processing steps.

Figure 38:
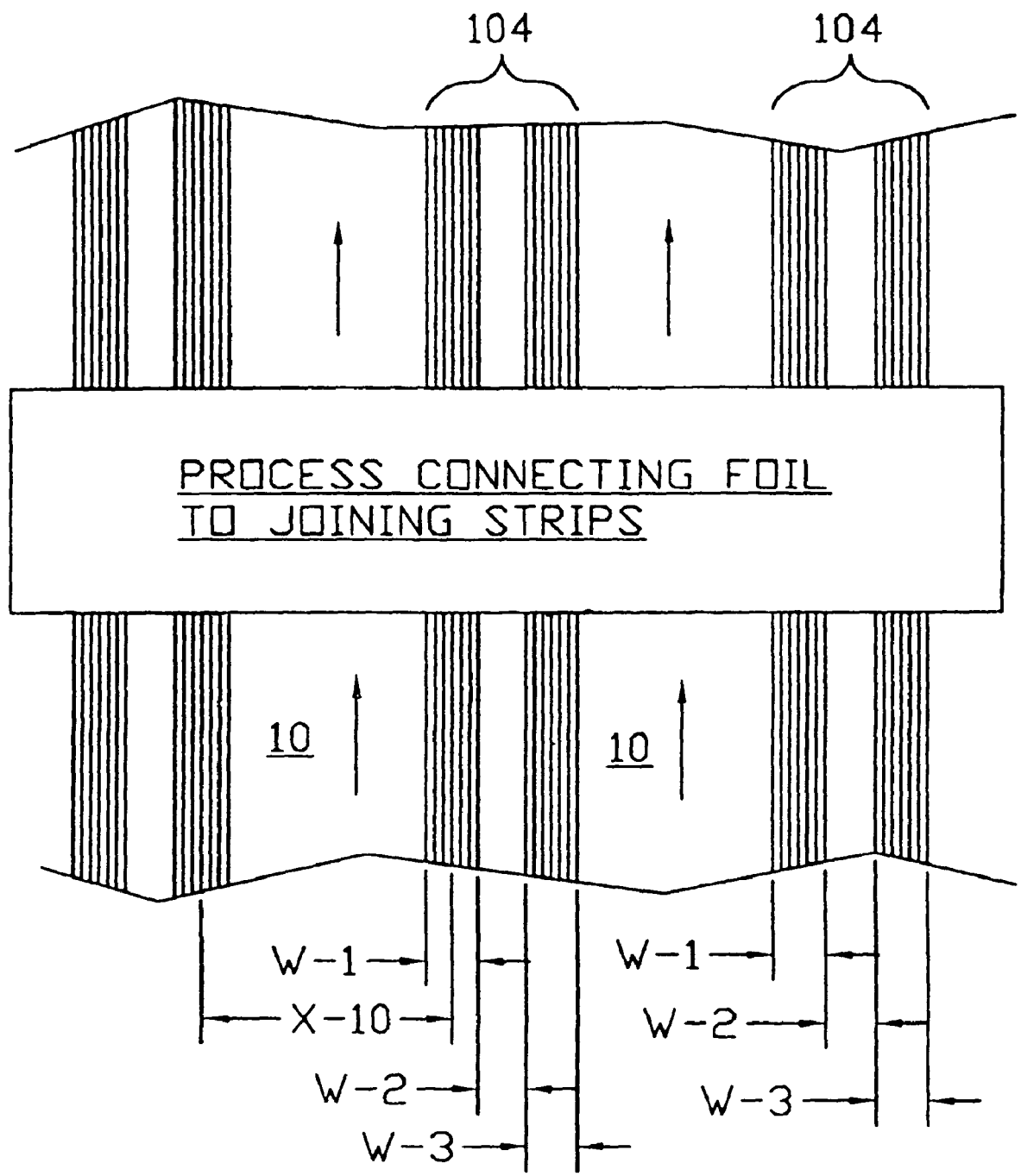
FIG. 38 is a schematic depiction of a process for joining the foil supported thin film photovoltaic structure of FIGS. 1 through 3 to the substrate structure of FIG. 32 or 36.

Referring now to FIG. 38 there is shown a schematic depiction of a process for joining the foil supported thin film photovoltaic structure of FIGS. 1 through 3 with the substrate strips 104. Photovoltaic cells 10 are continuously fed to the process in spaced relationship to substrate strips 104. The process accomplishes attaching one edge portion of cells 10 to a portion "W3" of one substrate strip 104 and an opposite edge portion of cells 10 to a portion "W1" of a second substrate strip 104.

Figure 39:
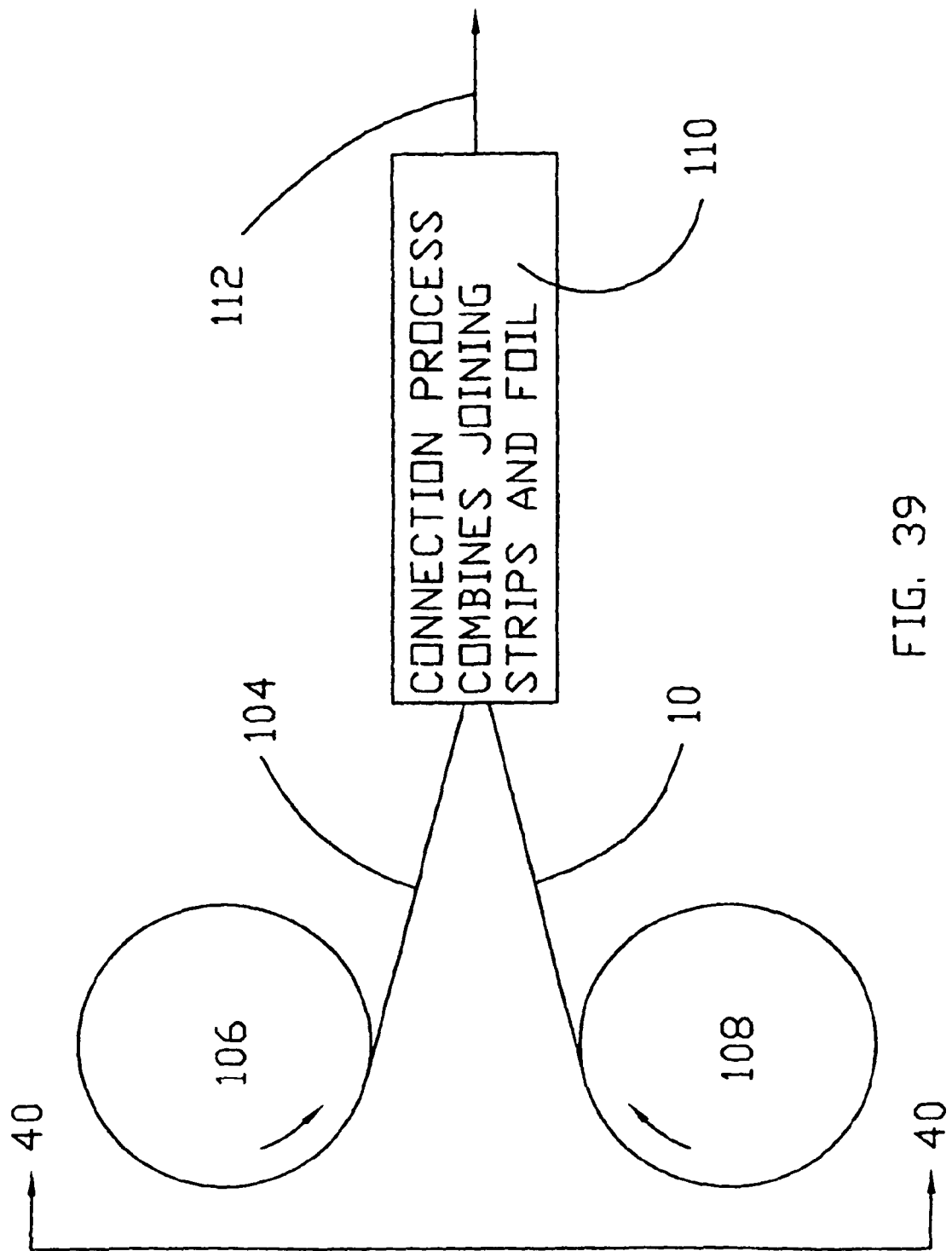
FIG. 39 illustrates one form of the process depicted in FIG. 38.
Figure 40:
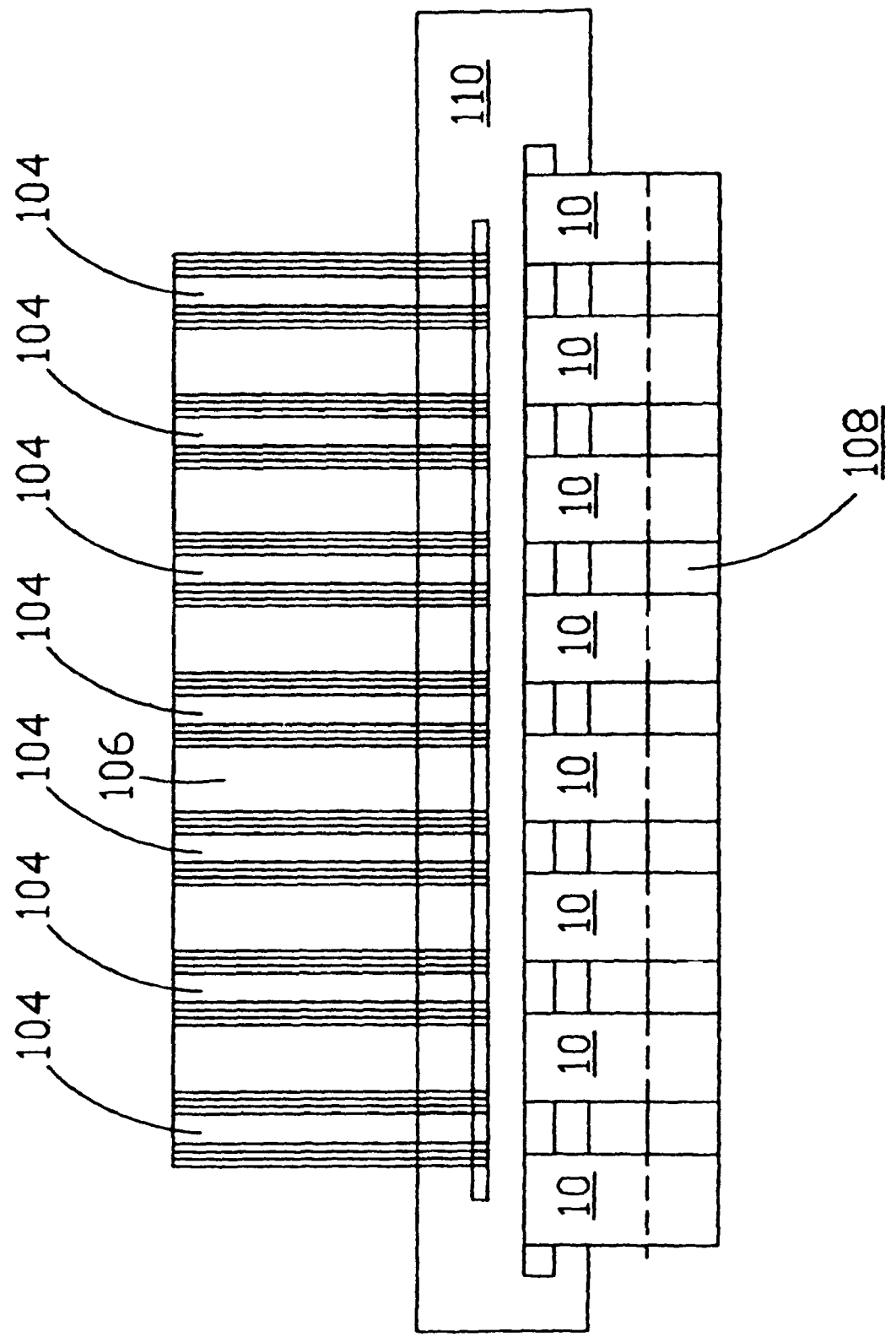
FIG. 40 is a view of the process of FIG. 39 taken substantially along line 40-40 of FIG. 39.

FIGS. 39 and 40 illustrate the process of FIG. 38 in more detail. In FIG. 39, spacially positioned substrate strips 104 are continuously fed to the joining process 110 from roll 106. Spacially positioned photovoltaic cells 10 are continuously fed to the process 110 from roll 108. The resultant combined structure is designated by the numeral 112.

FIG. 40 illustrates the process of FIG. 39 from the perspective of line 40-40 of FIG. 39.

Figure 41:
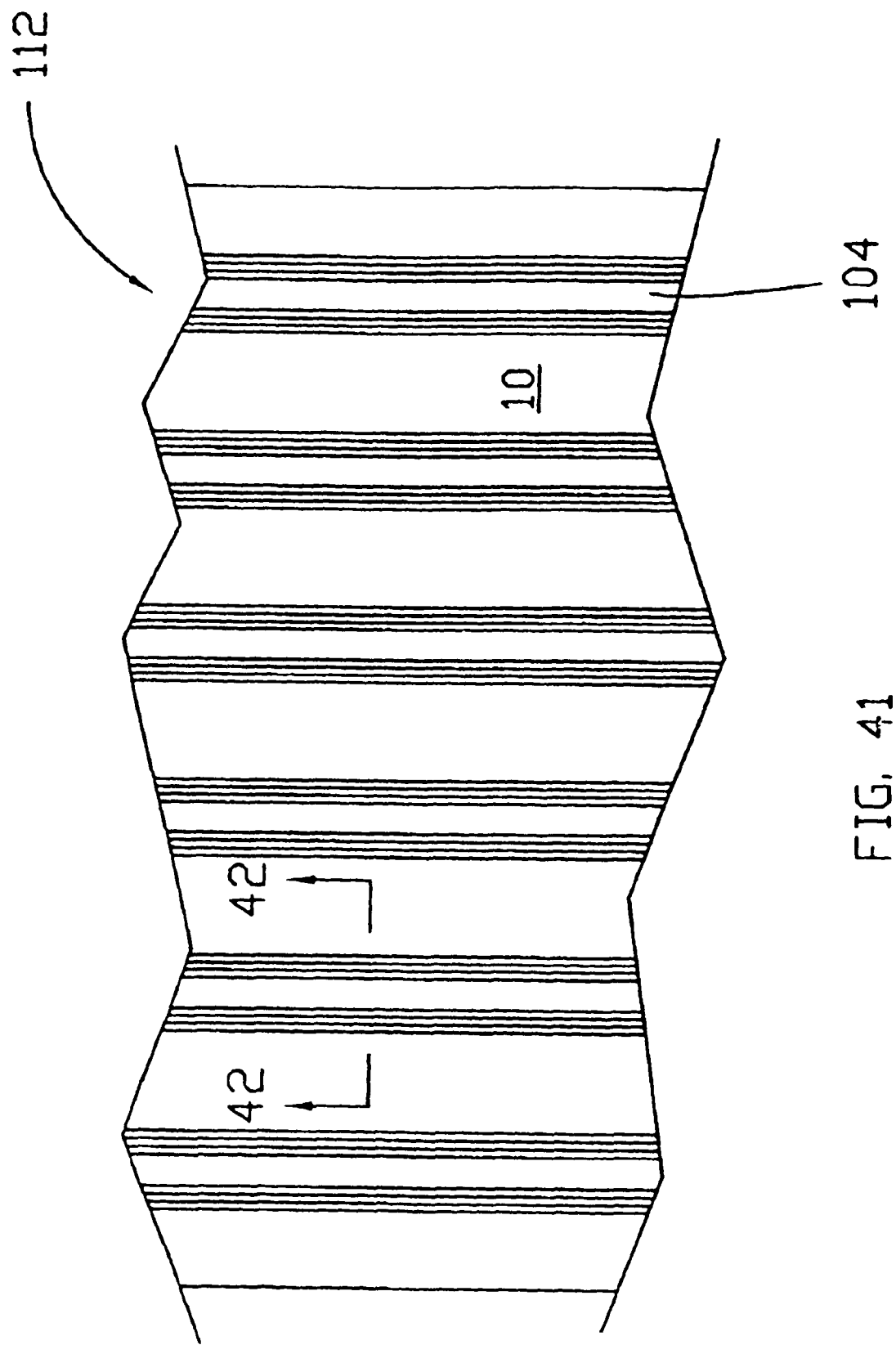
FIG. 41 is a plan view of the structure resulting from the process of FIG. 38.

FIG. 41 is a plan view of the combined structure resulting from joining process 110.

Figure 42A:
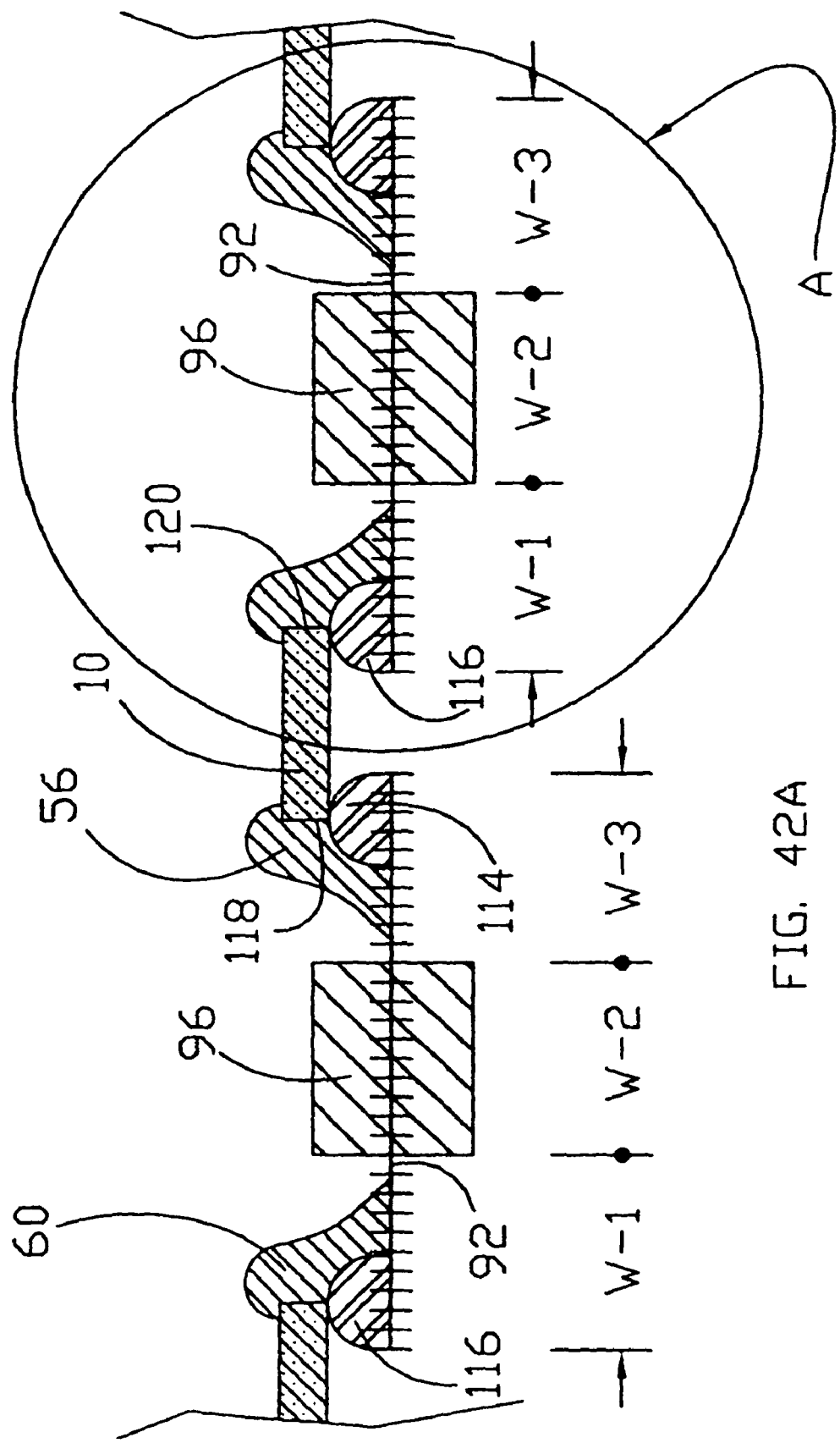
FIG. 42A is an embodiment of the structure of FIG. 41 taken substantially along line 42-42 of FIG. 41.

FIG. 42A is a simplified sectional view taken substantially along line 42-42 of FIG. 41 of the product from process 110 when structure 104 shown in FIG. 37A is employed. Adhesive bead 114 is used to attach a first edge portion 118 of photovoltaic cell structure 10 to portion "W3" of a substrate strip and adhesive bead 116 attaches the second edge portion 120 of cell 10 to portion "W1" of another substrate strip. Insulating beads 56 and 60 protect the first and second terminal edges of photovoltaic cells 10.

Figure 42B:
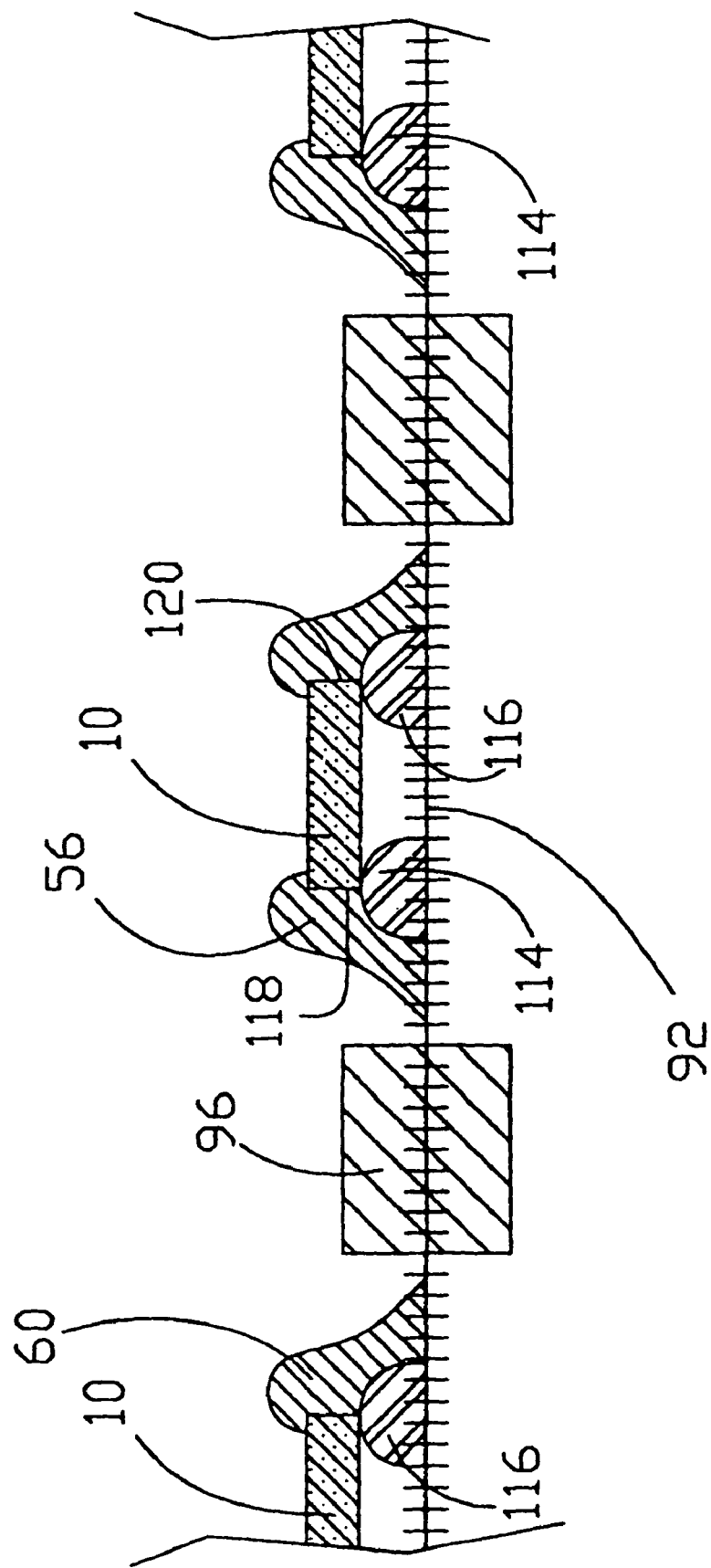
FIGS. 42B and 42C are views similar to 42A showing alternate embodiments of the structure depicted in FIG. 41.

FIG. 42B is a structure similar to 42A but shows that the substrate structure need not be discrete strips but can be joined. This is equivalent to stating the portion "W1" of one strip is joined to portion "W3" of another strip. Maintenance of spacial positioning and mechanical integrity are promoted by the structure depicted in FIG. 42B.

Figure 42C:
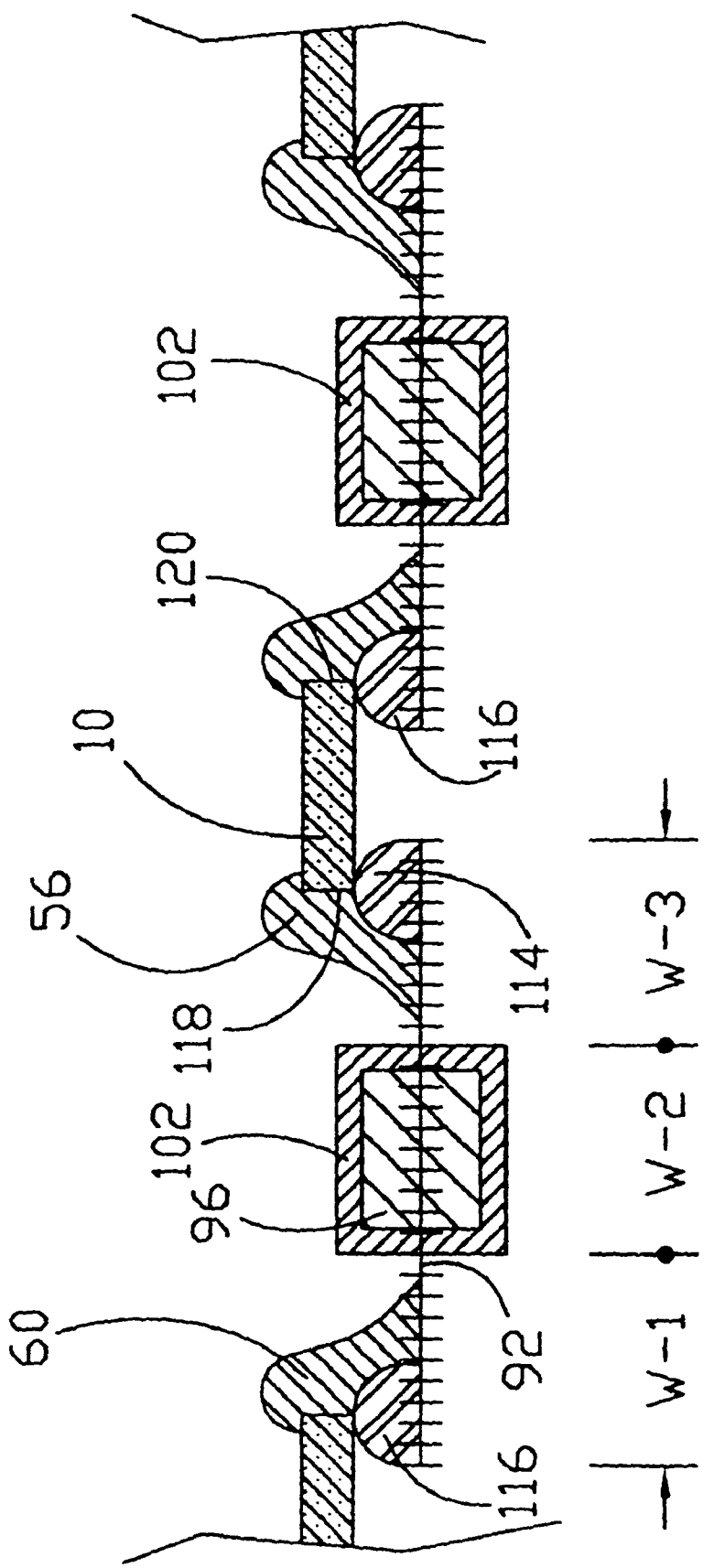

FIG. 42C is a view similar to FIG. 42A but employing the substrate structure 104 shown in FIG. 37B.

Figure 43:
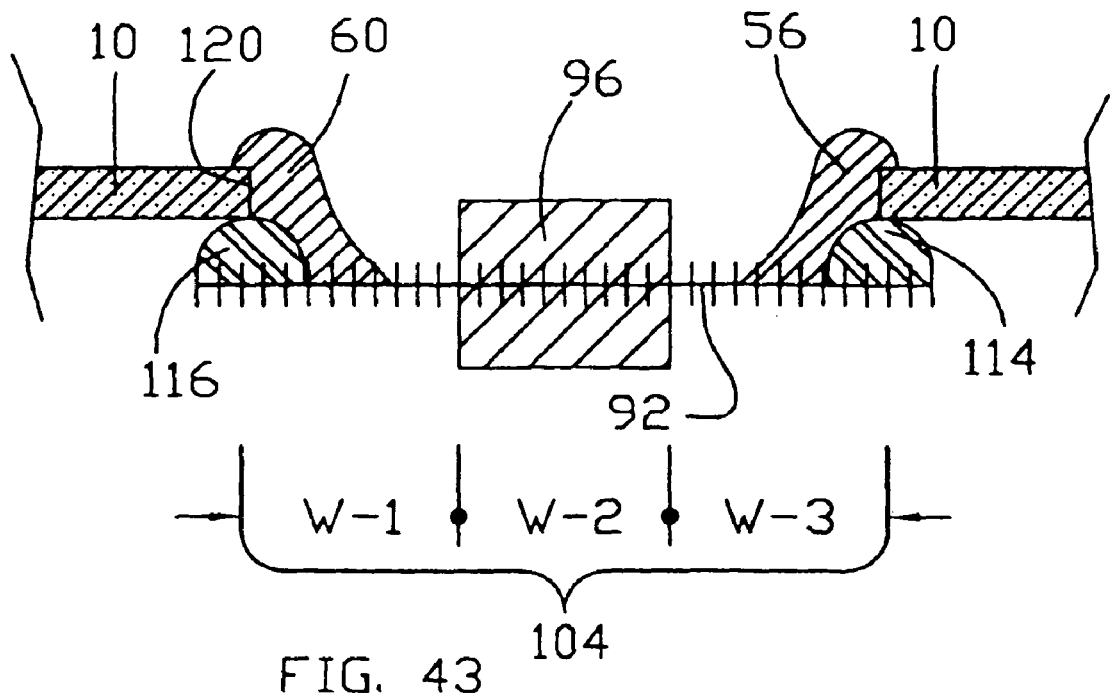
FIG. 43 is an enlarged view of the portion of FIG. 42A shown within circle

FIG. 43 is an enlarged view of the structural portion within circle "A" of FIG. 42A.

Figure 44:
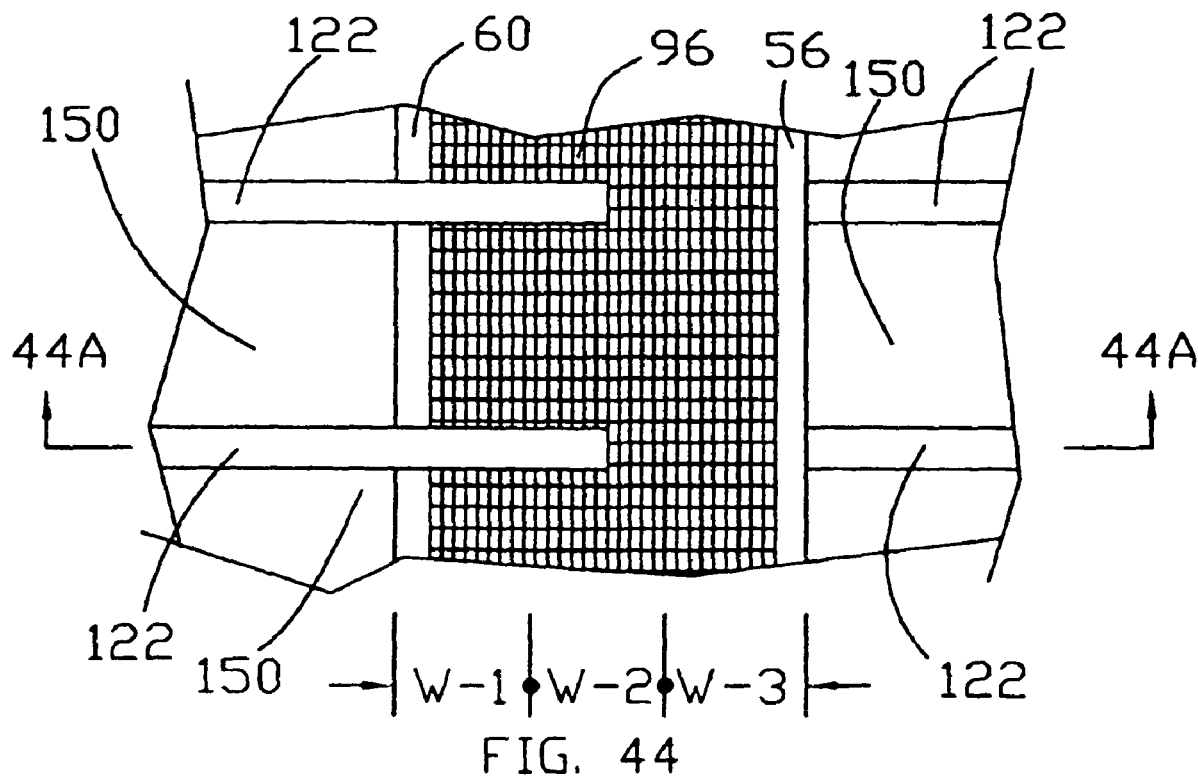
FIG. 44 is a plan view of the structure of FIG. 43 after an additional processing step.
Figure 44A:
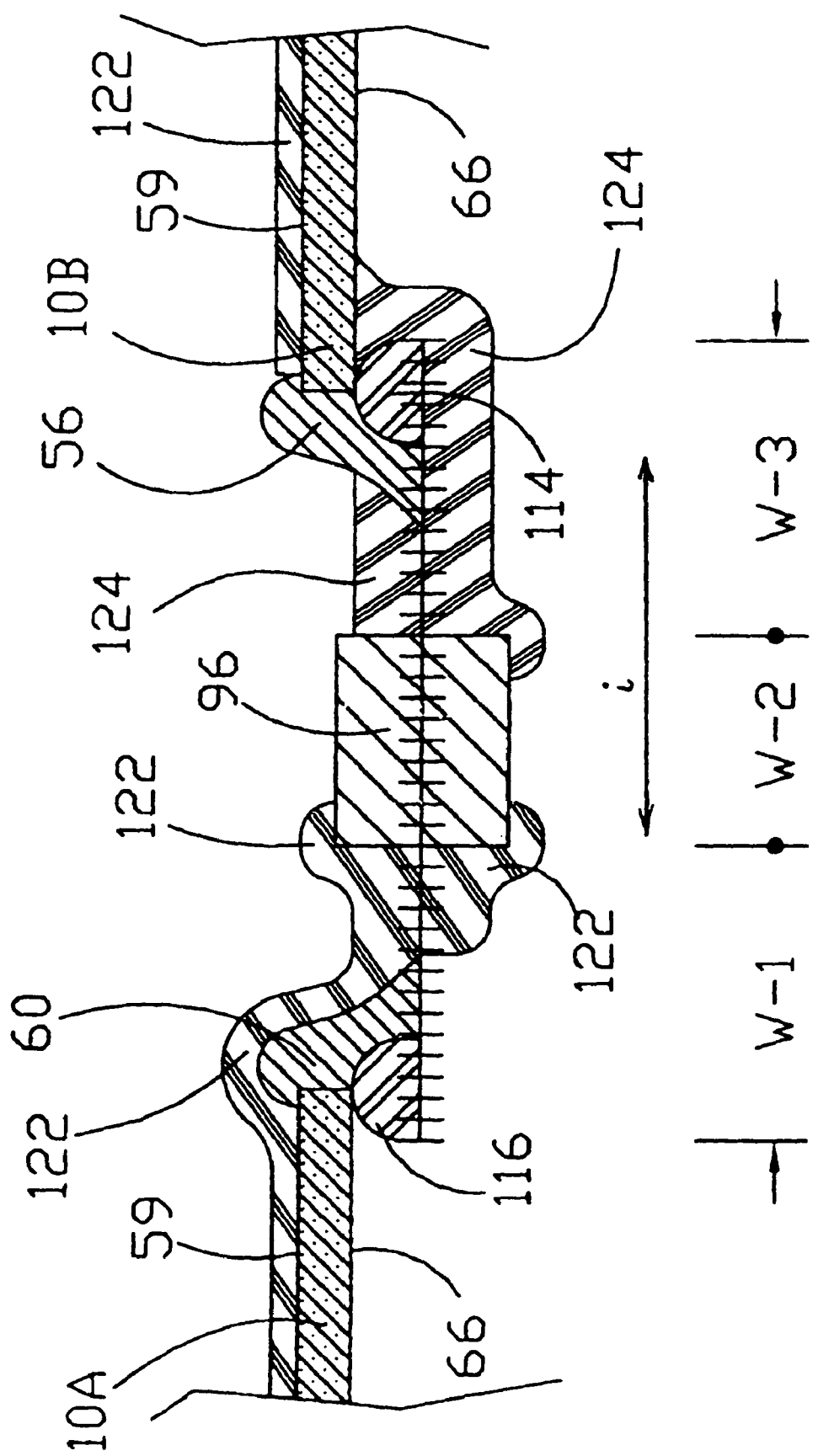
FIG. 44A is a sectional view taken substantially along the line 44A-44A of FIG. 44.

FIG. 44A is a view similar to FIG. 43 but following an additional manufacturing step in preparation of the series connected array. In FIG. 44A an electrically conductive coating 122 extends from the top surface 59 of photovoltaic cell 10A over insulating bead 60 and to electrically conductive region "W2". Coating 122 can comprise a number of electrically conductive media, such as conductive inks or conductive adhesives. Appropriate conductive inks or adhesives can be applied by silk screening, masked printing, or simple extrusion of molten conductive thermoplastic. Alternate forms of applying coating 122 are chemical or vacuum deposition of conductive materials in conjunction with appropriate masking techniques.

As indicated in FIG. 44A, conductive coating 122 extends outward across the surfaces of cells 10A, 10B in the form of grid fingers. These grid fingers obviously do not cover the entire top surface 59 of cell 10, but are positioned in spaced relationship on the surface. This arrangement is best shown by the plan view of FIG. 44.

FIG. 44A also shows an electrically conductive coating 124 extending from the second lower surface 66 of cell 10B and to electrically conductive region "W2": Coating 124 need not be the same composition nor applied by the same process as coating 122.

Figure 45:
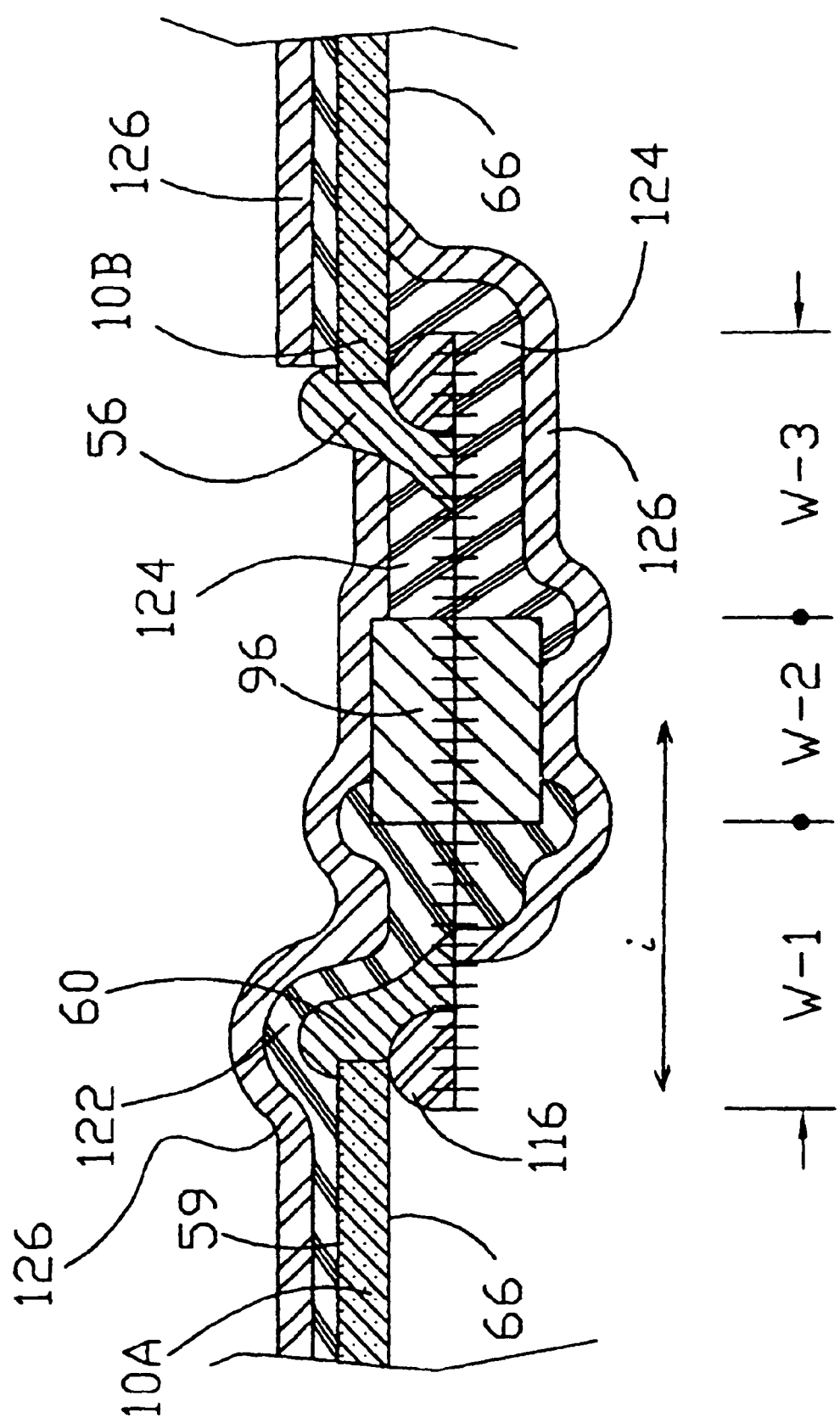
FIG. 45 is a view similar to FIG. 44 after a further processing step.

FIG. 44A shows that electrical communication is established between the top surface 59 of photovoltaic cell 10A and the bottom surface 66 of adjacent photovoltaic cell 10B. However, coatings 122 and 124 may not supply sufficient conductivity, either because coating resistivities are high relative to pure metals or coating thicknesses are small, as would be the case with vacuum or chemical deposited metal coatings. The conductivity of the grid fingers can be further enhanced to minimize resistive power losses by depositing additional metal or metal-based material onto fingers 122. In a preferred embodiment, this additional metal or metal-based material is applied by electrodeposition. This is accomplished by first employing masking techniques to cover those areas of top surface 59 not covered by grid coating 122 with a protective insulating coating. The insulating coating prevents electrodeposition on those areas and also protects the surface from the possible deleterious effects of the electroplating solution. Masking techniques well known in the art are envisioned, and can be as simple a registered pad printing of an insulative organic coating. The plan views of FIG. 44 indicates the location of the insulative masking coating 150. The structure depicted in FIGS. 44 and 44A may be continuously passed through one or more metal electrodeposition baths to result in the structure depicted in the sectional view of FIG. 45. In FIG. 45, the electrodeposited material 126 extends from the top surface 59 of cell 10A to the bottom surface 66 of adjacent cell 10B by virtue of the holes in region "W2". As with other embodiments, the direction of net current flow is shown by the double pointed arrow labeled "I" in FIG. 45. Those skilled in the art will recognize that a similar combination of conductive coating 122 and electrodeposit 126 may be used to produce the grid fingers 58 depicted in FIGS. 20 and 21. In the embodiments depicted in FIGS. 20, 21 and FIG. 45, the fact that the bottom surfaces 66 (FIG. 45) and 28 (FIG. 21) are conductive and exposed facilitate the continuous electrodeposition step by allowing cathodic contacting to these bottom surfaces, exposing the opposite top surfaces to the electroplating baths.

In a preferred embodiment of the grid structure taught above in conjunction with FIGS. 20, 21 and FIG. 45 conductive grid coating 122 comprises a DER. "DERS" are inexpensive, can be formulated to achieve good adhesion and ohmic contact to top surface 59 comprising the transparent conductive oxide (TCO), and achieves good ohmic contact and adhesion to the electrodeposit 126. In essence, the DER functions as a "conductive adhesive" joining the TCO and the electrodeposit 126. Those skilled in the art will recognize that electrodeposit 126, while illustrated as a single layer, may comprise multiple layers.

Figure 49:
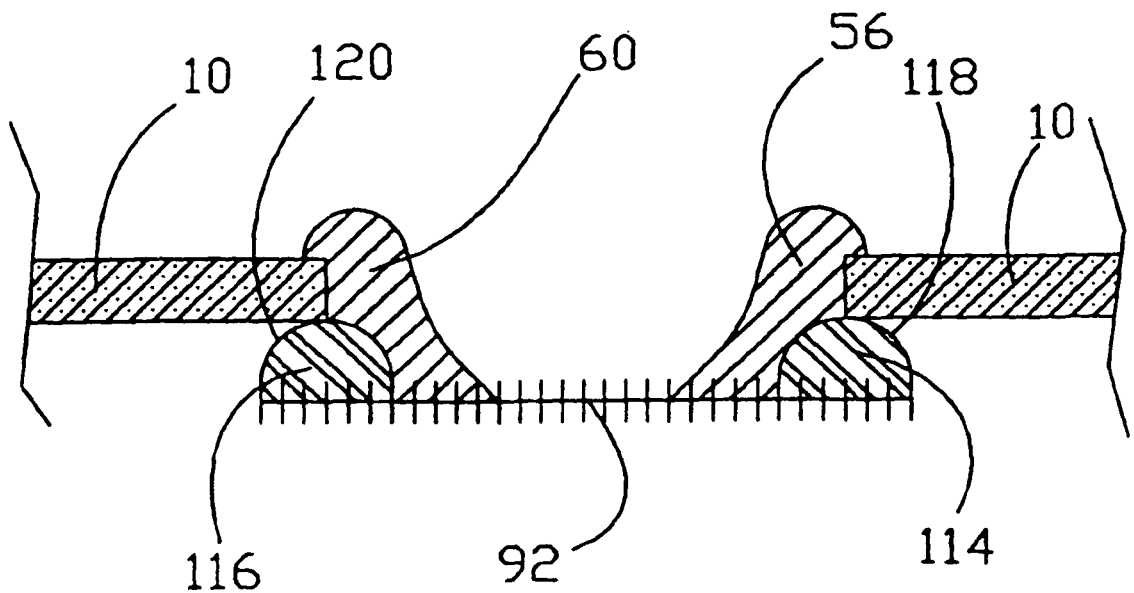
FIG. 49 is a sectional view similar to FIG. 43 illustrating an alternate processing sequence.

FIG. 49 is a sectional view similar to FIG. 43 of an alternative intermediate article resulting from feeding the material of FIGS. 27 through 31 to the process of FIGS. 38 through 40 rather than the joining strips 104 of FIGS. 36 and 37. Here the conductive coating 96 defining region "W2" of FIGS. 36 and 37 has not been applied. However, applying the conductive coating 96 to the FIG. 49 structure at the time of applying conductive coatings 122 and 124 (see discussion of FIG. 44A), results in converting the FIG. 49 structure into one equivalent to that shown in FIG. 44A.

Figure 46:
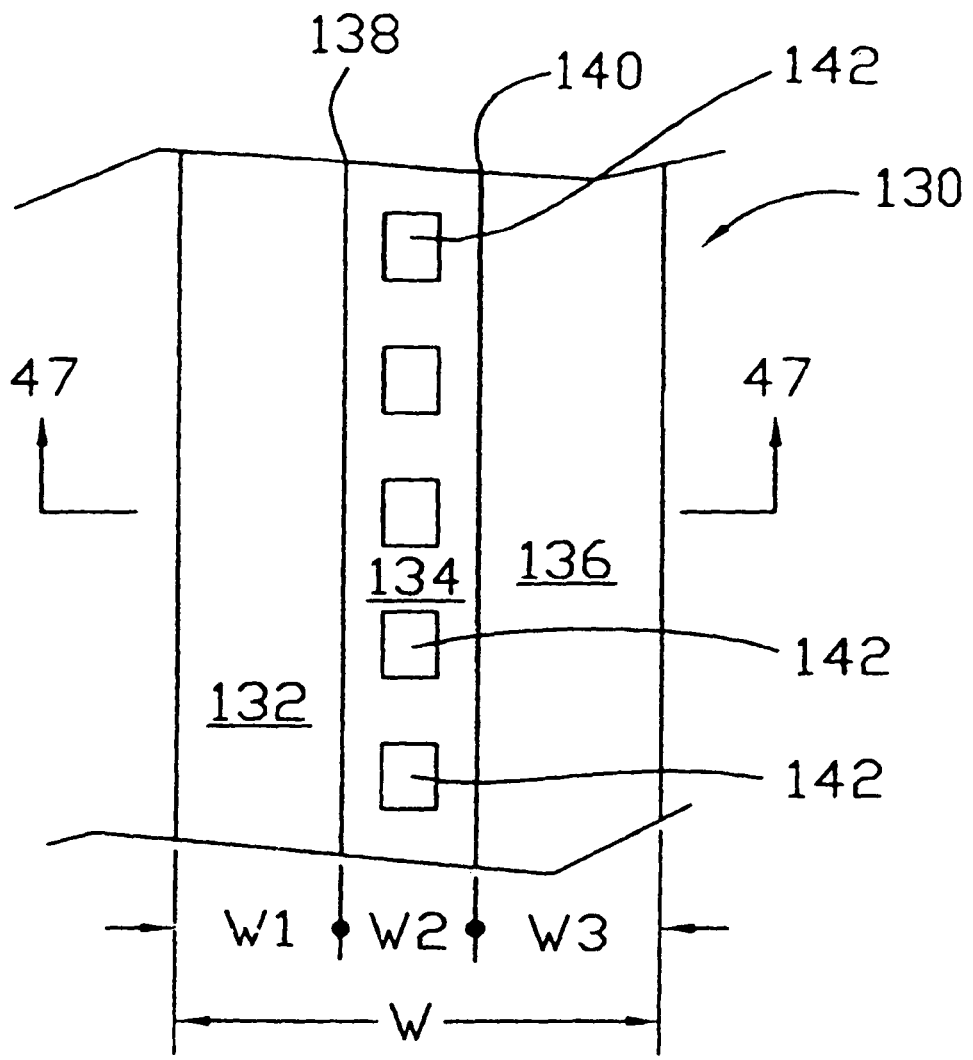
FIG. 46 is a top plan view of another embodiment of the novel substrate structures useful in the manufacture of series interconnected photovoltaic arrays.

FIG. 46 shows yet another embodiment of the current disclosure: The plan view of 46 illustrates a polymer based sheet 130 of width "W" subdivided into three areas "W1", "W2", and "W3" in fashion similar to that of FIG. 32. Polymer based sheet 130 can be conveniently formed by coextrusion of materials 132, 134, and 136, corresponding to regions "W1", "W2", and "W3" respectively. Materials 132, 134, and 136 can be all based on the same polymer or different polymers can be chosen. It is important however that proper joining integrity be established at mating interfaces 138 and 140.

The material 134 chosen for region "W2" is an electrically conductive polymer. A particularly advantageous resin is a DER.

Figure 47:
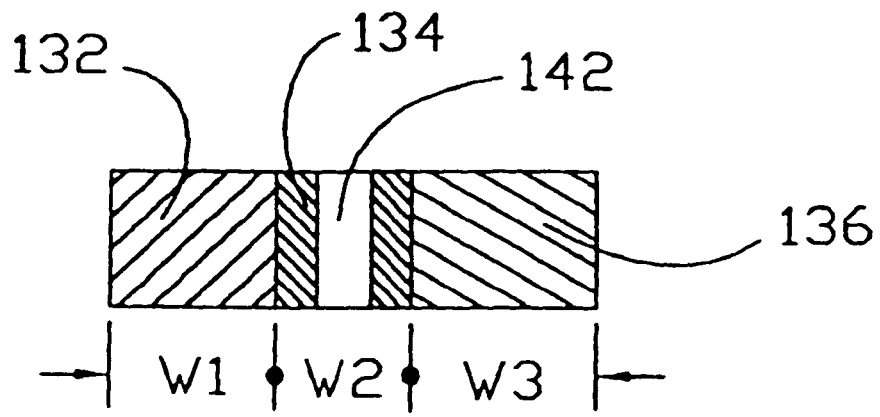
FIG. 47 is a sectional view taken substantially along line 47-47 of FIG. 46.

FIG. 47 is a sectional view taken substantially along line 47-47 of FIG. 46. As shown in FIGS. 46 and 47, region "W2" is caused to have holes 142 along its length. In the simplest conceptual-case, these holes are simply punched in the region "W2". Another approach would be to formulate the region "W2" of FIGS. 46 and 47 from a fabric (non-woven or woven) of electrically conductive polymer.

Figure 48:
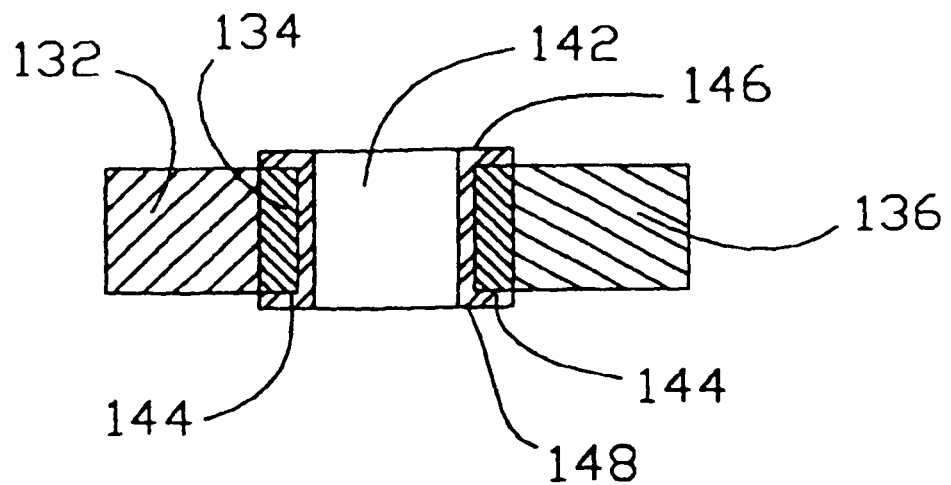
FIG. 48 is a view similar to FIG. 47 following an additional processing step.

FIG. 48 shows the structure of FIG. 47 following an additional processing step of depositing metal 144 through holes 142 to establish high electrical conductivity from top surface 146 to bottom surface 148. Preferably this metal deposition is by electroplating although chemical and vapor deposition techniques could be used.

In many respects the structures shown in FIGS. 47 and 48 resemble the structures depicted in FIGS. 37a and 37b respectively. Thus the use of the structures of FIGS. 47 and 48 in the process of FIGS. 38 through 40 would give results similar to those previously taught as one skilled in the art will recognize.

It is important to recognize that the unique design and process taught by the present invention is accomplished in a fully additive fashion. No wasteful and costly material removal steps are needed to achieve the integrated series connected arrays taught. This is a significant advantage over the prior art.

Despite the relative simplicity envisioned for production of the current collector grid/interconnect structures using the combination "conductive coating plus electrodeposition" approach taught above in conjunction with FIGS. 20, 21 and FIGS. 44, 44A and 45, it can be contemplated that separate production of the grid/interconnect array followed by subsequent application to a geometrically registered arrangement of photovoltaic cells may be employed to advantage. This concept would avoid the masking and possible exposure of the photovoltaic cells to the wet electrochemistry involved in the approaches taught above in conjunction with FIGS. 20, 21 and 44, 44A and 45. Thus, a further embodiment of the grid structure, design and fabrication process is taught below in conjunction with FIGS. 50 through 66.

Figure 50:
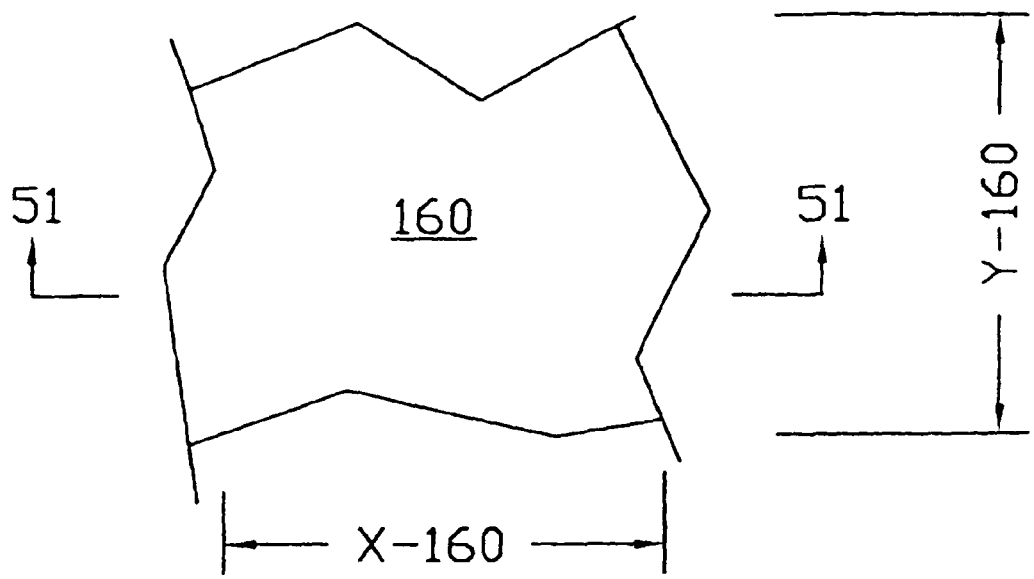
FIG. 50 is a top plan view of a starting component of an additional embodiment of the invention.
Figure 51:
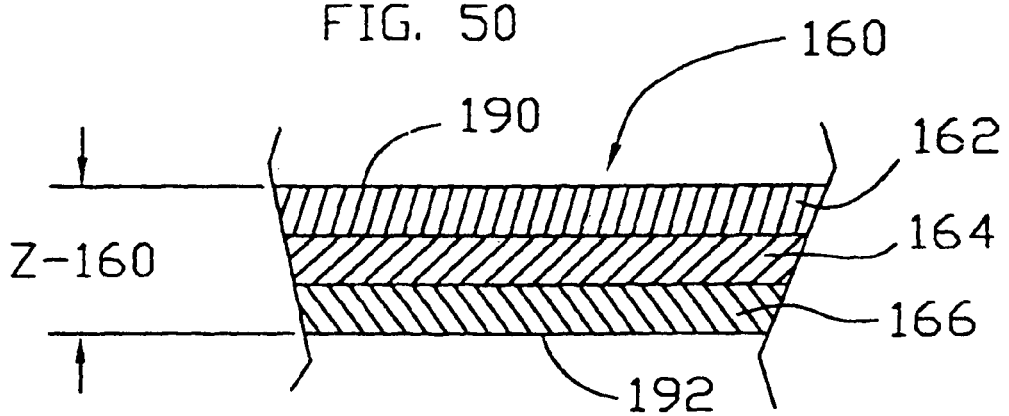
FIG. 51 is a sectional view taken along line 51-51 of FIG. 50.

FIG. 50 is a plan view of a polymeric film or glass substrate 160. Substrate 160 has width X-160 and length Y-160. In one embodiment, taught in detail below, Y-160 is much greater than width X-160, whereby film 160 can generally be described as "continuous" in length and able to be processed in length Y-160 in a continuous roll-to-roll fashion. FIG. 51 is a sectional view taken substantially from the view 51-51 of FIG. 50. Thickness dimension Z-160 is small in comparison to dimensions Y-160, X-160 and thus substrate 160 has a sheetlike structure. As shown in FIG. 51, substrate 160 may be a laminate of multiple layers 162, 164, 166 etc. or may comprise a single layer of material. The multiple layers 162, 164, 166 etc. may comprise inorganic or organic components such as thermoplastics or silicon containing glass-like layers. The various layers are intended to supply functional attributes such as environmental barrier protection or adhesive characteristics. Such functional layering is well-known and widely practiced in the plastic packaging art. Sheetlike substrate 160 has first surface 190 and second surface 192.

Figure 52:
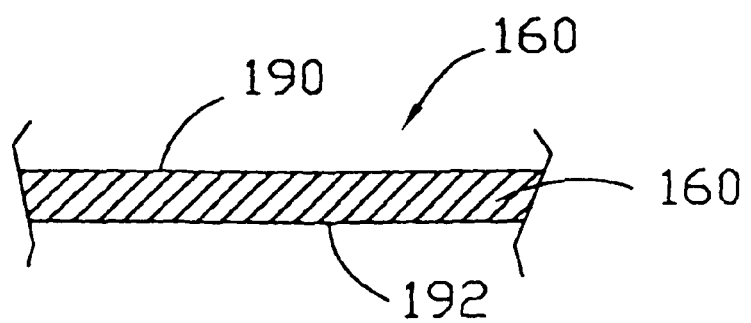
FIG. 52 is a simplified representation of the sectional view of FIG. 51.

FIG. 52 depicts the structure 160 (possibly laminate) as a single layer for purposes of presentation simplicity. Substrate 160 will be represented as this single layer in the subsequent embodiments.

Figure 53:
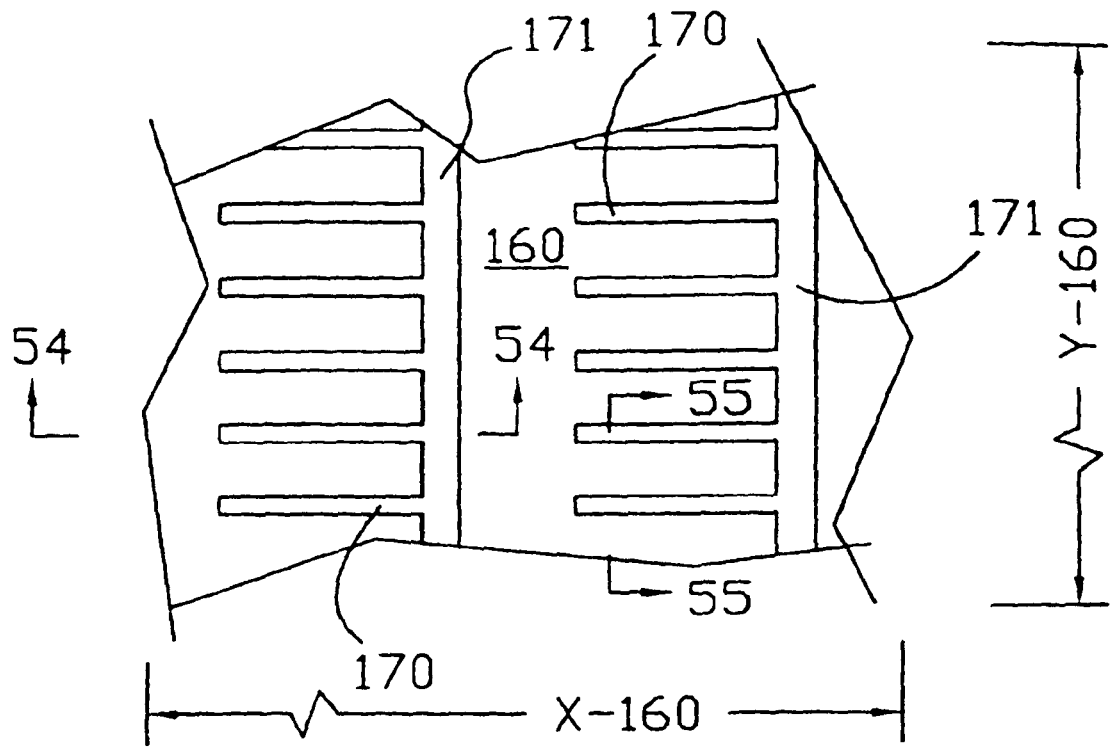
FIG. 53 is a top plan view of the embodiment of FIGS. 50 through 52 following an additional processing step.
Figure 54:
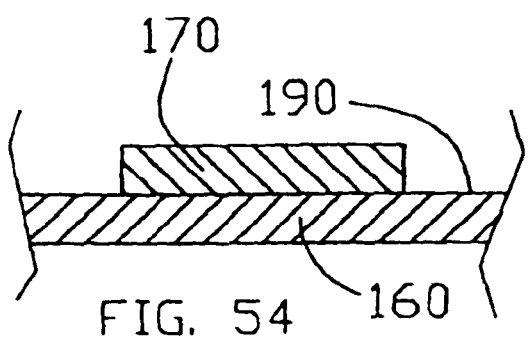
FIG. 54 is a sectional view taken along the line 54-54 of FIG. 53.

FIG. 53 is a plan view of the structure following an additional manufacturing step, and FIG. 54 is a sectional view taken along line 54-54 of FIG. 53.

Figure 55:
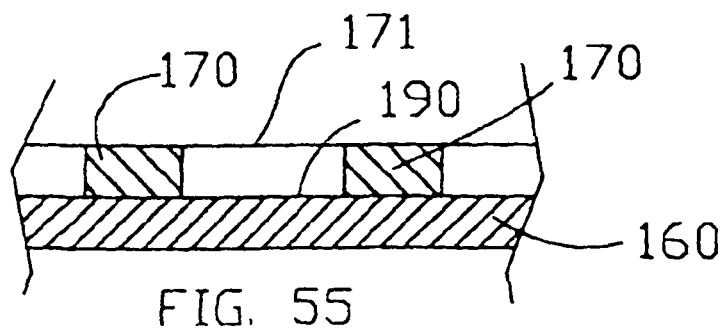
FIG. 55 is a sectional view taken along the line 55-55 of FIG. 53.

FIG. 55 is a sectional view taken along line 55-55 of FIG. 53. In FIGS. 53 through 55, it is seen that a pattern of "fingers", designated 170, extends from "buss" structures, designated 171. Both "fingers" 170 and "busses" 171 are deposited on and supported by substrate 160. While shown as a single layer, "fingers" 170 and "busses" 171 may comprise multiple layers. "Fingers" 170 and "busses" 171 may comprise electrically conductive material, or may comprise non-conductive material which would assist accomplishing a subsequent deposition of conductive material. For example, "fingers" 170 or "busses" 171 could comprise a seeded polymer which would catalyze chemical deposition of a metal in a subsequent step. A second example would be materials selected to promote adhesion of a subsequently applied conductive material. "Fingers" 170 and "busses" 171 may differ in actual composition.

Figure 56:
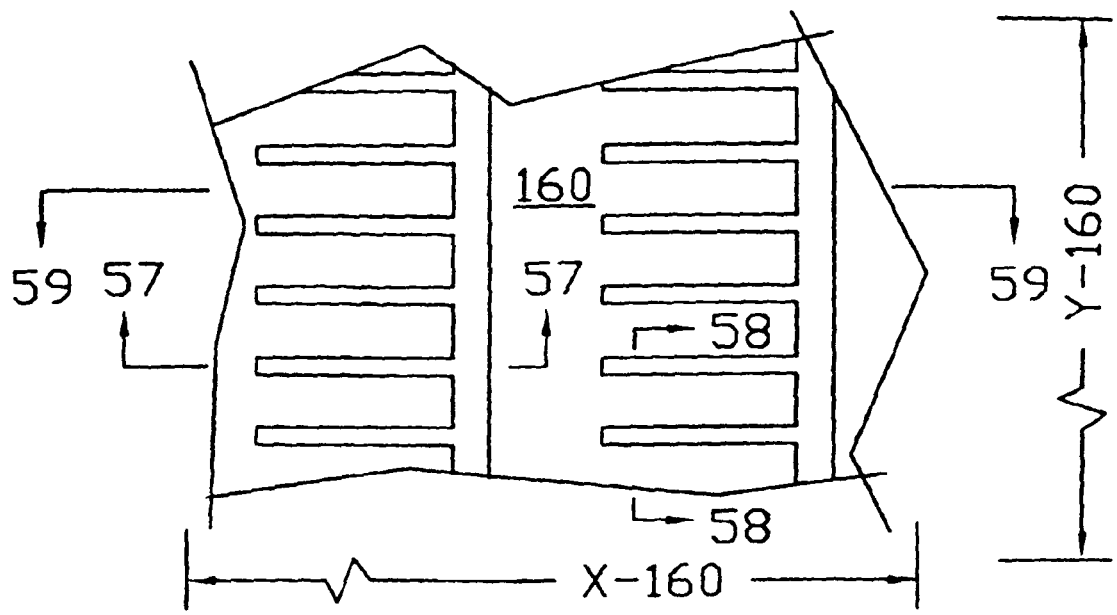
FIG. 56 is a top plan view of embodiment of FIGS. 53 through 55 after an additional processing step.
Figure 57:
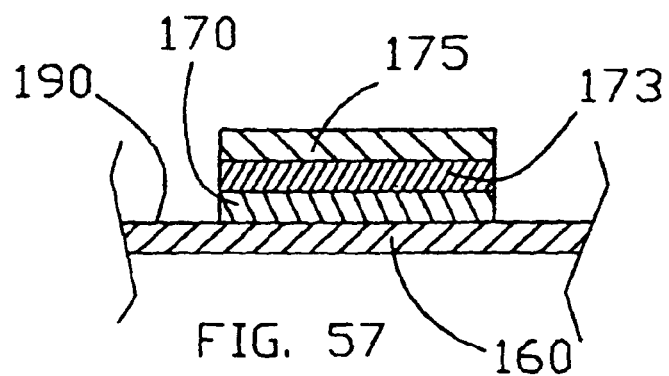
FIG. 57 is a sectional view taken along line 57-57 of FIG. 56.
Figure 58:
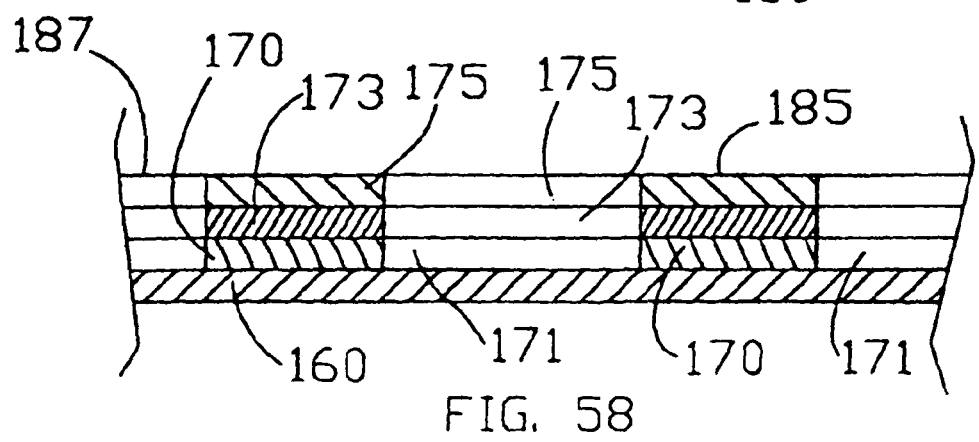
FIG. 58 is a sectional view taken along line 58-58 of FIG. 56.
Figure 59:
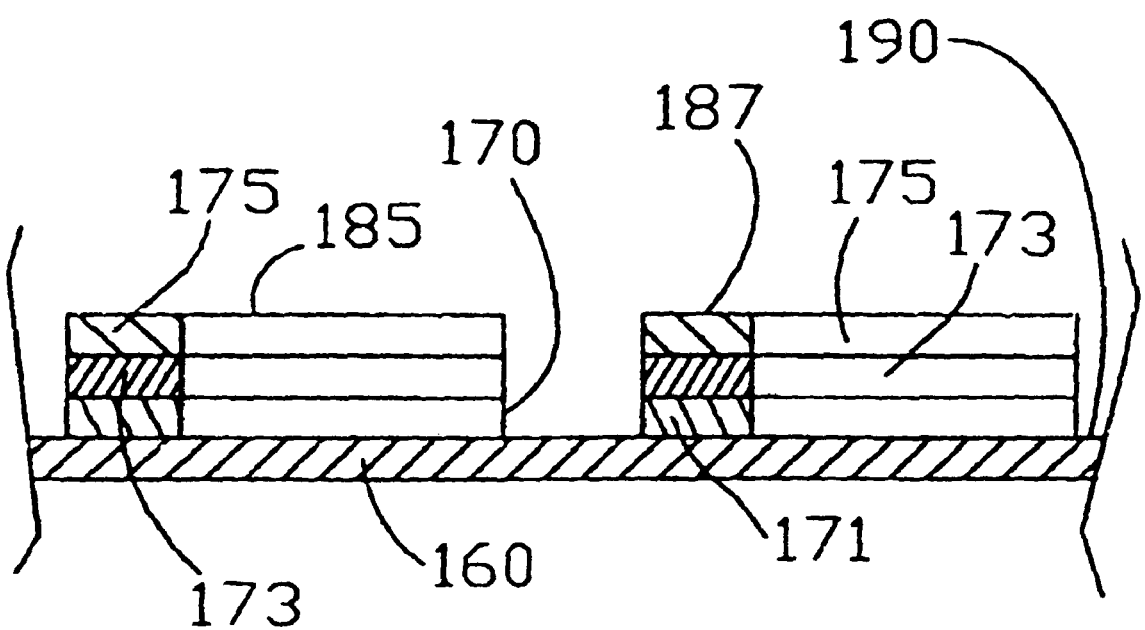
FIG. 59 is a sectional view taken along line 59-59 of FIG. 56.

FIGS. 56, 57 and 58 correspond to the views of FIGS. 53, 54 and 55 following an additional processing step. FIG. 59 is a sectional view taken substantially along line 59-59 of FIG. 56. FIGS. 56 through 59 show additional conductive material deposited onto the "fingers" and "busses" of FIGS. 53 through 55. This additional conductive material is designated by layers 173, 175. While shown as multiple layers 173, 175, it is understood that this conductive material could be a single layer. As best shown in FIG. 58, "fingers" 170 have top free surface 185 and "busses" 171 have top free surface 187. In a preferred embodiment, additional layers 173, 175 etc. are deposited by electrodeposition, taking advantage of the deposition speed, low cost and selectivity of the electrodeposition process. Alternatively, these additional metal-based layers may be deposited by selective chemical deposition or registered masked vapor deposition. Metal-filled conductive resins may also be used to form these additional layers 173, 175.

Figure 60:
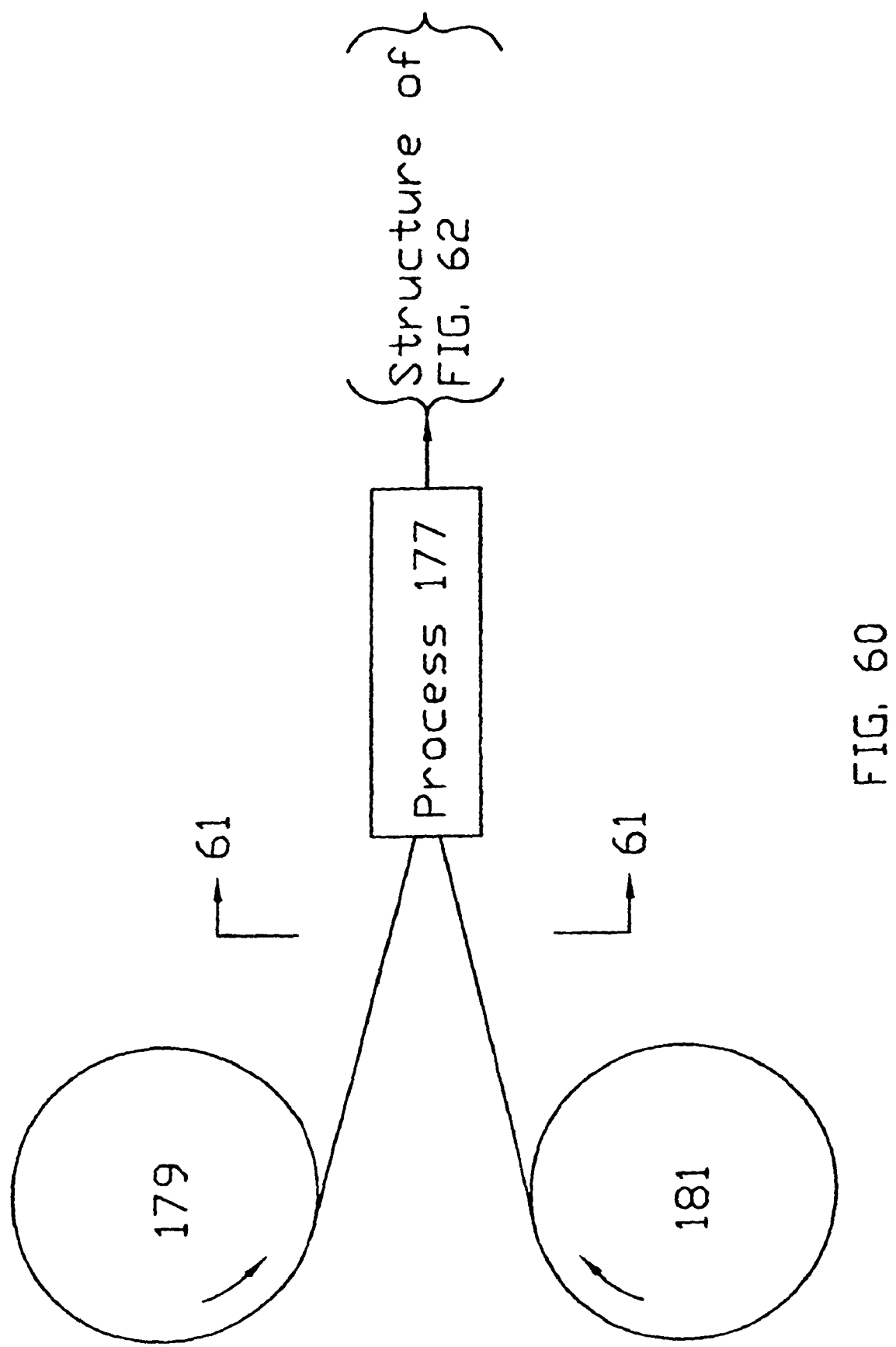
FIG. 60 is a simplified representation of a process used in the manufacture of an embodiment of the invention.
Figure 61:
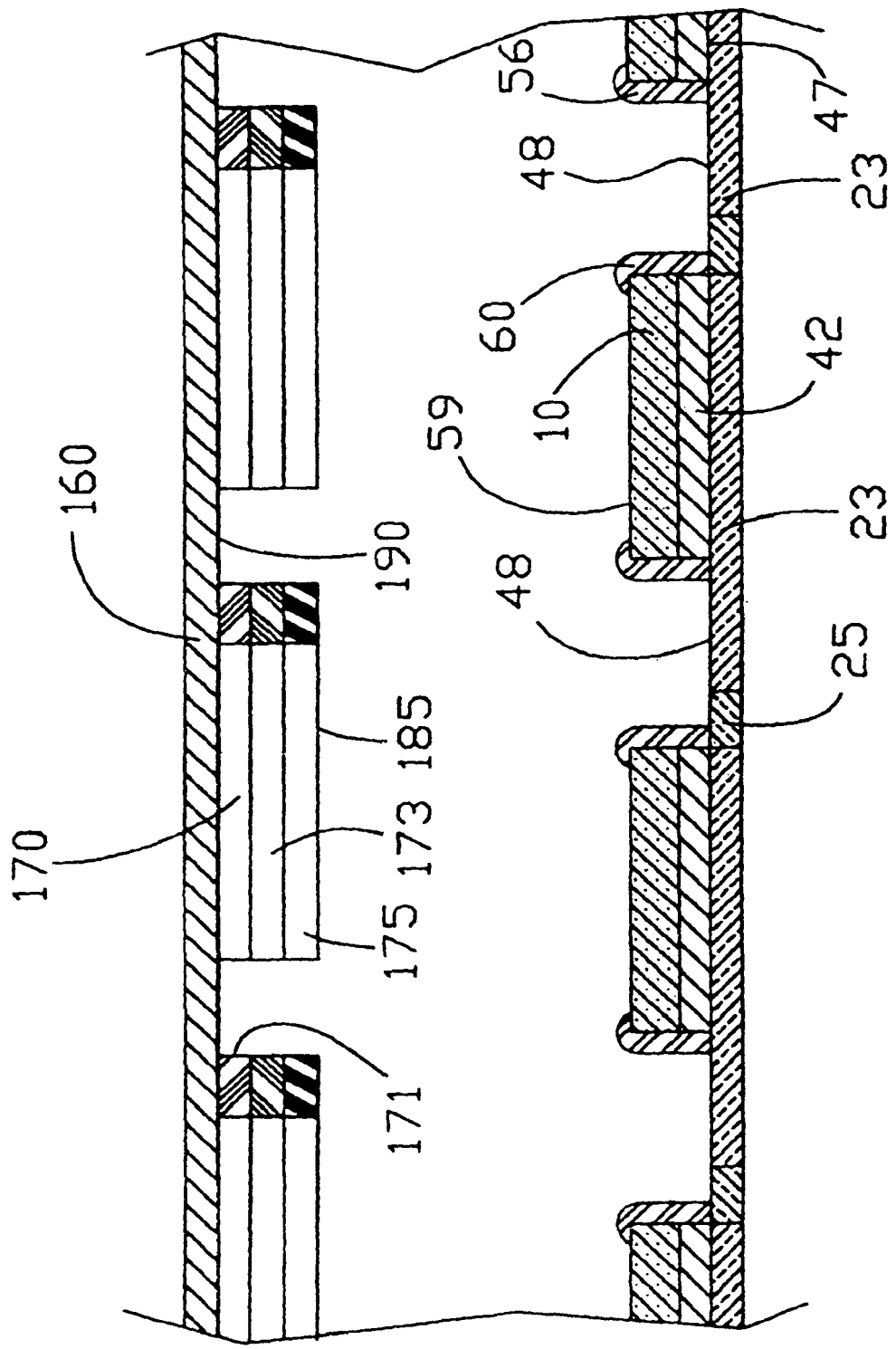
FIG. 61 is a sectional view taken along the line 61-61 of FIG. 60 using the structures of FIGS. 19 and 59.

FIGS. 60 through 63 illustrate a process 177 by which the interconnection component of FIGS. 56 through 59 is combined with the structure illustrated in FIG. 19 to accomplish series interconnections among geometrically spaced cells. In FIG. 60 roll 179 represents a "continuous" feed roll of the grid/buss structure on the sheetlike substrate as depicted in FIGS. 56 through 59. Roll 181 represents a "continuous" feed roll of the sheetlike geometrical arrangement of cells depicted in FIG. 19. As indicated in FIGS. 60 through 63, process 177 laminates these two sheetlike structures together in a spacial arrangement wherein the grid "fingers" project laterally across the top surface 59 of cells 10 and the "finger/buss" structure extends to the top contact surface 48 of an adjacent cell. As with prior embodiments, the double pointed arrow labeled "i" indicates the direction of net current flow in the embodiments of FIGS. 62 and 63.

Figure 62:
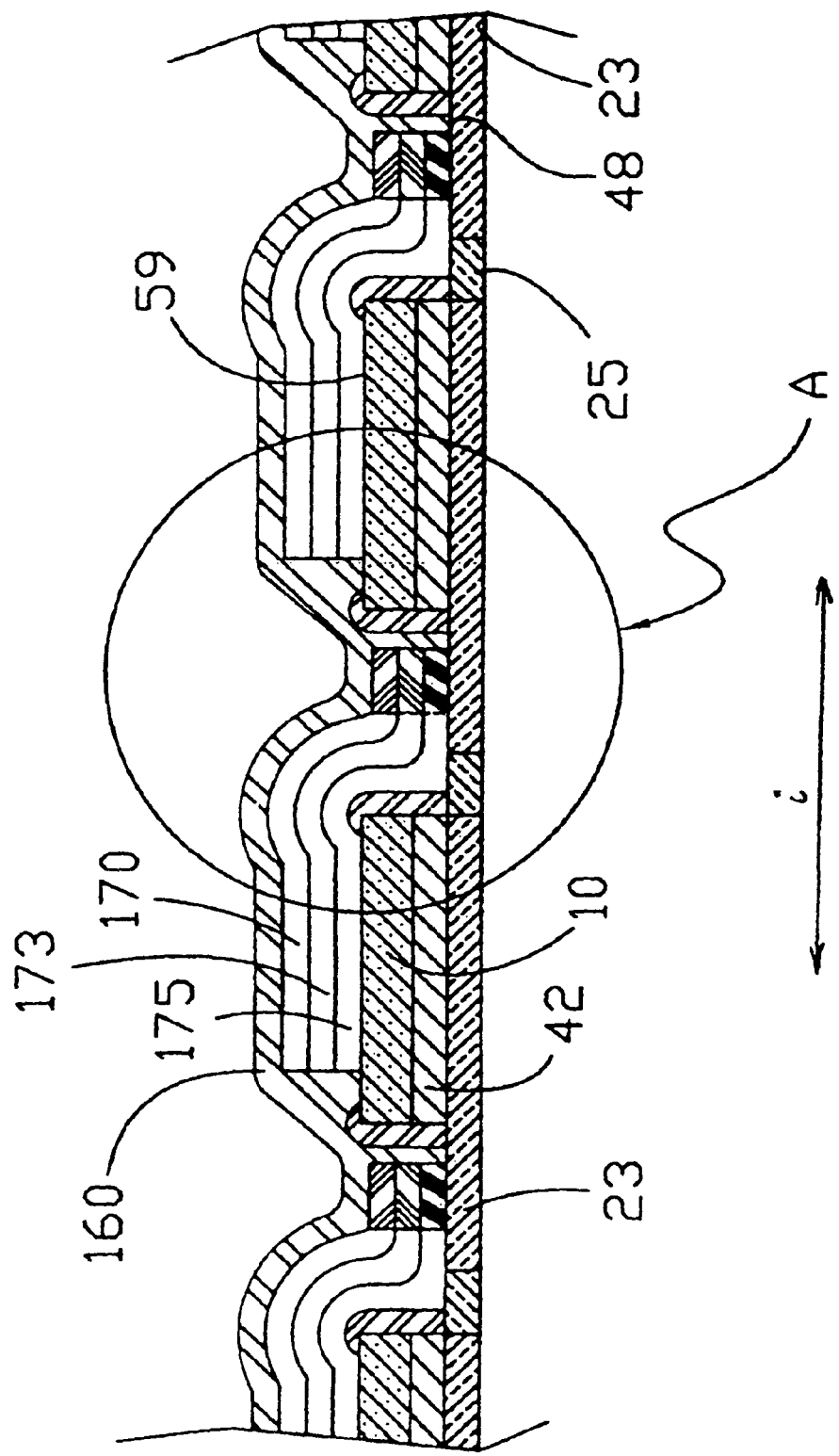
FIG. 62 is a sectional view showing a lamination resulting from the process of FIG. 60.
Figure 63:
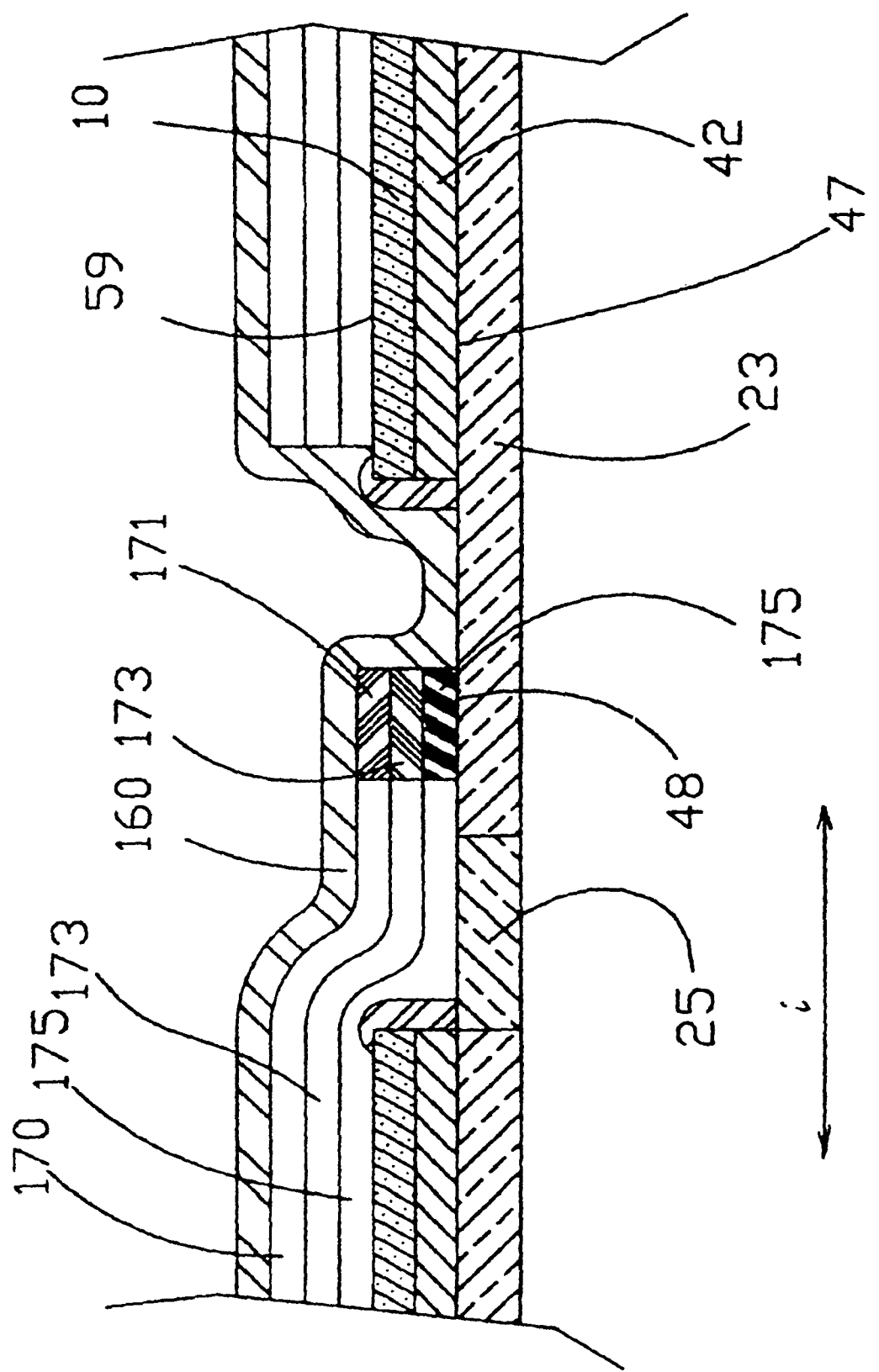
FIG. 63 is an enlarged sectional view of the portion of FIG. 62 within Circle "A" of FIG. 62.

The actual interconnection between adjacent cells is depicted in greatly magnified form in FIG. 63, magnifying the encircled region "A" of FIG. 62. In the embodiments of FIGS. 62 and 63, "buss" structure (171, 173, 175) is shown to extend in the "continuous" Y direction of the laminated structure (direction normal to the paper). It will be appreciated by those skilled in the art that the only electrical requirement to achieve proper interconnection of the cells is that the grid "fingers" extend to the contact surface 48 of an adjacent cell. However, in those cases where the grid fingers comprise an electrodeposit, inclusion of the "busses" provides a convenient way to pass electrical current by providing a continuous path from the rectified current source to the individual grid "fingers". This facilitates the initial electrodeposition of layers 173, 175 etc. onto the originally deposited materials 170, 171. Those skilled in the art will recognize that if the grid "fingers" comprise material deposited by selective chemical, masked vapor deposition or printing, the grid "fingers" could constitute individual islands and the "buss" structure could be eliminated.

Those skilled in the art will recognize that contact between the top surface 59 of the cell and the mating surface 185 of the grid finger will be achieved by ensuring good adhesion between first surface 190 of sheet 160 and the top surface 59 of the cell in those regions where surface 190 is not covered by the grid. However, electrical contact between grid "fingers" 170 and cell surface 59 can be further enhanced by selectively printing a conductive adhesive onto "fingers" 170 prior to the lamination process taught in conjunction with FIGS. 60 and 61. In this way surface 185 is formed by a conductive adhesive resulting in secure adhesive and electrical joining of grid "fingers" 170 to top surface 59 following the lamination process.

Alternatively, one may employ a low melting point metal-based material as a constituent of the material forming surface 185. In this case the low melting point metal-based material is caused to melt during the process 177 of FIG. 60 thereby increasing the contact area between the mating surfaces 185 and 59. In a preferred embodiment indium or indium containing alloys are chosen as the low melting point contact material at surface 185. Indium melts at a low temperature, considerably below possible lamination temperatures. In addition, Indium is known to bond to glass and ceramic materials when melted in contact with them. Given sufficient lamination pressures, only a very thin layer of Indium would be required to take advantage of this bonding ability.

Bonding to the contact surface 48 of conductive sheet 23 can be accomplished by any number of the electrical joining techniques mentioned above. These include electrically conductive adhesives, solder, and melting of suitable metals or metal-base alloys during the heat and pressure exposure of the process 177 of FIG. 60. As with the discussion above concerning contact of the "fingers", selecting low melting point metal-based materials as constituents forming surface 187 could aid in achieving good ohmic contact and adhesive bonding of "busses" 171 to the contact surface 48 of sheet 23.

Figure 64:
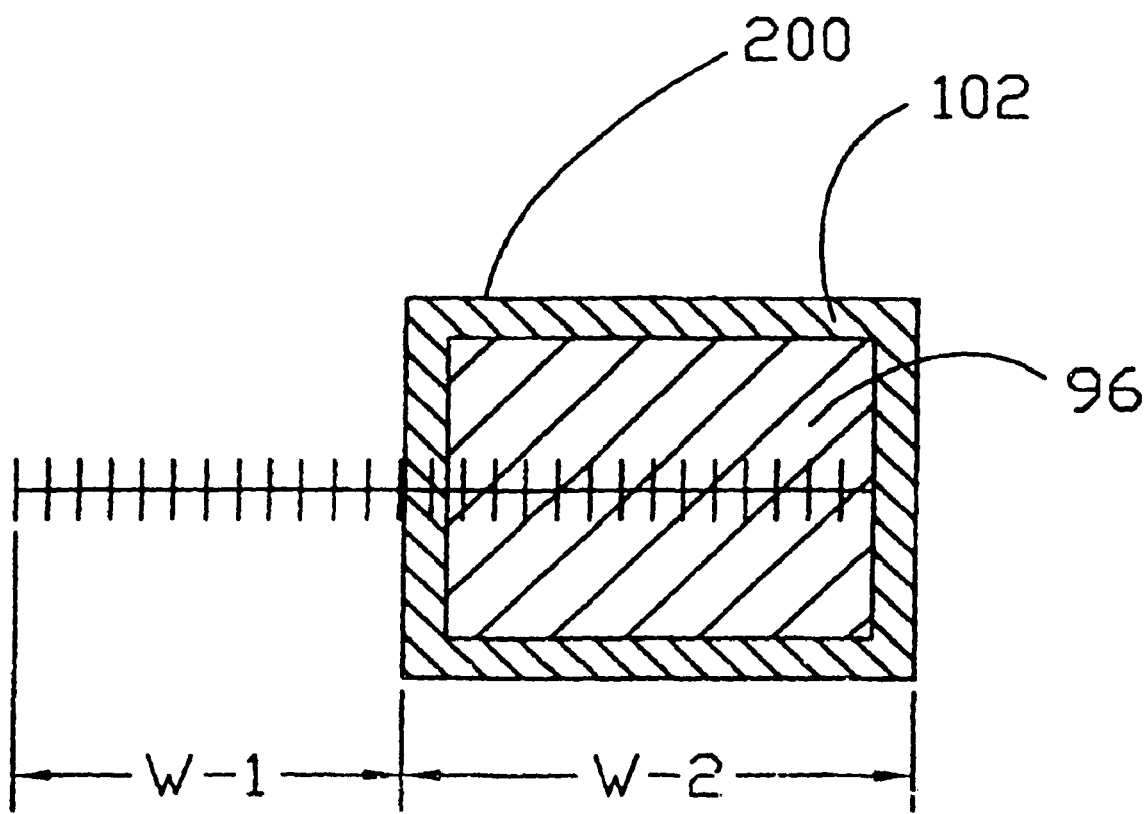
FIG. 64 is a simplified sectional view of a starting substrate component for an additional embodiment of the invention.
Figure 65:
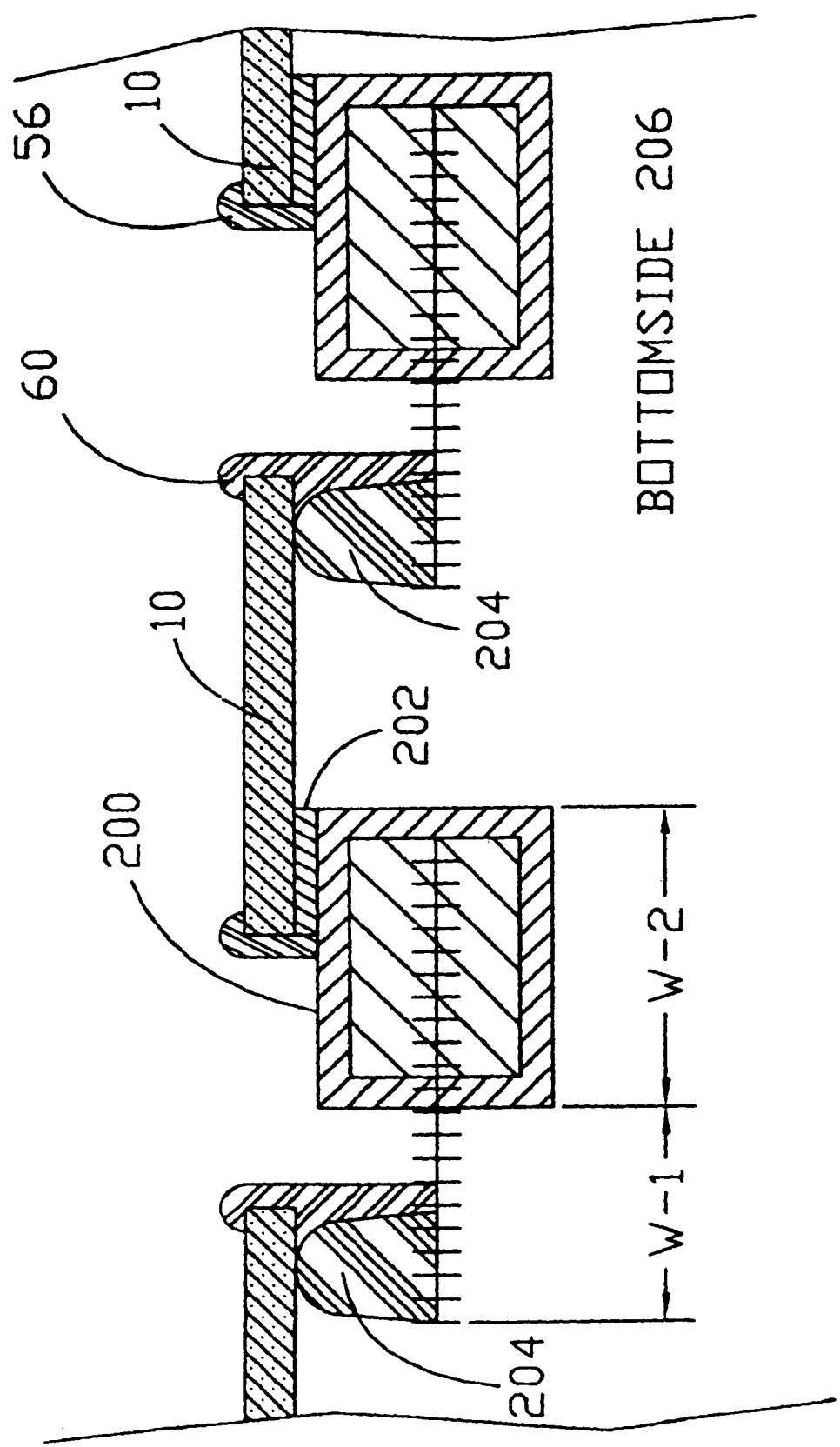
FIG. 65 is a sectional view of the FIG. 64 components following additional processing steps.
Figure 66:
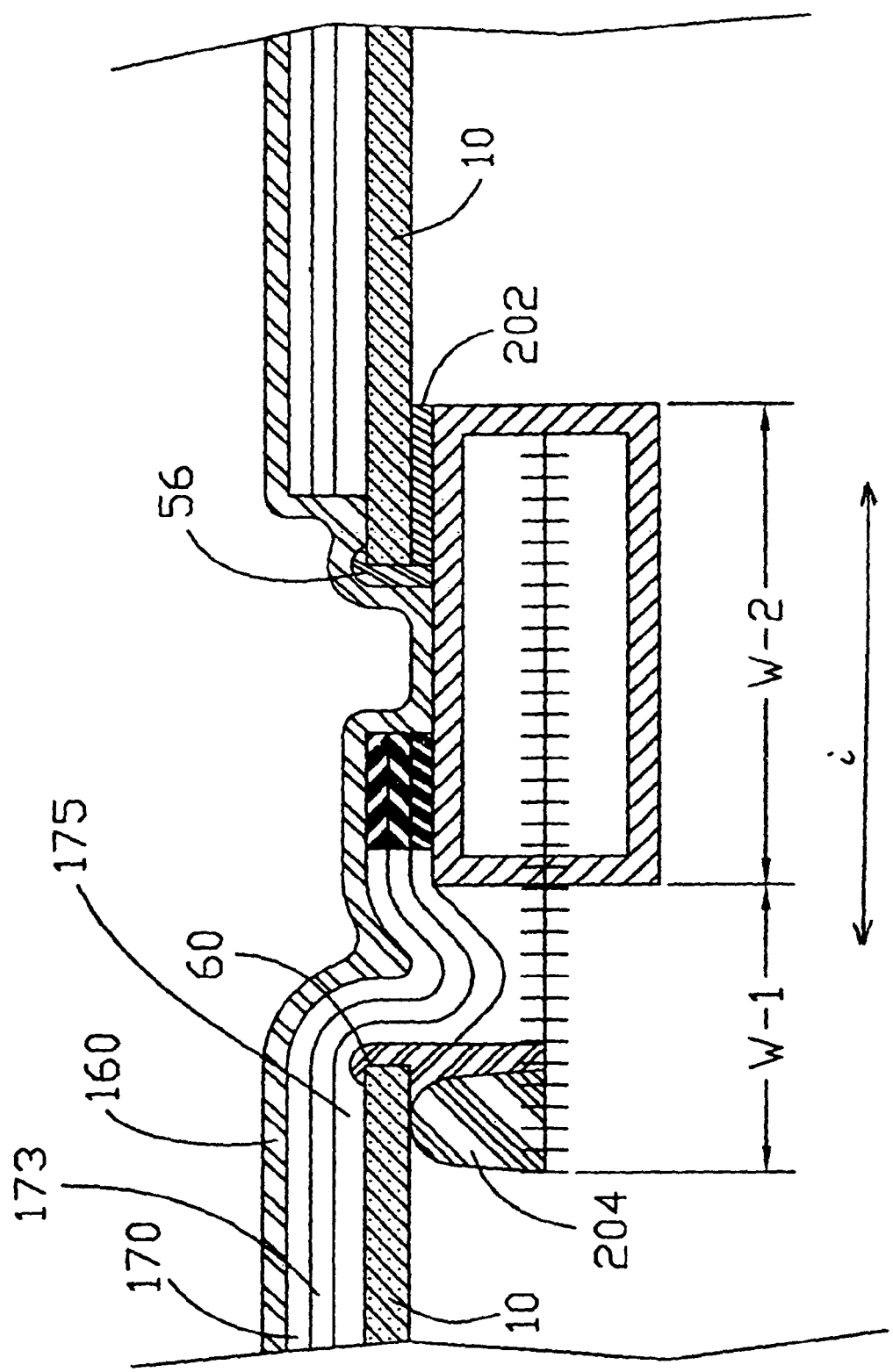
FIG. 66 is a sectional view of the structure resulting from combining the structures shown in FIGS. 56 and 65 using the process illustrated in FIG. 60.

FIGS. 64 through 66 show the result of the FIG. 60 process using a substrate structure similar to that illustrated in FIG. 37B, except that the portion "W-3" shown in FIG. 37B is omitted. FIG. 65 shows photovoltaic cells 10 spacially arranged using the substrate structure of FIG. 64. Conductive joining means 202 connect cells 10 to portions of top surface 200 of conductive regions W-2. Insulating beads 56, 60 protect the edges of cells 10. Adhesive 204 attaches cell 10 to the non-conductive region W-1 of the substrate. The structure depicted in FIG. 65 is similar in electrical and spacial respects to the structure depicted in FIG. 19. Substituting the structure of FIG. 65 for the FIG. 19 structure shown in the prior embodiments of FIGS. 60 through 63 results in the structure shown in the sectional view of FIG. 66. In this case the through-holes associated with the FIG. 64 substrate structures may assist in the lamination process by permitting a reduced pressure on the bottom side 206 of the sheetlike structures (FIG. 65) thereby promoting removal of air from between the sheetlike structures of FIGS. 56 through 59 and the sheetlike structure of FIG. 65 just prior to lamination.

The sectional views of FIGS. 63 and 66 embody application of the invention to the substrate structures taught in FIGS. 7 and 64 respectively. It is understood that similar results would be achieved using the other substrate structures taught in the disclosure, such as those embodied in FIGS. 8 through 12, 24 and 25, 26, 27 through 37B, 46 through 48, and 49.

The sectional view of FIGS. 63 and 66 show film 160 remaining as part of the structure following the process 177 of FIG. 60. In some cases in may be advantageous to employ film 160 in a manner wherein it is removed after attachment of the "fingers" and "busses" to the respective surfaces of the cells and substrate. In this application, the film 160 would serve as surrogate support and spacial positioning means during formation, placement and bonding of the "finger/buss" structure. In this case a suitable "release" material would be positioned between surface 190 of film 160 and "fingers/busses" 170/171.

Figure 67:
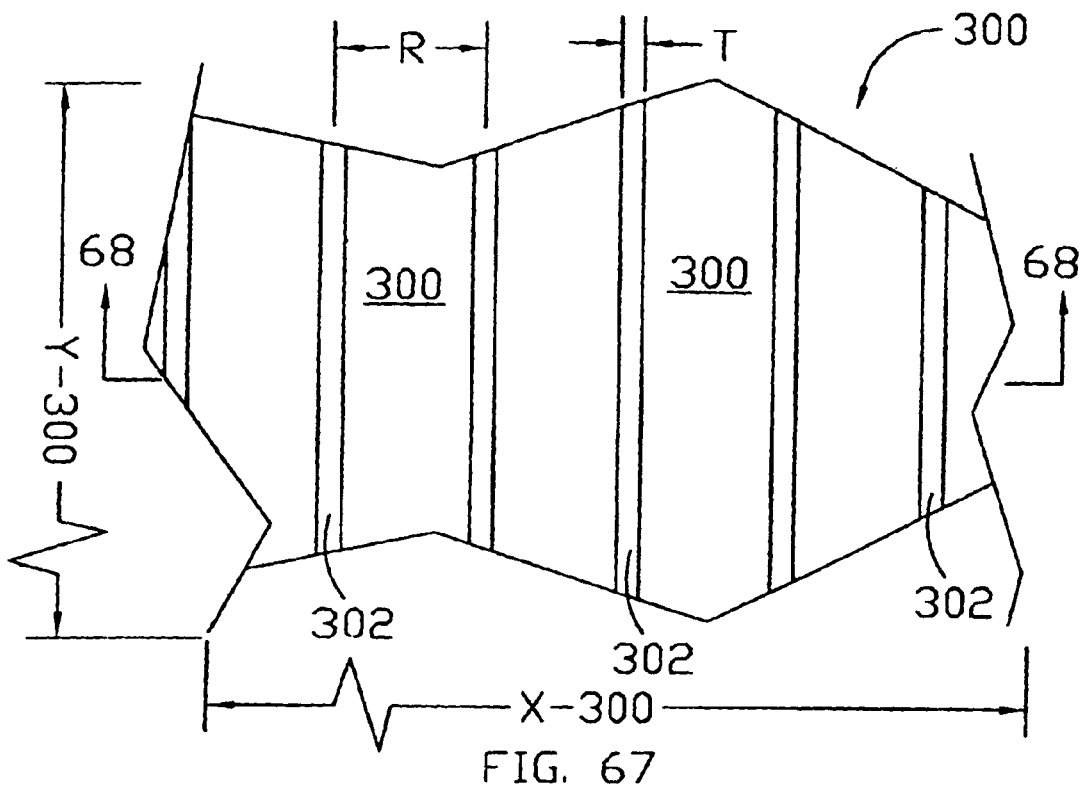
FIG. 67 is a top plan view of a starting component for an additional embodiment of the invention.

A further embodiment of a front face current collector structure is taught in conjunction with FIGS. 67 through 81. FIG. 67 is a top plan view of a metal foil/semiconductor photovoltaic structure similar to the laminated structure depicted in FIGS. 1 and 2. However, the structure of FIG. 67, generally referred to as 300, also includes narrow strips of insulating material 302 extending in the length direction Y-300. Strips 302 are usually positioned at repeat distances R in the width direction X-300 of structure 300. As will be seen below, dimension R approximates the width X-10 of the eventual individual cells.

Figure 68:
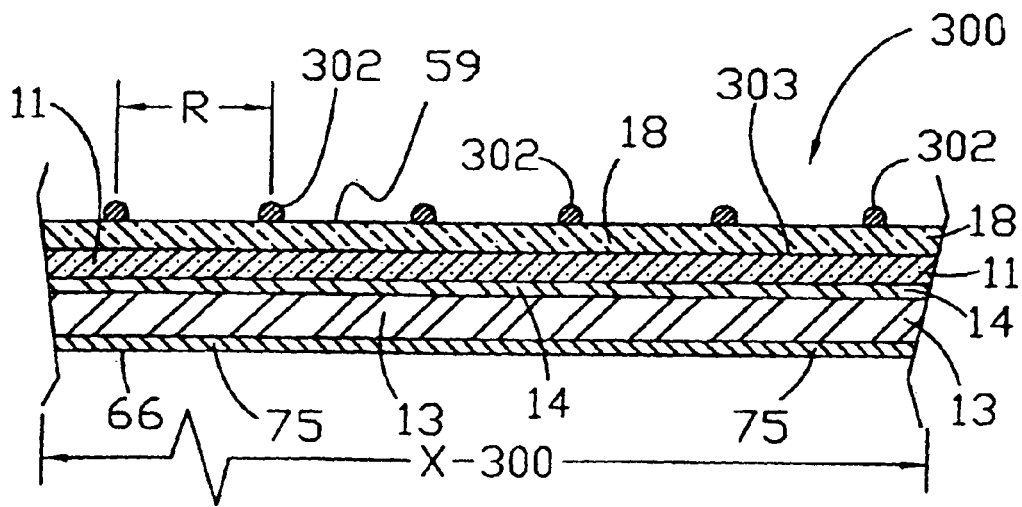
FIG. 68 is a sectional view taken along line 68-68 of FIG. 67.

FIG. 68 is a sectional view taken substantially along line 68-68 of FIG. 67. FIG. 68 shows a laminate comprising separate layers 75, 13, 14, 11, and 18 as previously described for the structure of FIG. 2. Insulating strips 302 are shown positioned on top surface 59 of structure 300. However, it is understood that strips 302 could be positioned on top surface 303 of semiconductor material 11. In this latter case, window electrode 18 could be deposited over the entire surface (including strips 302) or selectively onto the surface areas between strips 302. For simplicity, the embodiments of FIGS. 67 through 78 will show strips 302 disposed on top surface 59 of window electrode 18. The purpose of the insulating strips 302 is to prevent shorting between top and bottom electrode material during subsequent slitting into individual cells, as will become clear below.

In the embodiment shown, length Y-300 is much greater than width X-300 and length Y-300 can generally be described as "continuous" or being able to be processed in roll-to-roll fashion. In contrast to width X-10 of the individual cell structure of FIGS. 1 and 2, X-300 of FIGS. 67 and 68 is envisioned to be of magnitude equivalent to the cumulative widths of multiple cell structures. Strips 302 are typically 0.002 inch to 0.050 inch wide (dimension "T", FIG. 67). Strips 302 can be applied to the surface 59 by any number of methods such as thermoplastic extrusion, roll printing or photo masking.

In order to promote simplicity of presentation, layers 75, 13, 14, 11 and 18 of structure 300 will be depicted as a single layer 370 in subsequent embodiments.

Figure 69:
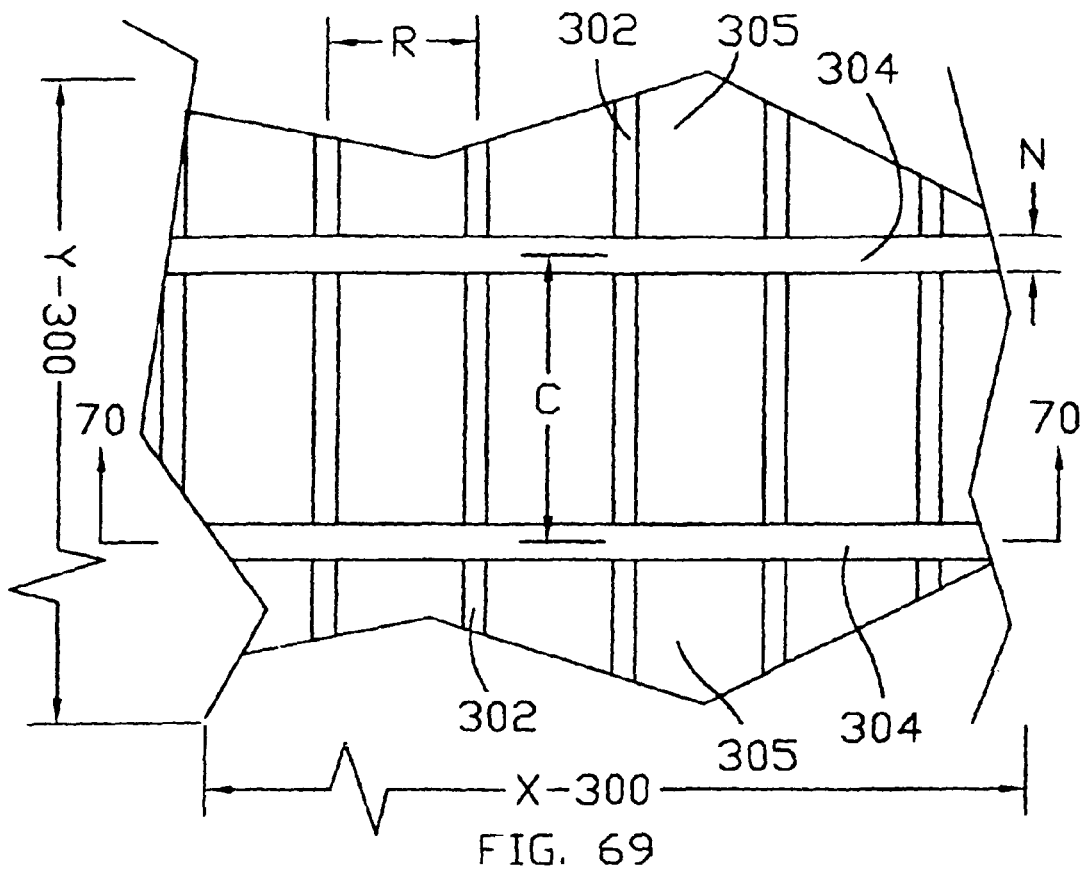
FIG. 69 is a top plan view after an additional processing step employing the structure of FIGS. 67 and 68.
Figure 70:
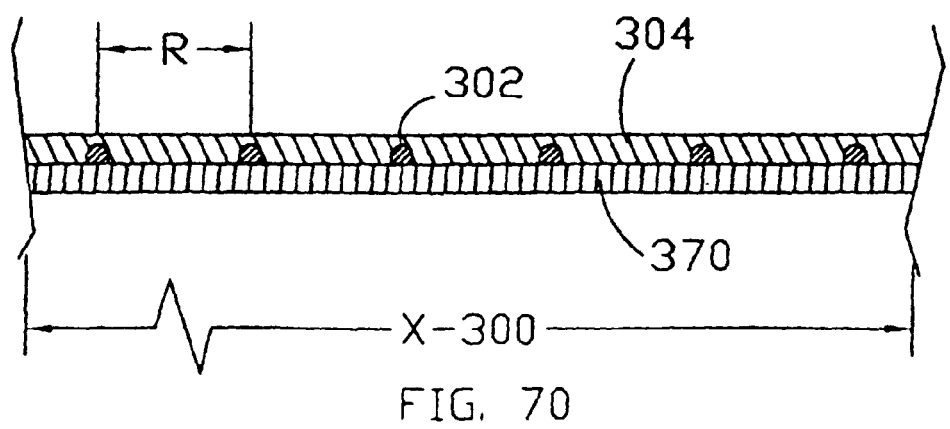
FIG. 70 is a simplified sectional view taken along line 70-70 of FIG. 69.

FIG. 69 is a top plan view of the FIG. 67 structure following an additional processing step and FIG. 70 is a sectional view taken substantially along line 70-70 of FIG. 69. Electrically conductive material has been deposited in conductive strips 304 onto the top surface of the structure 300. Strips 304 extend in the width direction X-300 and traverse a plurality of repeat distances "R". Dimension "N" of strips 304 is normally made as small as possible, typically 0.002 inch to 0.100 inch. Dimension "C", the repeat distance between strips 304 depends to some extent on dimension "N" but is typically 0.05 inch to 1.0 inch.

Strips 304 can comprise electrically conductive resins or adhesives applied by printing or thermoplastic extrusion. Alternatively, strips 304 can comprise metal-based materials applied by selective deposition. It is, of course, advantageous to select materials and techniques which promote adhesive and ohmic contact to the top surface 59 of window electrode 18. As will be appreciated by those skilled in the art in light of the following teachings, electrically conductive resins, and DER's in particular, are very suitable as materials for conductive strips 304.

In the embodiment of FIG. 69, those areas of the top surface of structure 300 not covered with conductive strips 304 have been coated with a thin coating of electrically insulating material 305.

Figure 71:
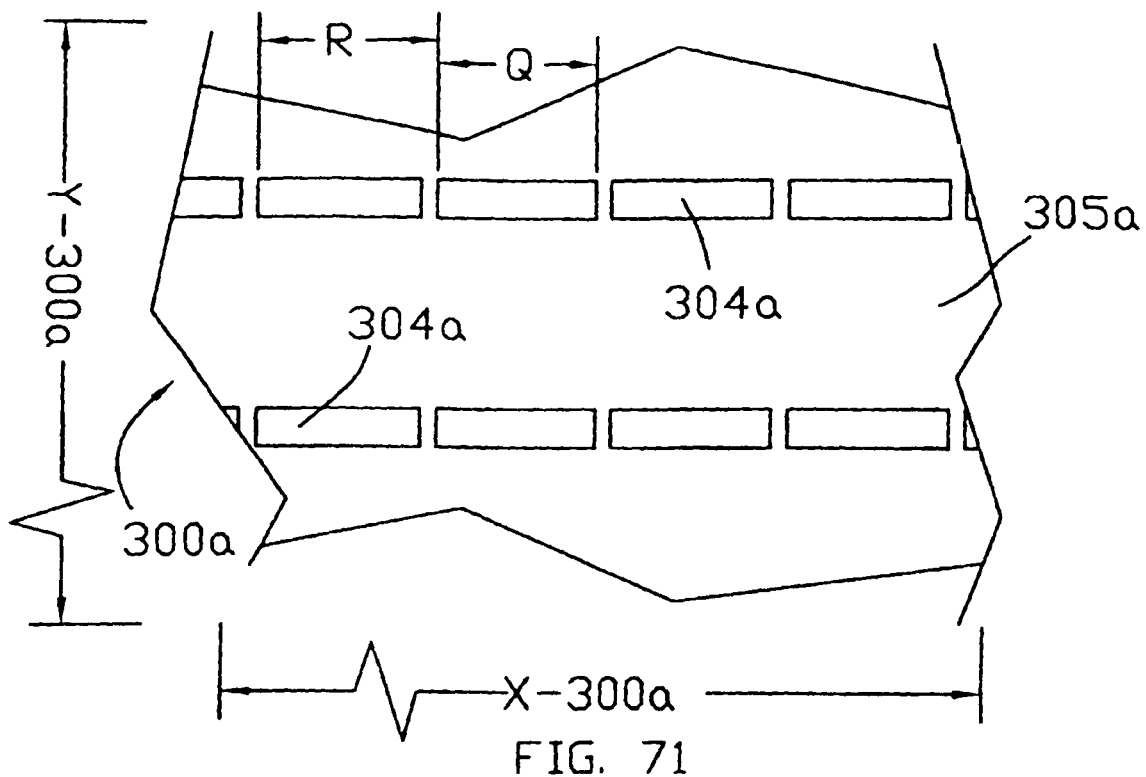
FIG. 71 is a top plan view, similar to FIG. 69, of an alternate embodiment.

FIG. 71 is a plan view of an alternate embodiment. In FIG. 71, 300A designates a structure similar to the structure 300 of FIGS. 67, 68 but strips 302 are not shown. They have either been excluded or are invisible in the plan view of FIG. 71, having been deposited on the surface of semiconductor material 11 (and thus overcoated with window electrode 18) or covered by insulating layer 305A. 304A designates strips or islands of electrically conductive material which have dimension "Q" slightly less than repeat distance "R". Those skilled in the art will recognize, in light of the teachings that follow below, that the structure embodied in FIG. 71 would be conceptually equivalent to the structure of FIG. 69.

Figure 72:
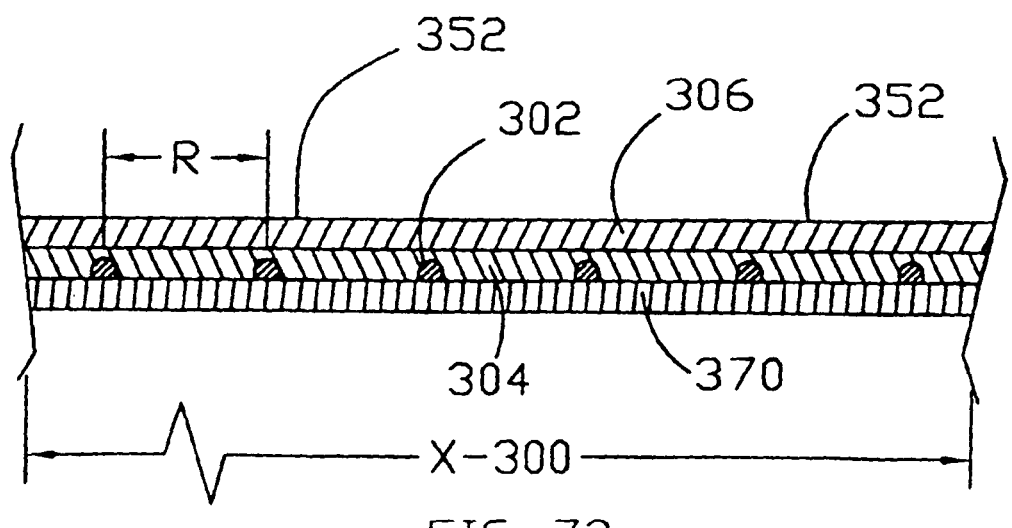
FIG. 72 is a sectional view of the structure of FIG. 70 after an additional processing step.

FIG. 72 is a sectional view similar to FIG. 70 after an additional processing step. In FIG. 72, additional highly electrically conductive material 306 has been deposited overlaying conductive material 304. Material 306 has exposed top surface 352. In a preferred embodiment, highly electrically conductive material 306 is electrodeposited. Electrodeposition permits relatively rapid deposition rates and permits facile deposition of very conductive materials such as copper and silver. In this regard, it is highly advantageous to employ a DER for the conductive material 304. It can be appreciated that material strips 304/306 extend in the "X" direction a distance equivalent to multiple widths "R". This concept therefore allows for deposition of the individual cell grid fingers in an essentially continuous, "bulk" fashion.

Figure 73:
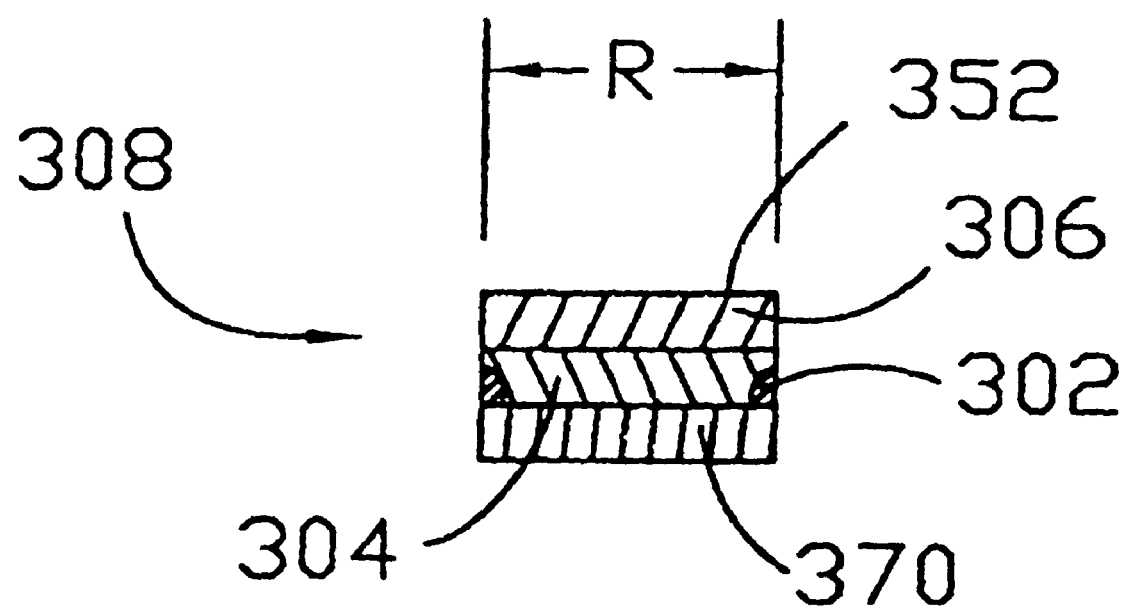
FIG. 73 is a sectional view of a portion of the FIG. 72 structure after an additional processing step.

FIG. 73 is a sectional view of a portion of the FIG. 72 structure after an additional processing step comprising slitting the FIG. 72 structure along the insulating strips 302 at repeat distances "R" to give individual units 308 comprising laminate portions of structures 370, 302, 304, 306 of the prior embodiments. Units 308 have width "R" which, as will be seen, approximates the eventual photovoltaic cell width. During this slitting process, insulating beads 302 prevent smearing of the top conductive material to the bottom electrode material 12 which would result in electrical shorting.

Figure 74:
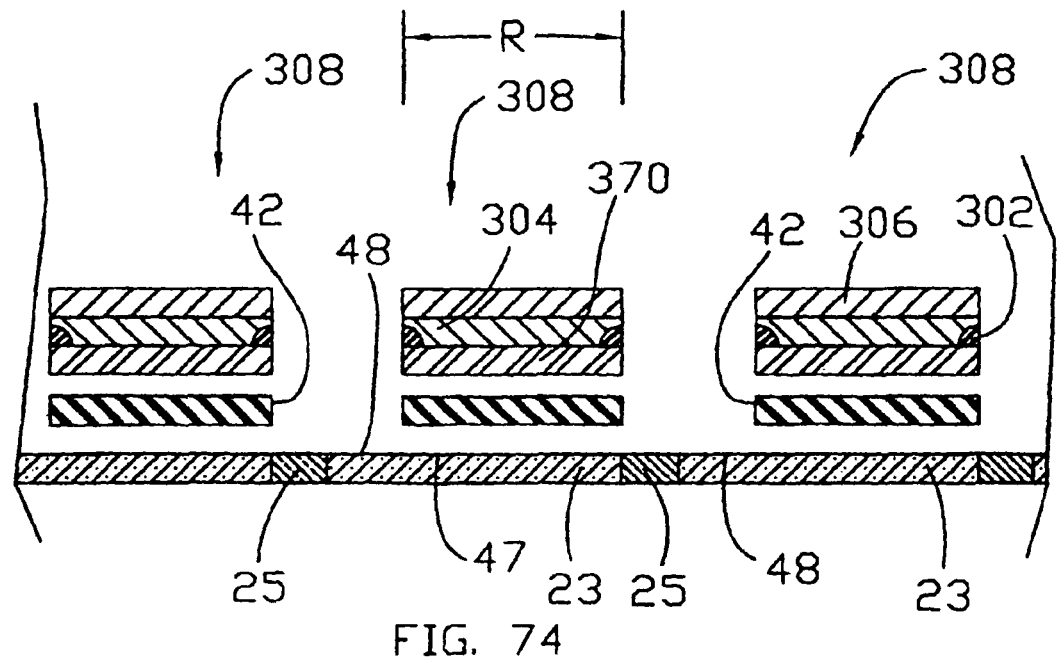
FIG. 74 is a sectional view similar to FIG. 13B just prior to the process illustrated in FIG. 13A, employing the structures shown in the sectional view in FIGS. 7 and 73.

FIG. 74 is a view similar to FIG. 13B showing the FIG. 73 structures just prior to a laminating process similar to FIG. 13A. Individual structures 308 are positioned in spacial relationship with electrically conductive adhesive 42 and conductive sheets 23. As in prior embodiments, sheets 23 are separated by insulating joining portions 25. Conductive sheets 23 can be considered to have a top contact surface region 48 and top collector surface area 47.

Figure 75:
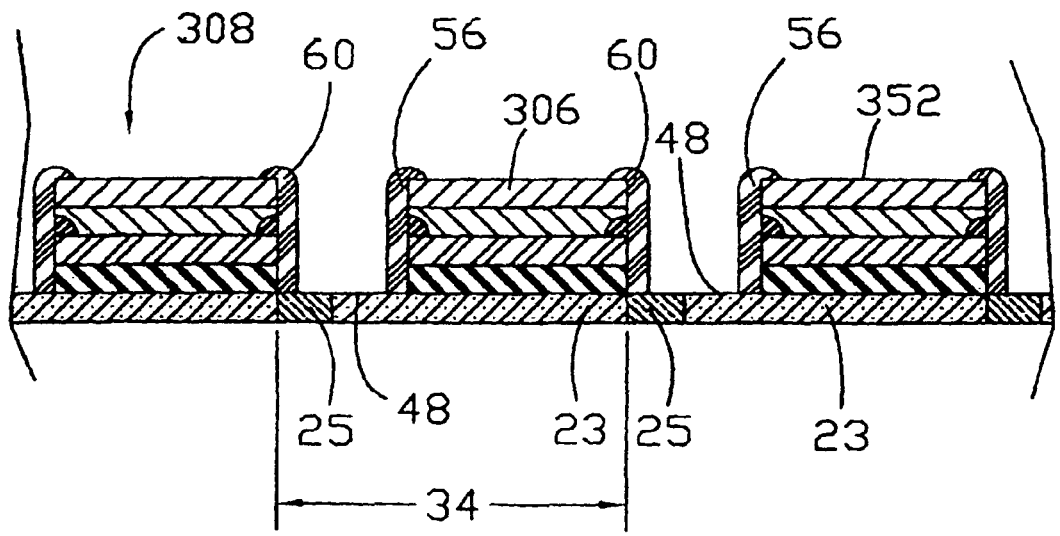
FIG. 75 is a sectional view showing the structure resulting from application of the process of FIG. 13A to the structural arrangement shown in FIG. 74.
Figure 76:
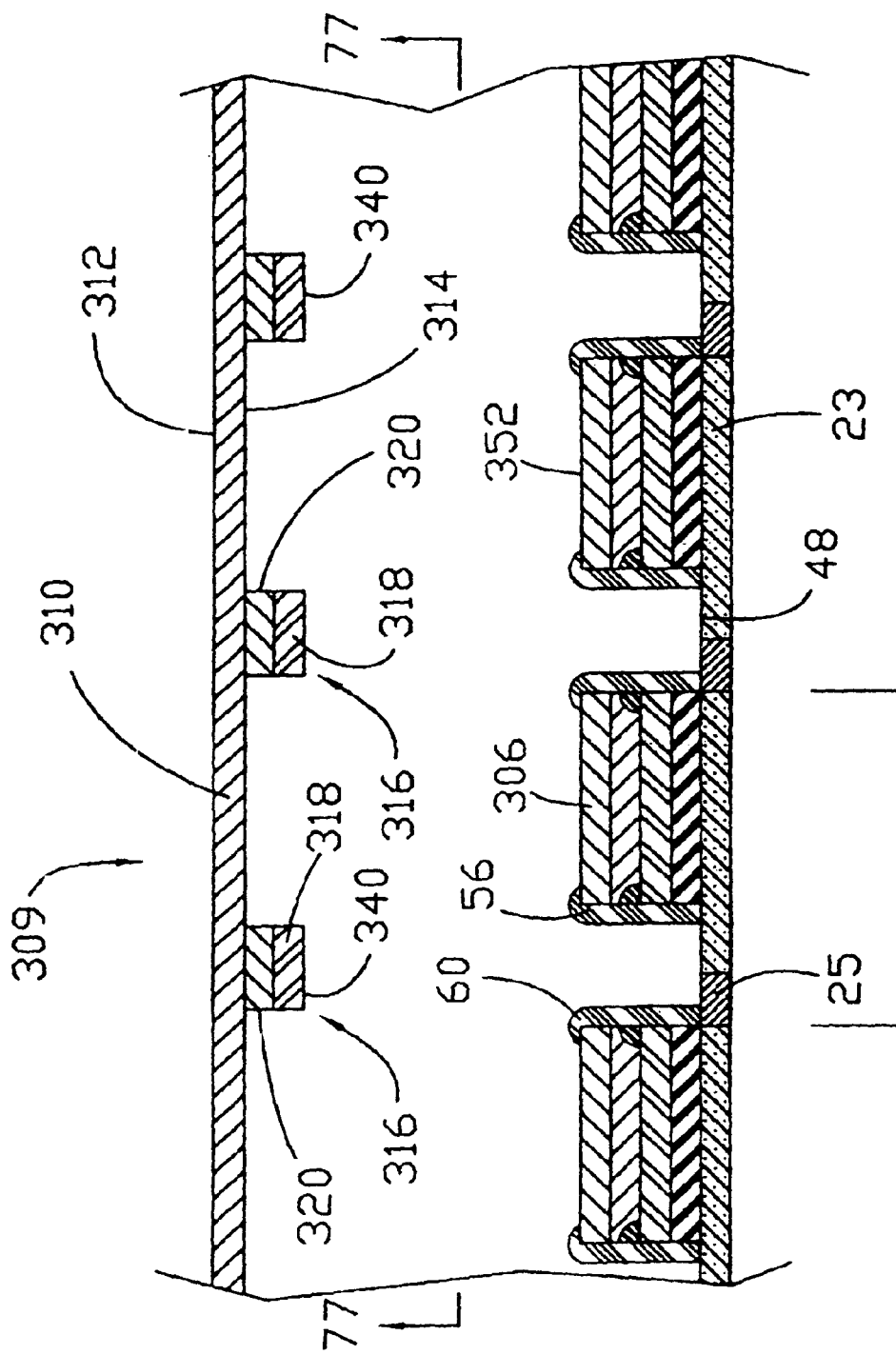
FIG. 76 is a sectional view of the spacial positioning of the structure shown in FIG. 75 and an additional component of the embodiment just prior to a process employed to combine them.

FIG. 75 is a sectional view of the structure after the lamination depicted in FIG. 74 plus an additional step of applying insulating beads 56, 60 to the terminal edges of the individual units 308. As shown in FIG. 75, at least a portion of top contact surface 48 remains exposed following this lamination. In addition, the lamination is characterized by repeat dimension 34, which is slightly greater than dimension FIG. 76 is a sectional view prior to a further laminating step in the production of the overall array. FIG. 76 shows introduction of an additional sheetlike interconnection component 309 comprising material strips 316 mounted on sheet 310 having top surface 312 and bottom surface 314. Sheet 310, shown as a single layer for simplicity, may comprise a laminate of multiple layers of materials to supply adhesive and barrier properties to the sheet.

Mounted in spaced arrangement on the bottom surface 314 of sheet 310 are strips 316 of material having an exposed surface 340 which is electrically conductive. Strips 316 are also shown in FIG. 76 to comprise layer 320 which adhesively bonds conductive layer 318 to sheet 310. Layer 320 need not necessarily be electrically conductive and may be omitted if adhesion between conductive material 318 and sheet 316 is sufficient. Layer 18 may comprise, for example, an electrically conductive adhesive.

Figure 77:
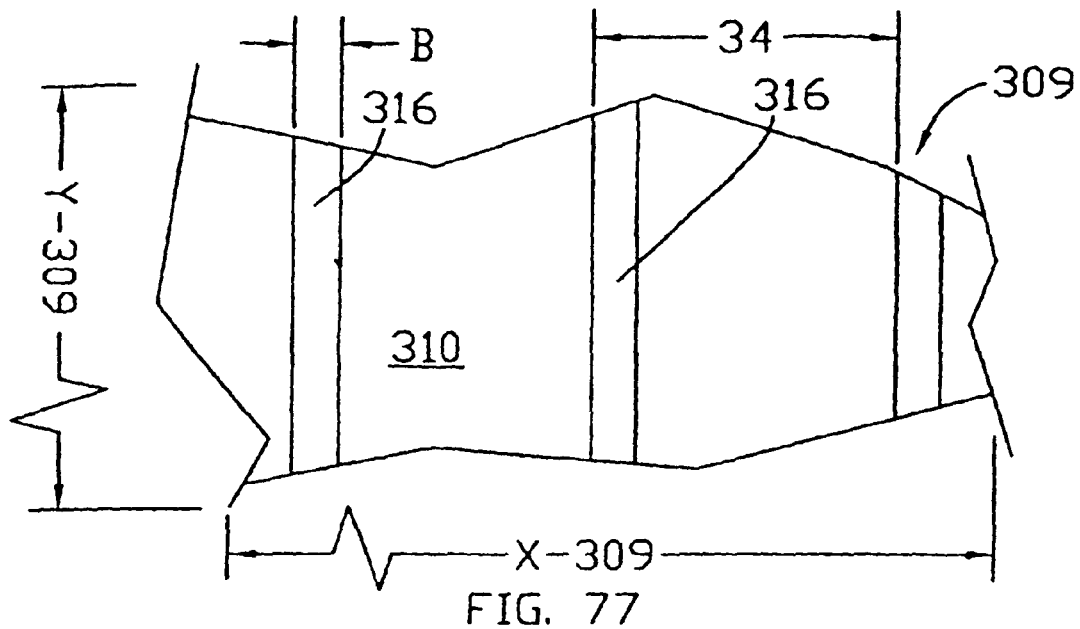
FIG. 77 is a plan view taken along the line 77-77 of FIG. 76.

FIG. 77, a plan view taken substantially along line 77-77 of FIG. 76, indicates the linear nature of strips 316 extending in the direction Y-309. Strips 316 have a width dimension "B" sufficient to span the distance between conductive strips 306 of one unit 308 to the contact surface 48 of sheet 23 corresponding to an adjacent unit. Typical magnitudes for dimension "B" are from 0.020 inch to 0.125 inch depending on registration accuracy during the multiple lamination processes envisioned.

Figure 78:
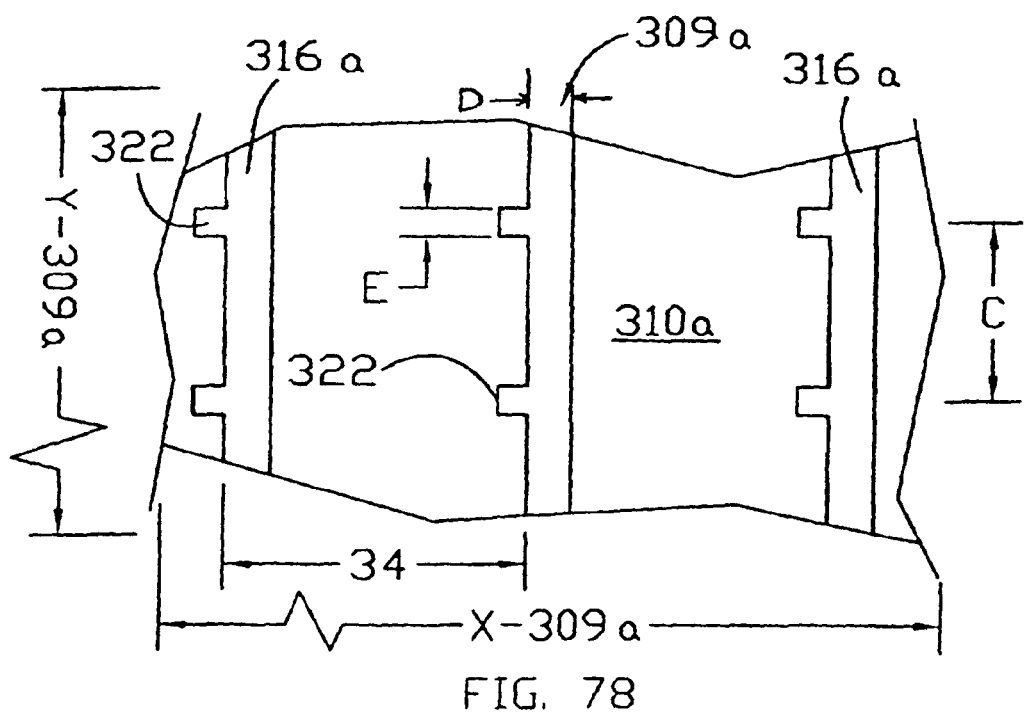
FIG. 78 is an alternate embodiment of the FIG. 77 structure.
Figure 79:
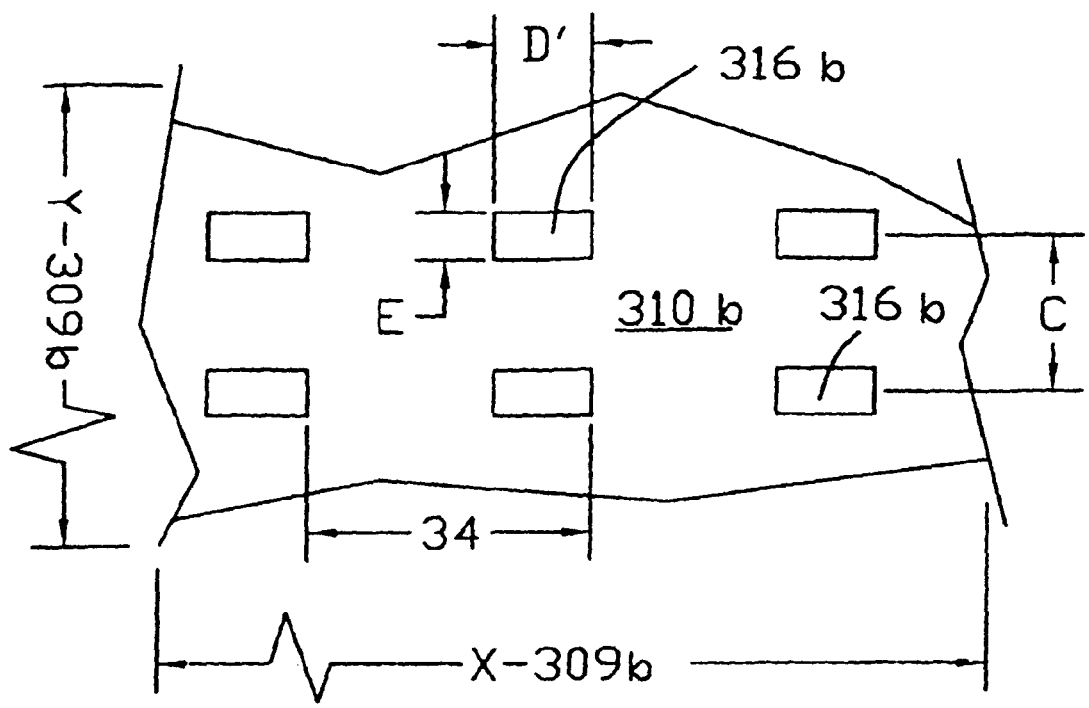
FIG. 79 is yet another alternate embodiment of the FIG. 77 structure.

FIGS. 78 and 79 present alternatives to the FIG. 77 component. In FIG. 78, tab extensions 322 of width "E" reach out in the "X" direction from the strips 316A. Tabs 322 are positioned at repeat distances "C" in the "Y" direction corresponding to the repeat dimension "C" of the conductive strips 304/306. Proper positional registration during the lamination process envisioned in FIG. 76 allows tabs 322 to overlap and contact strips 306, permitting increased contact area between strips 306 and tabs 322 and also a possible reduction in width "D" of strips 316a (FIG. 78) in comparison to dimension "B" (FIG. 77).

FIG. 79 shows an alternate embodiment wherein strips 316 and 316A of FIGS. 77 and 78 respectively have been replaced by individual islands 316B. Thus, material forming conductive surface 340 need not be continuous in the "Y" direction. Islands 316B can comprise, for example, an electrically conductive adhesive. Dimension "E" (FIG. 79) is similar to dimension "N" (FIG. 69). Dimension "D", (FIG. 79) is sufficient to span the distance between conductive strips 306 of one unit 308 to the contact surface 48 of sheet 23 corresponding to an adjacent unit.

Since the linear distance between strips 306 of one unit 308 and surface 48 corresponding to an adjacent unit is small, the structures 316, 316a and 322, and 316b of FIGS. 77, 78, and 79 respectively do not necessarily comprise materials exhibiting electrical conductivities characteristic of pure metals and alloys. However, as will be discussed below, proper selection of metal-based materials to form surface 340 of these structures can be used to advantage in achieving excellent ohmic and adhesive contacts to grid material 306 and contact surfaces 48 of conductive sheets 23.

Figure 80:
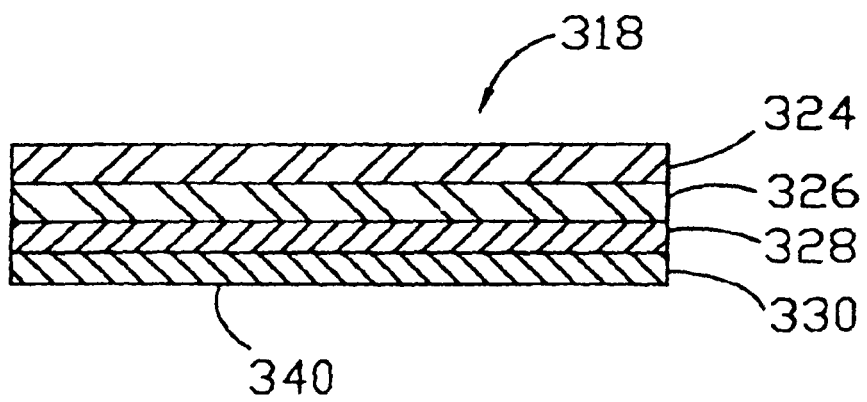
FIG. 80 is a sectional view showing one possible example of the structural makeup of a portion the components illustrated in FIGS. 77 through 79.

Accordingly, an example of a laminated structure envisioned for conductive layer 318 is shown in the sectional view of FIG. 80. A layer of electroplateable resin 324 is attached to adhesive layer 320 (layer 320 not shown in FIG. 80). This is followed by layers 326, 328 of electrodeposited metal for mechanical and electrical robustness. Finally a layer of low melting point metal or alloy 330 is deposited to produce free surface 340. Those skilled in the art will recognize that DER's would be a highly attractive choice for resin layer 324. Alternatively, a material, not necessarily conductive, which would allow selective deposition of metal by chemical techniques could be chosen for layer 324.

Using the structure embodied in FIG. 80 for the layer 318, the material 330 with surface 340 is caused to melt during the lamination process depicted in FIG. 76, resulting in a "solder" bond between material forming contact surface 48 of sheet 23 and material 330 with surface 340. A similar "solder" bond is formed between material forming top surface 352 of strip 306 and material 330 having surface 340.

One will note that the retention of sheets 310 of FIGS. 76 through 78 is not an absolute requirement for achieving the electrical interconnections among cells, but does facilitate handling and maintenance of spacial positioning during formation of the conductive interconnect structures and the subsequent laminating process envisioned in FIG. 76. In this regard, sheet 310 could be a surrogate support which is removed subsequent to or during lamination. This removal could be achieved, for example, by having layer 320 melt during the lamination process to release sheet 310 from structure 316, etc.

One also should recognize that the electrical interconnections between grid material 306 of units 308 and contact surface 48 corresponding to an adjacent cell could be made by using individual "dollops" of conductive material spanning the gap between surface 48 and each individual grid finger of an adjacent cell.

Figure 81:
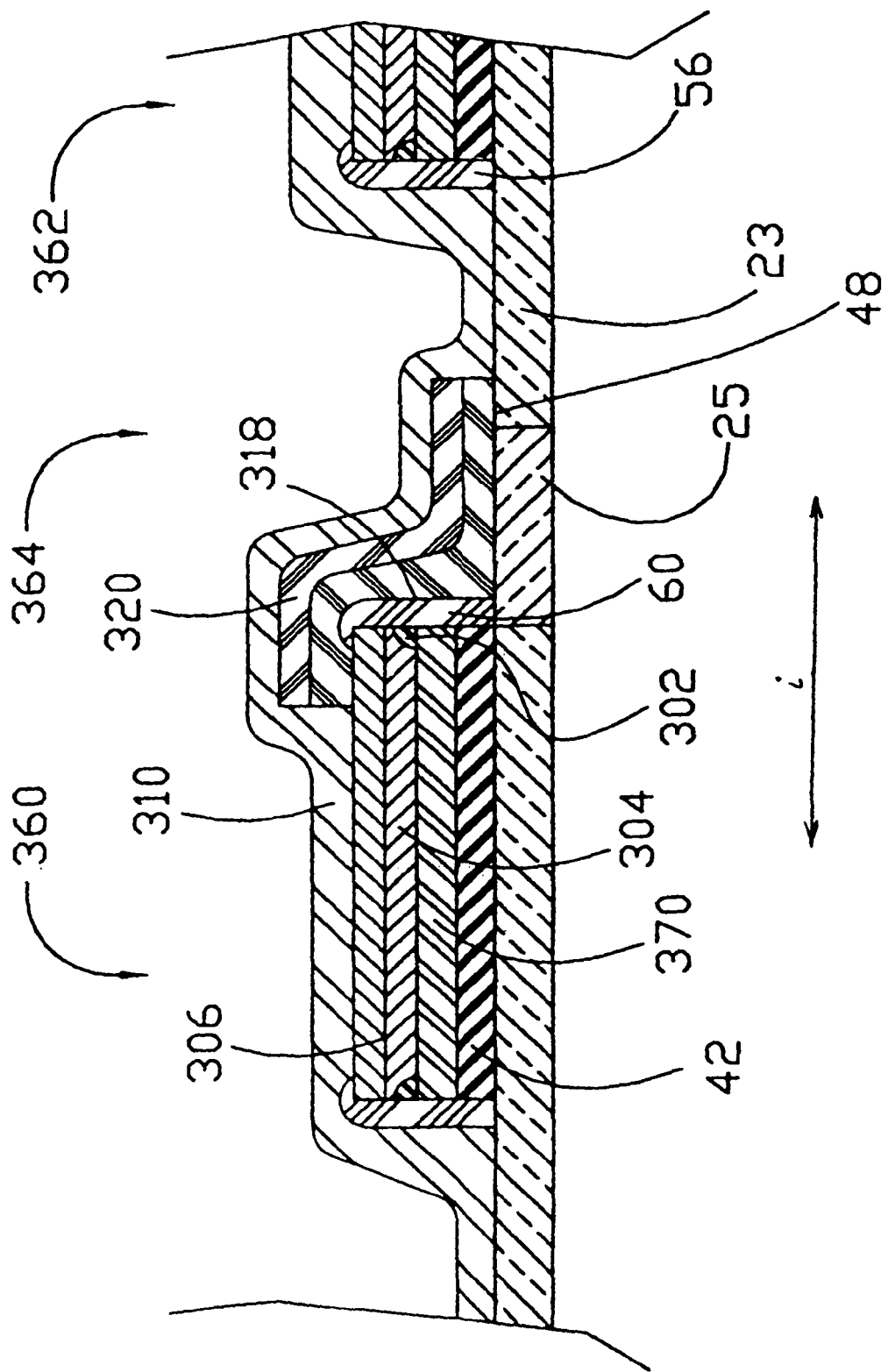
FIG. 81 is a sectional view of the structure resulting from the process envisioned in FIG. 76.

FIG. 81 is a greatly exploded view of a completed interconnection achieved according to the teachings embodied in FIGS. 67 through 80. FIG. 81 shows first cell 360 and a portion of adjacent cell 362. Interconnect region 364 is positioned between cells 360 and 362. It is seen that robust, highly efficient top surface current collection and cell interconnections are achieved with inexpensive, controllable and repetitive manufacturing techniques. Sensitive, fine processing involving material removal techniques and adversely affecting yields are avoided. The double pointed arrow "i" in FIG. 81 indicates the direction of net current flow among the interconnected cells.

While the grid/interconnect structure taught in conjunction with FIGS. 67 through 81 employed the substrate structure depicted in FIGS. 6 and 7, it is understood that similar results would be achieved with the other substrate embodiments revealed in conjunction with the teachings corresponding to FIGS. 8 through 66.

Since the layer 370 exhibits reasonable "through conductivity", it is contemplated that the required electrodeposition current could be achieved by contacting the exposed back metallic surface 66 of metal-based foil 12. However, it is understood that should this electrodeposition current have a deleterious effect on the cell itself, electrodeposition could still be accomplished by masking surface 66 and including a "buss" structure of conductive material extending in the "Y-300" direction of the structure shown in FIG. 69.

Figure 82:
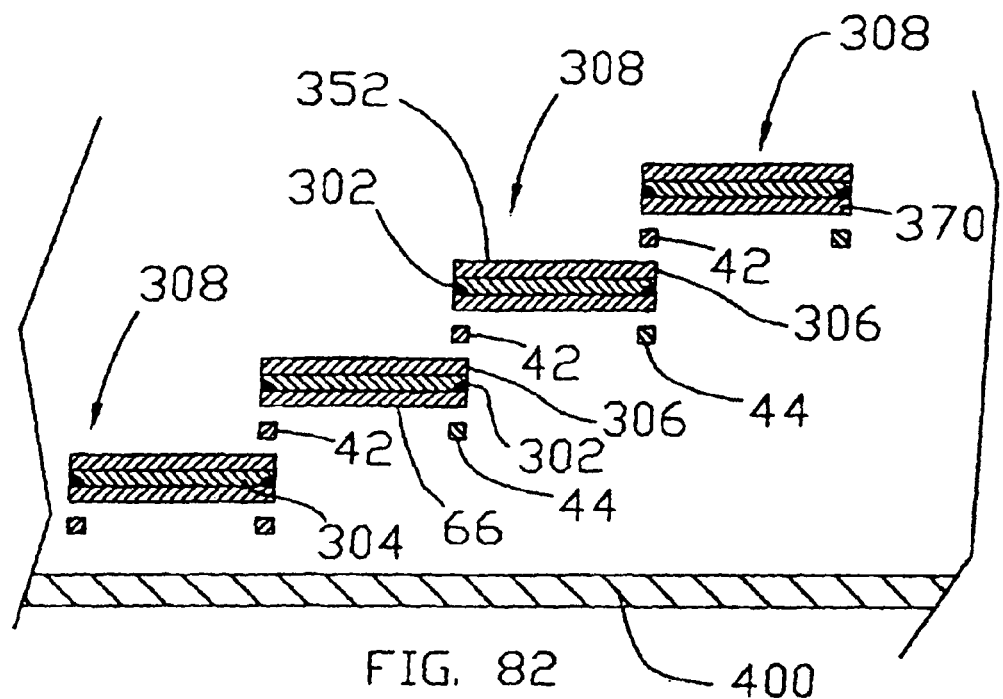
FIG. 82 is an illustration of a lamination process used to produce an additional embodiment of the series interconnected photovoltaic cells of the disclosure.
Figure 83:
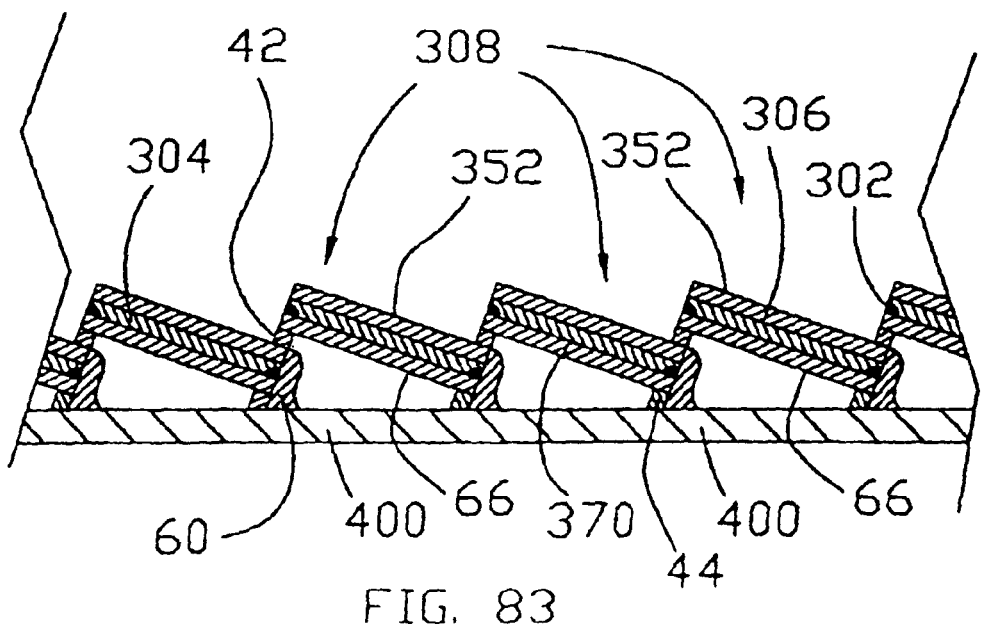
FIG. 83 embodies the results of the lamination process of FIG. 82.

A further embodiment of the series connected photovoltaic arrays of the instant disclosure is taught in conjunction with FIGS. 82 and 83. FIG. 82 is a depiction similar to FIG. 74 illustrating a laminating process resulting in a series interconnected array of multiple photovoltaic cells. FIG. 82 shows multiple cells 308 (as described in conjunction with FIG. 73) whose bottom conductive metal-based surface 66 slightly overlaps top, light-incident surface 352 of the grid fingers of an adjacent cell. Conductive adhesive strips 42 are positioned in this area of overlap. Adhesive strips 44 augment positioning and handling reliability by firmly attaching the cells to support web 400. Should the conductive adhesive bonding imparted by adhesive strips 42 be of sufficient strength and integrity, support web 400 can be considered optional. In addition, conductive adhesive strips 42 are but one of several ways to achieve the electrical joining required, as has been previously disclosed.

FIG. 83 embodies the result of the laminating process of FIG. 82. The individual cells 308 are electrically connected in series through a "shingling" arrangement, wherein the bottom conductive surface 66 of a first cell is electrically and adhesively joined to a light incident top surface 352 of the current collector grid fingers of an adjacent cell. Insulating strips 60 protect terminal edges of individual cells from electrical shorting. The double pointed arrow "I" indicates the direction of net current flow among cells of the FIG. 83 embodiment.

The simplified series interconnections among multiple photovoltaic cells taught in the present disclosure are made possible in large measure by the ability to selectively electrodeposit highly conductive metal-based materials to manufacture both supporting interconnect substrates and current collector grid structures. This selectivity is readily and inexpensively achieved by employing directly electroplateable resins (DERs) as defined herein.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. A method of manufacture of an article combining photovoltaic cell structure and a current collector structure suitable for collecting current from a light incident surface of a photovoltaic cell, said method comprising the steps of, providing photovoltaic cell structure having a top light incident surface and comprising semiconductor material, providing a flexible current collector structure, said current collector structure comprising a polymer based sheetlike substrate having a first substrate surface formed by a first material having adhesive affinity for said top light incident surface and said current collector structure further having a pattern comprising electrically conductive second material supported by said substrate and positioned on said first substrate surface, said current collector structure being manufactured separately and distinctly from said cell structure, combining a first portion of said current collector structure and said cell structure such that said first substrate surface of said first collector structure portion and said top light incident surface of said cell structure face each other so that said conductive material associated with said first collector structure portion contacts said top light incident surface and said pattern is distributed over a preponderance of said top light incident surface, wherein said photovoltaic cell structure is provided to said combining step as a continuous form.

2. The method of claim 1 wherein said current collector structure is provided to said combining step in a form wherein said substrate is characterized as continuous.

3. The method of claim 2 wherein said combining step is characterized as roll-to-roll processing.

4. The method of claim 1 wherein said combining step comprises lamination of said current collector structure portion to said top surface.

5. The method of claim 4 wherein said pattern of electrically conductive second material has surface portions formed by a metal based material which melts at a temperature below that experienced by said current collector structure during said lamination process.

6. The method of claim 5 wherein said metal based material comprises Indium.

7. The method of claim 4 wherein said lamination comprises roll lamination.

8. The method of claim 1 wherein said combining step includes positioning a second portion of said current collector structure outside a terminal edge of said cell structure such that said pattern of electrically conductive material crosses a terminal edge of said cell structure.

9. The method of claim 8 wherein said pattern comprises multiple substantially parallel traces of electrically conductive material, and wherein portions of said traces and conductive material positioned outside the terminal edge of the cell structure comprise a monolithic material form.

10. The method of claim 8 wherein insulating material is positioned between the cell terminal edge and the conductive material crossing the cell terminal edge.

11. The method of claim 1 wherein said top light incident surface is formed by a transparent conductive material.

12. The method of claim 1 wherein said combining step causes portions of said first substrate surface and said top light incident cell surface to become adhesively bonded.

13. The method of claim 1 wherein at least a portion of said electrically conductive second material of said current collector structure projects outwardly beyond said first substrate surface prior to said combining step.

14. The method of claim 13 wherein said projecting electrically conductive second material comprises elemental metal or a metal based alloy.

15. The method of claim 1 wherein said first material comprises a polymeric adhesive.

16. The method of claim 15 wherein said polymeric adhesive is a thermoplastic.

17. The method of claim 1 wherein said pattern is at least partially defined by printed material.

18. The method of claim 1 wherein said pattern comprises a Directly Electroplateable Resin (DER).

19. The method of claim 1 wherein said electrically conductive second material has an exposed surface prior to said combining step, and wherein a portion of said exposed surface is formed by an electrically conductive adhesive.

20. The method of claim 1 wherein said current collector structure comprises multiple polymeric layers.

21. The method of claim 1 wherein said photovoltaic cell structure comprises a bottom electrode formed by a self-supporting metal based foil.

22. The method of claim 21 wherein said photovoltaic cell structure is characterized as having semiconductor material covering the complete expanse of an upward facing surface of said metal based foil.

23. The method of claim 1 wherein one of said layers of said current collector structure comprises silicon.

24. The method of claim 1 wherein said combination article produced is flexible.

* * * * *